US012787403B2

(12) United States Patent
Wang et al.

(10) Patent No.: US 12,787,403 B2
(45) Date of Patent: Nov. 3, 2026

(54) GATE SIDEWALL STRUCTURES OF SEMICONDUCTOR DEVICES AND METHODS OF FORMING THE SAME

(71) Applicant: Taiwan Semiconductor Manufacturing Company, Ltd., Hsin-Chu (TW)

(72) Inventors: Yi-Hong Wang, Taichung City (TW); Hui-Hsuan Kung, Taichung City (TW); Yao-Zhong Dong, Taichung City (TW); Yi-Li Huang, Hsinchu County (TW); Yi-Chen Li, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 359 days.

(21) Appl. No.: 18/424,791

(22) Filed: Jan. 27, 2024

(65) Prior Publication Data

US 2025/0098261 A1 Mar. 20, 2025

Related U.S. Application Data

(60) Provisional application No. 63/583,133, filed on Sep. 15, 2023.

(51) Int. Cl.

| | |
|---|---|
| ***H10D 64/01*** | (2025.01) |
| ***H10D 30/01*** | (2025.01) |
| ***H10D 30/62*** | (2025.01) |
| ***H10D 64/23*** | (2025.01) |

(52) U.S. Cl.
CPC ......... *H10D 64/021* (2025.01); *H10D 30/024* (2025.01); *H10D 30/6211* (2025.01); *H10D 64/017* (2025.01); *H10D 64/258* (2025.01)

(58) Field of Classification Search
CPC ............... H10D 64/021; H10D 30/024; H10D 30/6211; H10D 64/017; H10D 64/258
See application file for complete search history.

(56) References Cited

U.S. PATENT DOCUMENTS 11,489,062 B2 11/2022 Lin
11,967,532 B2 4/2024 Lin

FOREIGN PATENT DOCUMENTS

TW 202228282 A1 7/2022

*Primary Examiner* — Jay C Kim
*Assistant Examiner* — Woo K Lee
(74) *Attorney, Agent, or Firm* — HAYNES AND BOONE, LLP

(57) ABSTRACT

Semiconductor structures and methods of forming the same are provided. In an embodiment, an exemplary method includes depositing a dummy gate material layer over a first fin-shaped active region, patterning the dummy gate material layer to form a dummy gate electrode, wherein the dummy gate electrode has a footing feature at an interface between the first fin-shaped active region and the dummy gate electrode, oxidizing the footing feature and a sidewall portion of the dummy gate electrode to form a dielectric gate spacer, and replacing a remaining portion of the dummy gate electrode with a gate structure.

20 Claims, 69 Drawing Sheets

GATE SIDEWALL STRUCTURES OF SEMICONDUCTOR DEVICES AND METHODS OF FORMING THE SAME

PRIORITY

This application claims the priority of U.S. Provisional Application Ser. No. 63/583,133, filed Sep. 15, 2023, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

Three-dimensional field effect transistors, such as fin-like FETs (FinFETs) and gate-all-around (GAA) FETs (GAA FETs), have been incorporated into various memory and core devices to reduce IC chip footprint while maintaining reasonable processing margins. While methods of forming these FETs have generally been adequate, they have not been entirely satisfactory in all aspects. For example, lowering parasitic capacitance between a gate structure and an adjacent source/drain contact that is formed over a source/drain feature remains a challenge. Thus, for at least this reason, improvements in methods of fabricating FinFETs, GAA FETs, and the alike are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
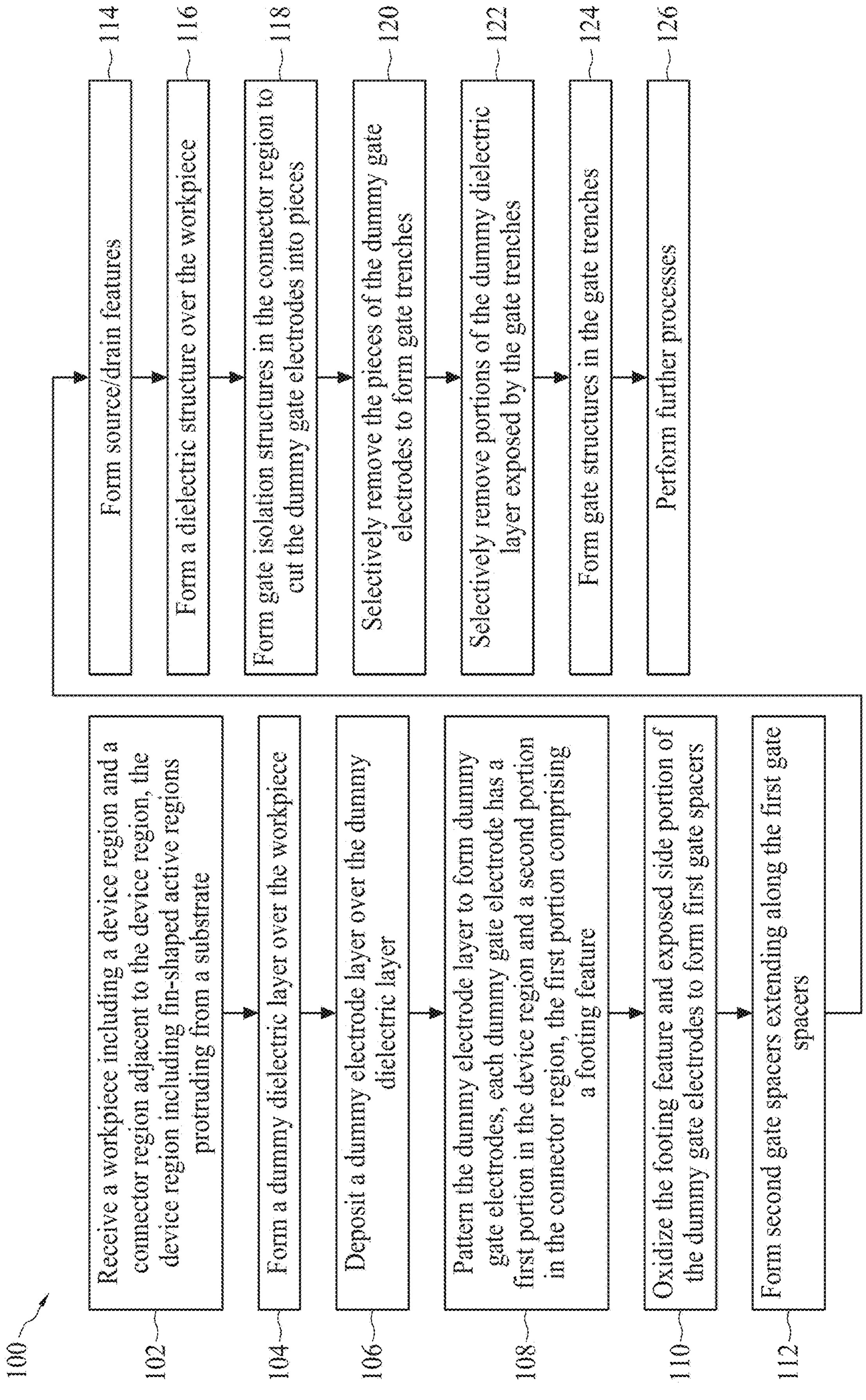
FIG. 1 illustrates a flowchart of an exemplary method for forming a semiconductor structure, according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices, such as fin field-effect transistors (FinFETs) and gate-all-around (GAA) transistors, have been introduced in an effort to improve gate control by increasing gate-channel coupling, reduce OFF-state current, and reduce short-channel effects (SCEs). A FinFET has an elevated channel wrapped by a gate on more than one side (for example, the gate wraps a top and sidewalls of a "fin" of semiconductor material extending from a substrate). A GAA transistor has a gate structure that can extend, partially or fully, around a channel region to provide access to the channel region on two or more sides. The channel region of a GAA transistor may be formed from nanowires, nanosheets, or other nanostructures and for that reasons, a GAA transistor may also be referred to as a nanowire transistor or a nanosheet transistor. The three-dimensional structure of the multi-gate devices allows them to be aggressively scaled while maintaining gate control and mitigating SCEs. Replacing polysilicon gates with functional gate structures has brought about improvement in device performance as feature sizes continue to decrease. Generally, after a gate structure is formed in a three-dimensional field effect transistor (e.g., a fin-like field effect transistor, or FinFET, a gate-all-around FET, or GAA FET, etc.), a number of methods may be implemented independently or in combination to further process the gate structure according to specific design requirements. In one example, the gate structure may be cut into two or more portions and subsequently separated by gate isolation structure(s) in a process referred to as cut metal gate (CMG).

As multi-gate device (e.g., FinFET, GAAFET) technologies progress towards smaller feature sizes, advanced techniques are needed for precisely controlling profiles and/or dimensions of gate structures and the gate isolation structure(s) to ensure and optimize device reliability. For example, polysilicon gates (or dummy gate electrodes) may have gate footings disposed along bottoms of the polysilicon gates. The presence of the gate footings may increase difficulty of forming satisfactory gate isolation structures to effectively cut the dummy gate electrodes into electrically and physically isolated pieces. In addition, scaling down process has also led to a reduced distance between the dummy gate electrodes (that will be replaced by the gate structure) and an adjacent source/drain contact and thus an increased parasitic capacitance. Thus, improvements in methods of forming semiconductor structures with reduced parasitic capacitance and satisfactory gate isolation structures are desired.

The present disclosure provides semiconductor structures and methods for forming gate spacers and gate isolation structures in the semiconductor structures. In an embodiment, after patterning a polysilicon layer to form a dummy gate electrode, an oxidization process is performed to convert side portion and gate footing of the dummy gate electrode into a dielectric layer as gate spacer. By replacing the gate footings with a dielectric material (e.g., silicon oxide) without performing extra lithography and/or etching processes, the combination of the dielectric material and the gate isolation structure would provide satisfactory isolation, and the distance between the rest of the dummy gate electrode (and thus the gate structure) and the source/drain contact can be increased to contribute to the reduction of the parasitic capacitance.

Figure 18:
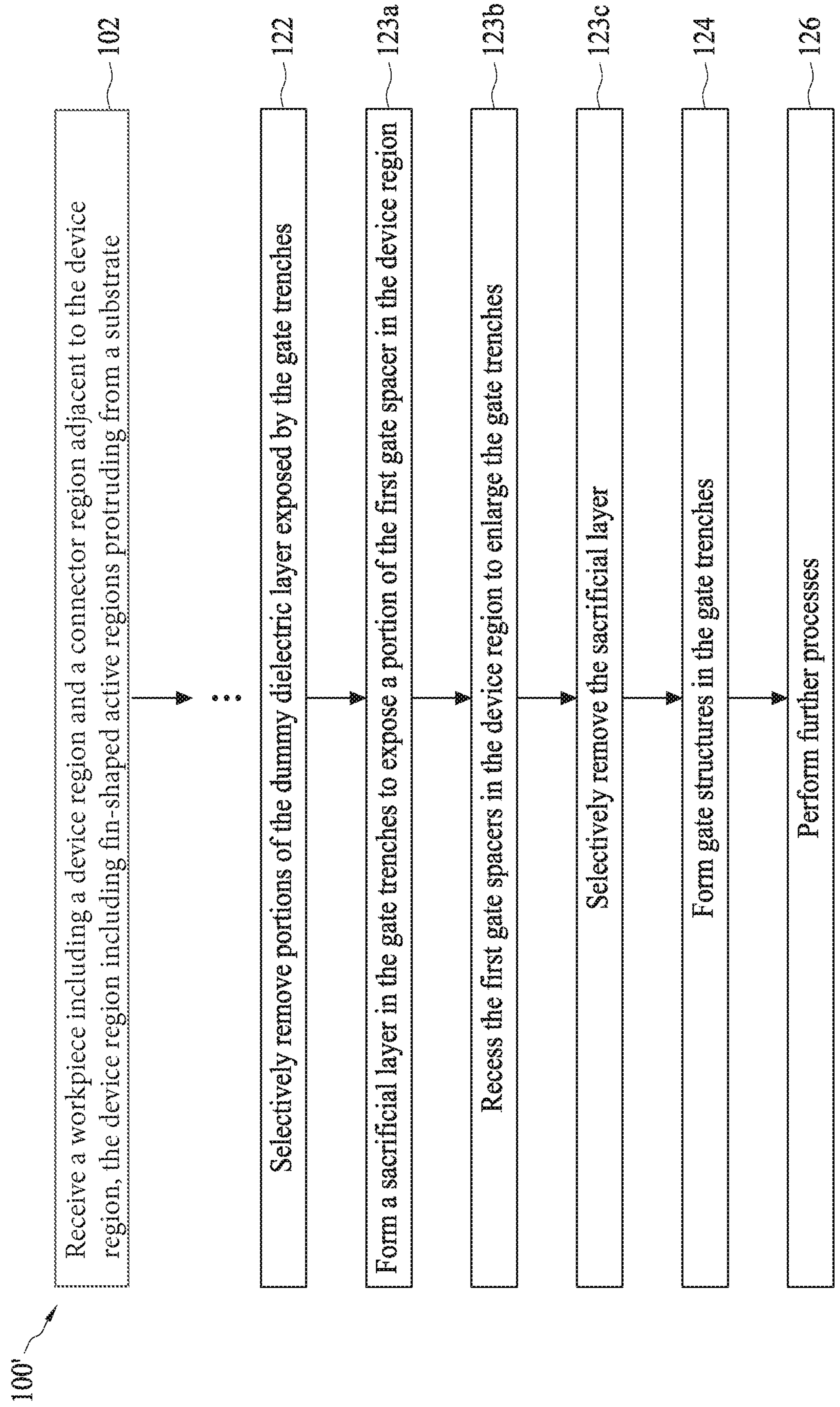
FIG. 18 illustrates a flowchart of a first alternative method for forming a semiconductor structure, according to various embodiments of the present disclosure.
Figure 24C:
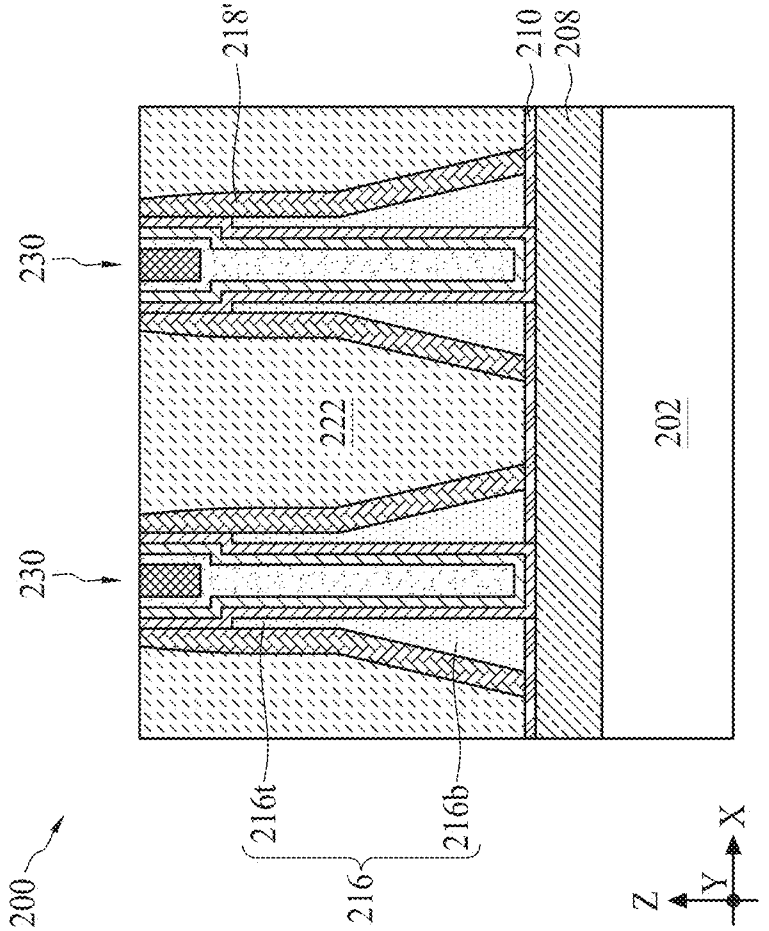
Figure 24B:
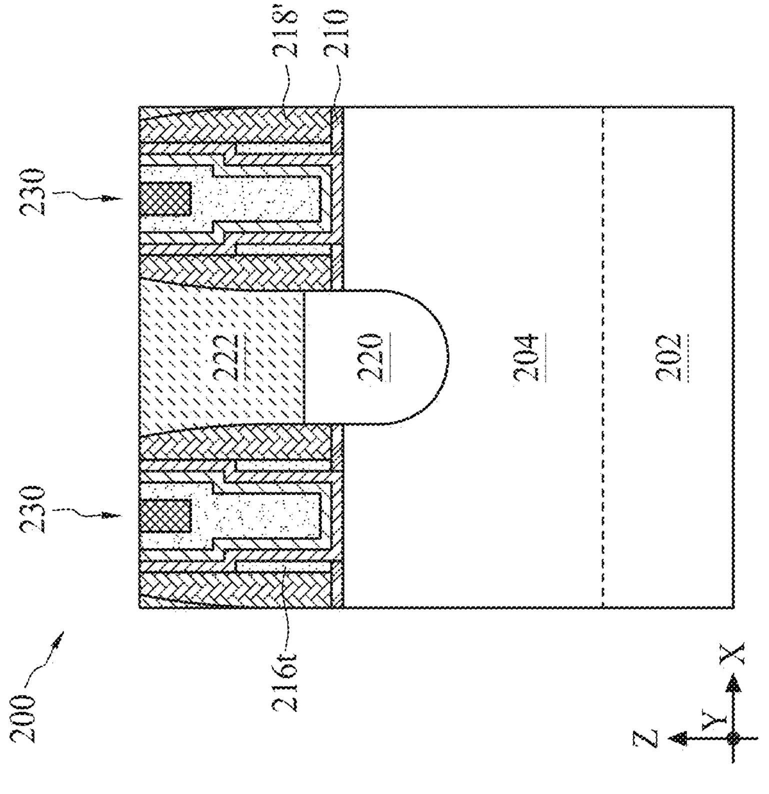
Figure 25:
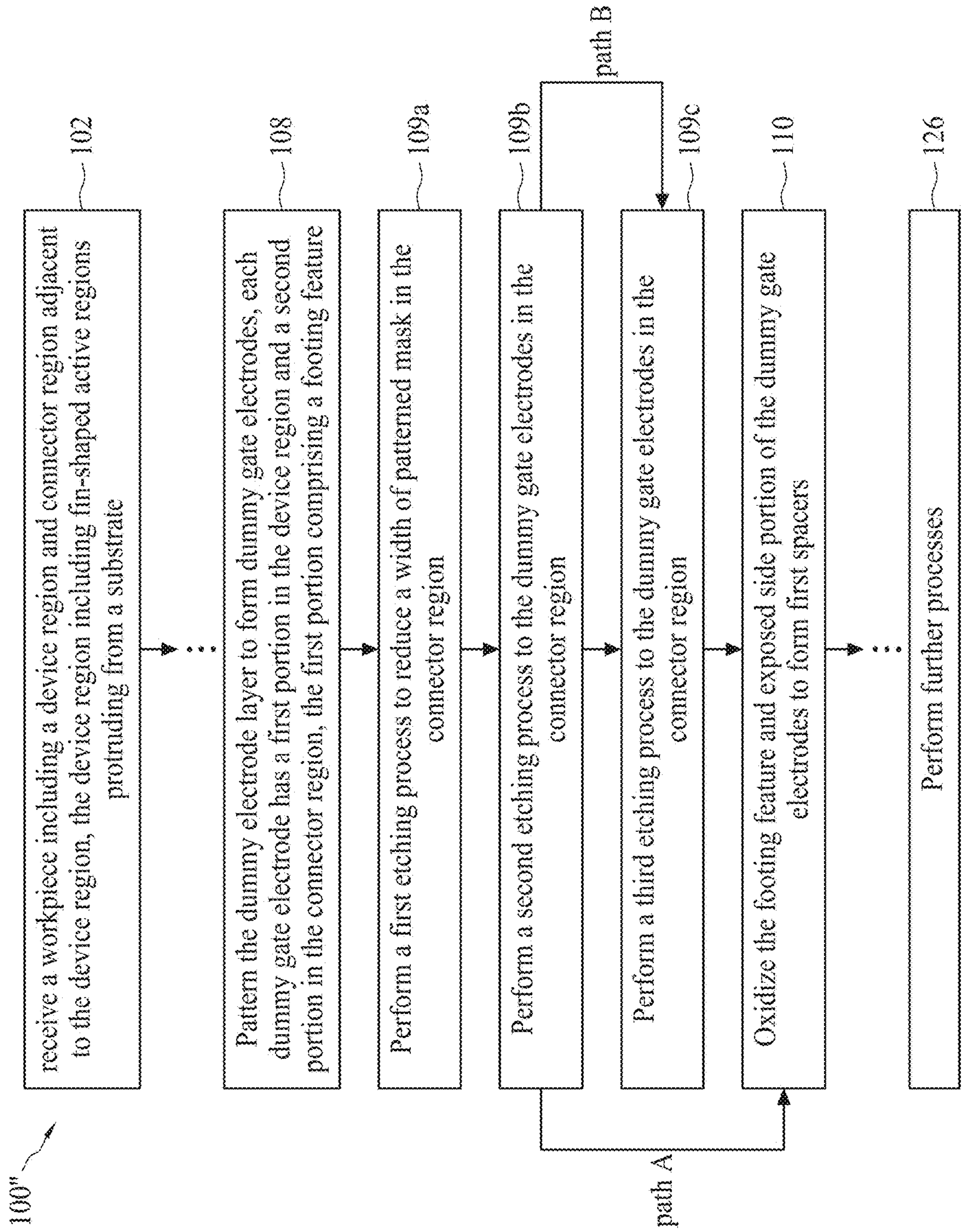
FIG. 25 illustrates a flowchart of a second alternative method for forming a semiconductor structure, according to various embodiments of the present disclosure.

The various aspects of the present disclosure will now be described in more detail with reference to the figures. FIG. 1 is a flow chart illustrating method 100 of forming a semiconductor structure including the gate isolation structures and gate spacers. Method 100 is described below in conjunction with FIGS. 2A-17C. FIG. 18 is a flow chart illustrating a first alternative method 100'. Method 100' is described below in conjunction with FIG. 1 and FIGS. 19A-24C. FIG. 25 is a flow chart illustrating a second alternative method 100". Method 100" is described below in conjunction with FIG. 1 and FIGS. 26A-34F.

Method 100/100'/100" is merely an example and is not intended to limit the present disclosure to what is explicitly illustrated therein. Additional steps may be provided before, during, and/or after the method 100/100'/100", and some steps described can be replaced, eliminated, or moved around for additional embodiments of the method. Not all steps are described herein in detail for reasons of simplicity. Because the workpiece 200 will be fabricated into a semiconductor structure upon conclusion of the fabrication processes, the workpiece 200 may be referred to as the semiconductor structure 200 as the context requires. For avoidance of doubts, the X, Y and Z directions in the figures are perpendicular to one another and are used consistently throughout the present disclosure. Throughout the present disclosure, like reference numerals denote like features unless otherwise excepted. For ease of description, figures labeled with the letter A depict fragmentary cross-sectional views of the workpiece taken along line A-A, figures labeled with the letter B or letter B' depict fragmentary cross-sectional views of the workpiece taken along line B-B, figures labeled with the letter C or letter C' depict fragmentary cross-sectional views of the workpiece taken along line C-C, figures labeled with the letter D depict fragmentary cross-sectional views of the workpiece taken along line D-D, figures labeled with the letter D depict fragmentary cross-sectional views of the workpiece taken along line D-D, figures labeled with the letter E depict fragmentary cross-sectional views of the workpiece taken along line E-E, figures labeled with the letter F depict fragmentary cross-sectional views of the workpiece taken along line F-F, figures labeled with the letter G depict fragmentary cross-sectional views of the workpiece taken along line G-G.

Figure 2B:
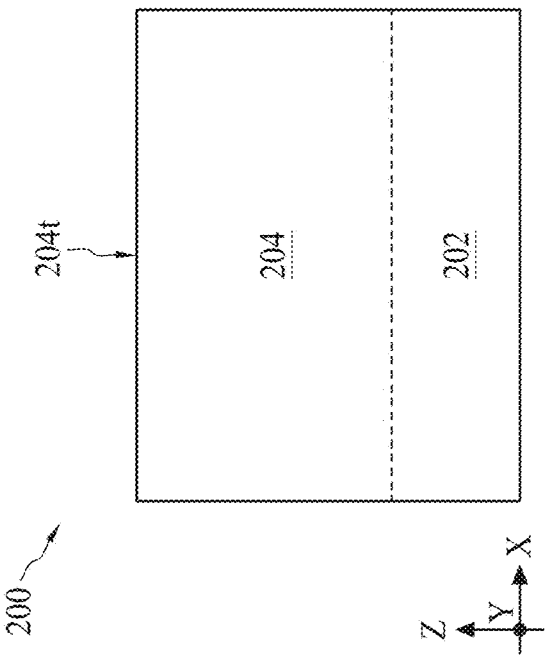
FIGS. 2B, 3B, 4B, 5B, 6B, 7B, 8B, 9B, 13B, 14B, 14B', 15B, 15B', 16B and 17B depict fragmentary cross-sectional views of the workpiece taken along line B-B (shown in FIG. 2A) during various fabrication stages in the method of FIG. 1, according to various aspects of the present disclosure.
Figure 2A:
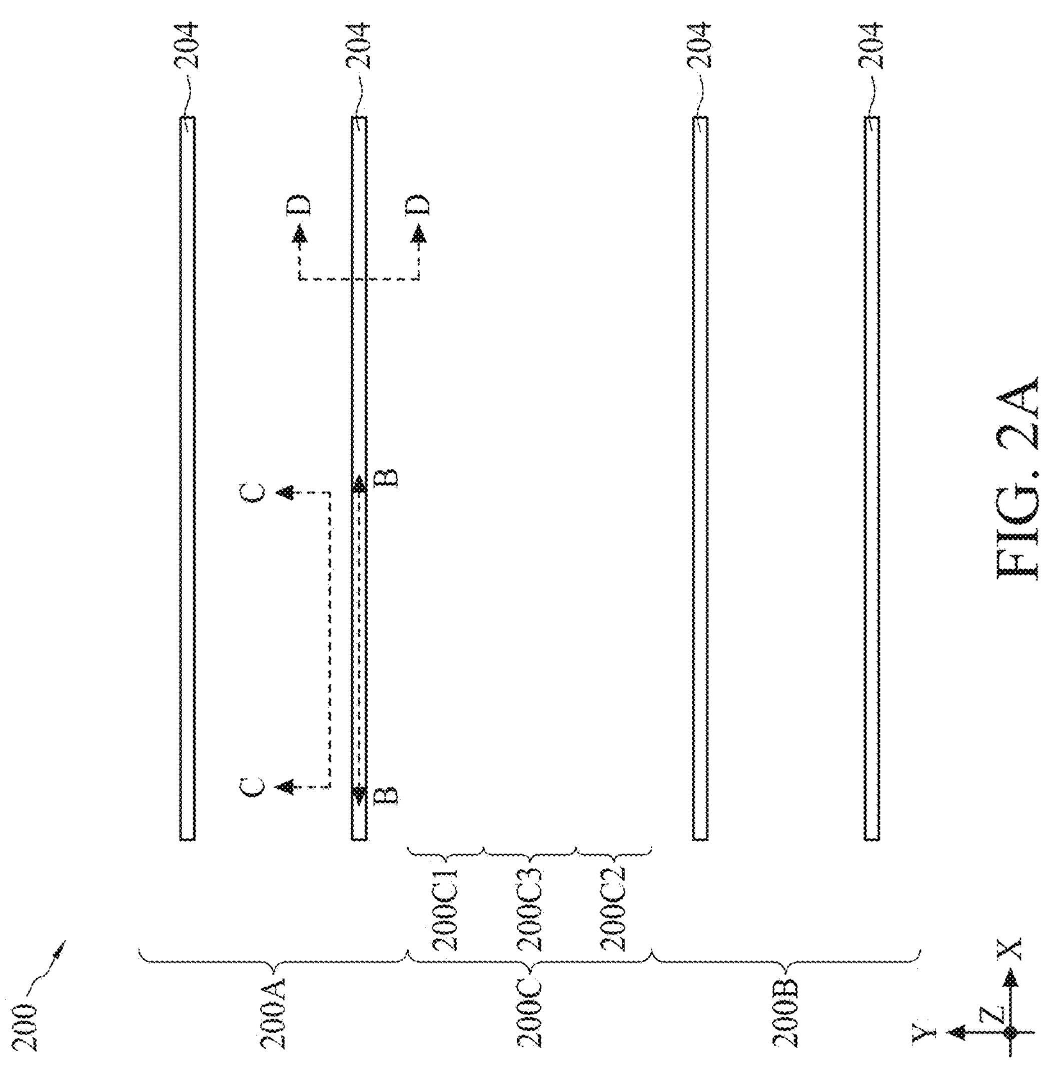
FIGS. 2A, 3A, 4A, 5A, 6A, 7A, 8A, 9A, 10A, 11A, 12A, 13A, 14A, 15A, 16A and 17A (FIGS. 2A-17A) depict fragmentary top views of a workpiece during various fabrication stages in the method of FIG. 1, according to various aspects of the present disclosure.
Figure 2D:
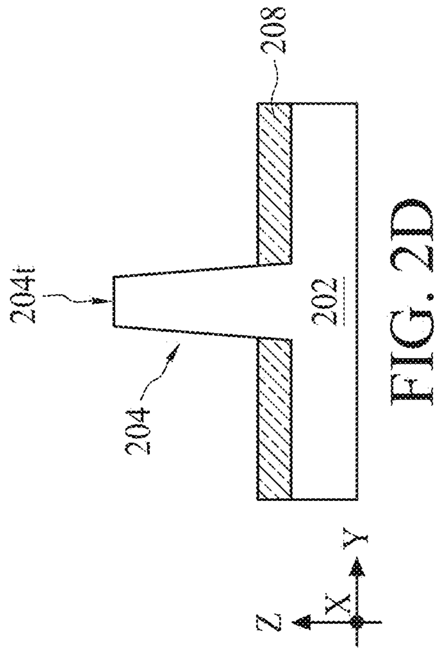
FIGS. 2D and 3D depict fragmentary cross-sectional views of the workpiece taken along line D-D (shown in FIG. 2A) during various fabrication stages in the method of FIG. 1, according to various aspects of the present disclosure.
Figure 2C:
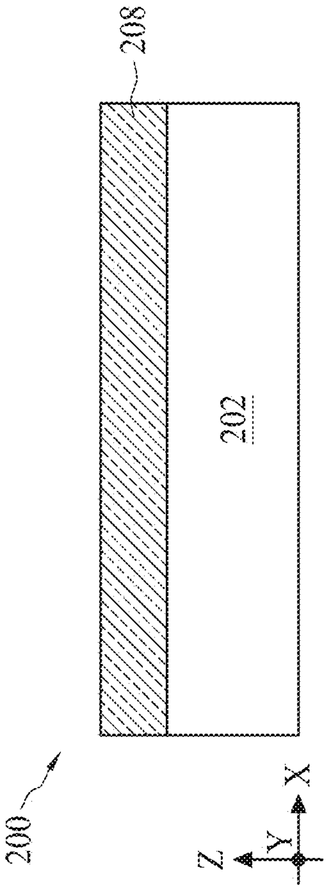
FIGS. 2C, 3C, 4C, 5C, 6C, 7C, 8C, 9C, 13C, 14C, 14C', 15C, 15C', 16C and 17C depict fragmentary cross-sectional views of the workpiece taken along line C-C (shown in FIG. 2A) during various fabrication stages in the method of FIG. 1, according to various aspects of the present disclosure.

Referring now to FIGS. 1 and FIGS. 2A-2D, method 100 includes a block 102 where a workpiece 200 is received. FIG. 2A depicts a fragmentary top view of the workpiece 200. FIGS. 2B, 2C, 2D depict fragmentary cross-sectional views of the workpiece 200 taken along line B-B, line C-C, line D-D shown in FIG. 2A, respectively. The workpiece 200 includes a device region (e.g., device region 200A/200B) for forming semiconductor devices and a connector region 200C adjacent to the device region. As depicted in FIG. 2A, the connector region 200C includes a first region 200C1 closer to the device region 200A, a second region 200C2 closer to the device region 200B, and a third region 200C3 between the first region 200C1 and the second region 200C2. The first, second, and third regions 200C1, 200C2, and 200C3 of the connector region 200C may be referred to as the connector region 200C1, the connector region 200C2, the connector region 200C3, respectively. It is understood that the workpiece 200 may include other suitable numbers of device regions and connector regions.

The workpiece 200 includes a substrate 202. The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. The substrate 202 may include various doped regions may be disposed in or on the semiconductor substrate 202. The doped regions may be doped with n-type dopants, such as phosphorus or arsenic, and/or p-type dopants, such as boron or $BF_2$, depending on design requirements. The doped regions may be formed directly on the semiconductor substrate 202, in a p-well structure, in an n-well structure, in a dual-well structure, or in a raised structure. Doped regions may be formed by implantation of dopant atoms, in-situ doped epitaxial growth, and/or other suitable techniques. These examples are for illustrative purposes only and are not intended to be limiting.

The workpiece 200 includes fin-shaped active regions (or fins) 204 formed in the device region 200A. The fins 204 protrude from the substrate 202 and extend along the X direction. The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 protruding from the substrate 202. The etching process may include dry etching, wet etching, reactive ion etching (RIE), other suitable processes, or combinations thereof. Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204.

The workpiece 200 includes isolation features 208 (shown in FIGS. 2C-2D) separating bottom portions of the fins 204. The isolation features 208 may include silicon oxide (SiO and/or $SiO_2$), borophosphosilicate glass (BPSG), fluoride-doped silicate glass (FSG), phosphosilicate glass (PSG), boron-doped silicate glass (BSG), a low-k (having a dielectric constant less than that of silicon oxide, which is about 3.9) dielectric material, other suitable materials, or combinations thereof. Other isolation structure such as field oxide, local oxidation of silicon (LOCOS), and/or other suitable structures may also be implemented as the isolation features 208. In some examples, the isolation features 208 may include a multi-layer structure, for example, having one or more thermal oxide liner layers. In the present embodiments, forming the isolation features 208 includes depositing a dielectric material over the substrate 202, thereby filling the trenches separating the fins 204, applying one or more chemical mechanical planarization (CMP) process to planarize the workpiece 200, and subsequently etching back portions of the dielectric material to form the isolation features 208, such that the top surface of the isolation features 208 is below a top surface 204*t* of the fins 204. The dielectric material may be deposited by any suitable method, such as CVD, flowable CVD (FCVD), spin-on-glass (SOG), other suitable methods, or combinations thereof. A curing process may be applied after the depositing and planarizing the isolation material.

Figure 3B:
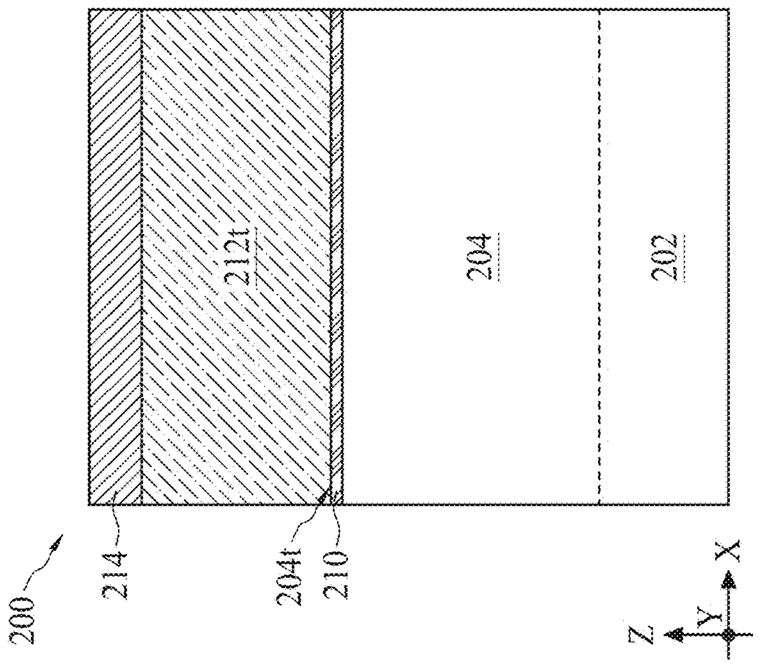
Figure 3A:
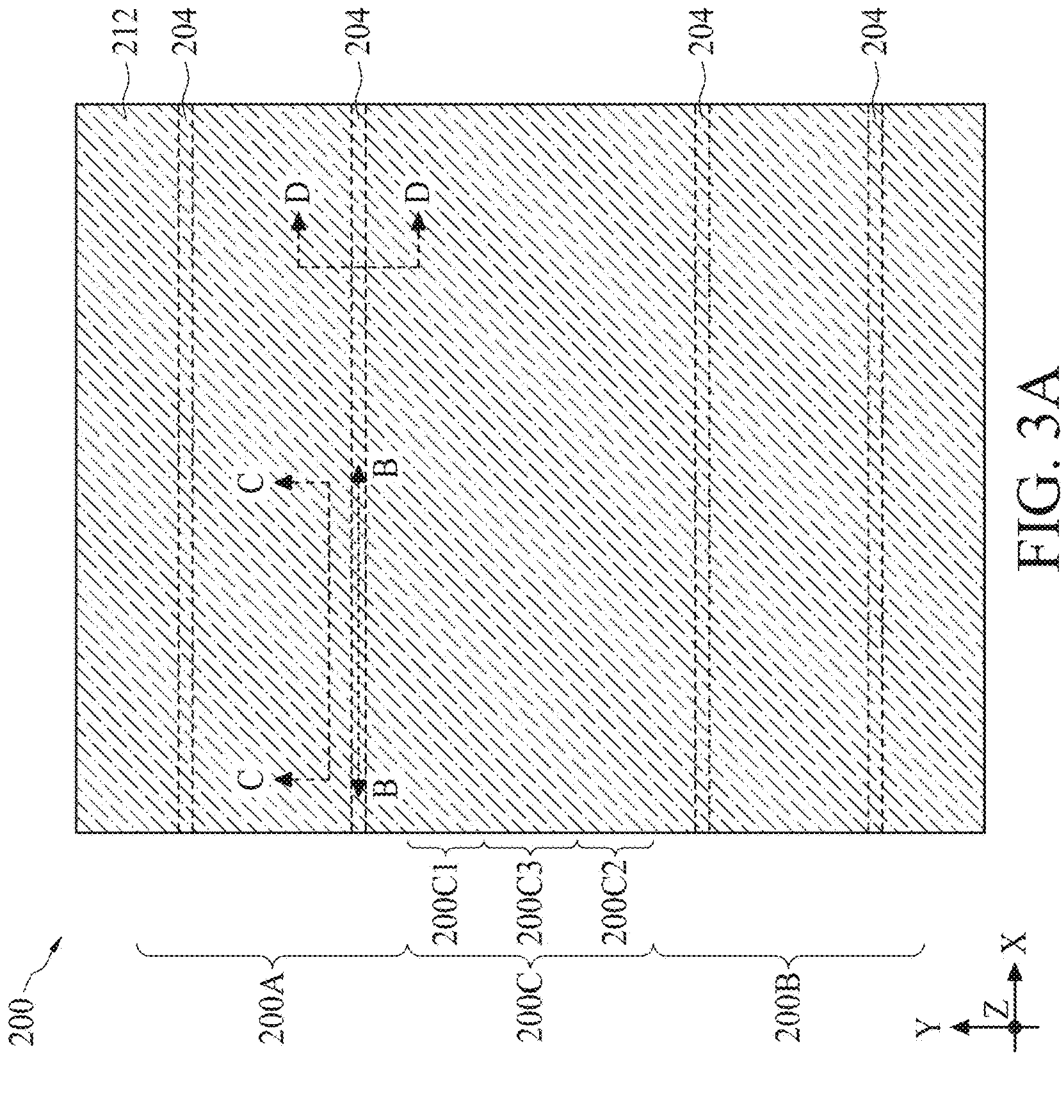
Figure 3D:
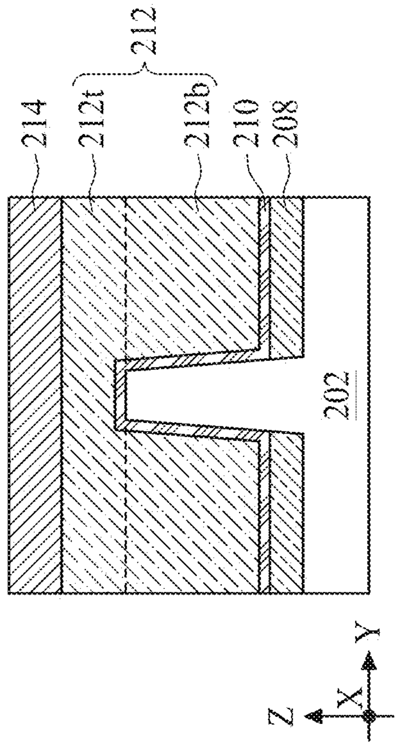
Figure 3C:
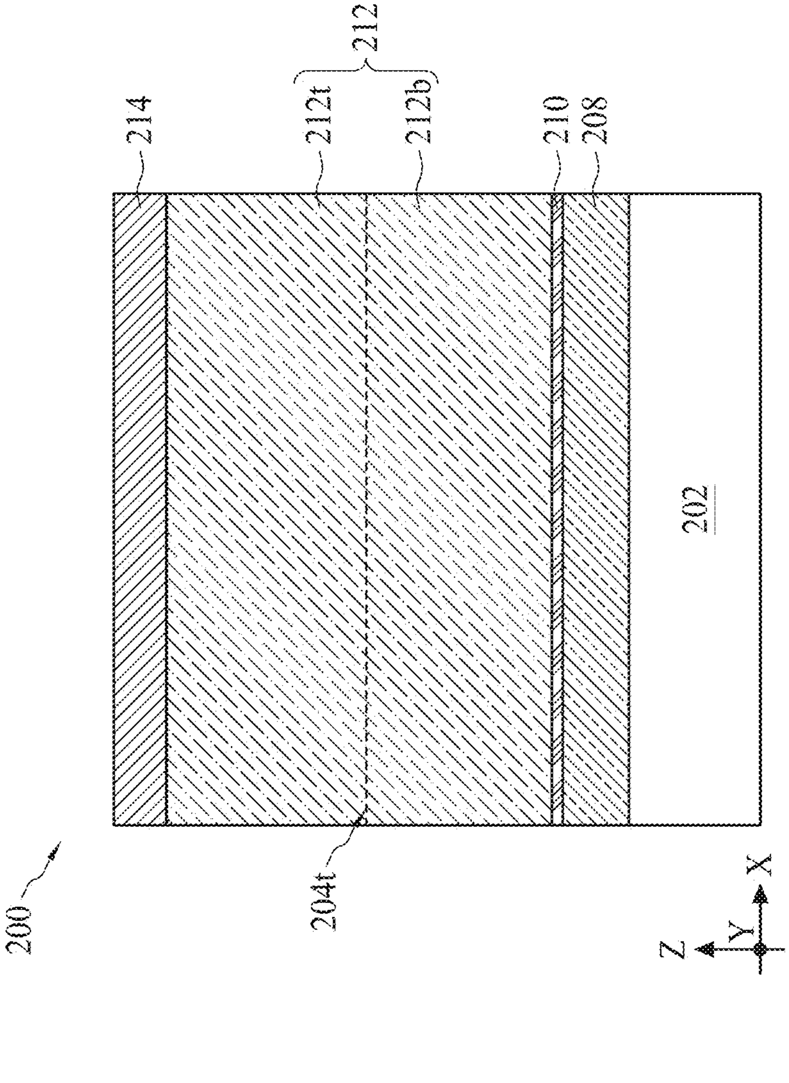

Referring now to FIGS. 1 and FIGS. 3A-3D, method 100 includes a block 104 where a dummy dielectric layer 210 is formed over the workpiece 200. FIG. 3A is a fragmentary top view of the workpiece 200. FIGS. 3B, 3C, 3D depict fragmentary cross-sectional views of the workpiece 200 taken along line B-B, line C-C, line D-D shown in FIG. 3A, respectively. The dummy dielectric layer 210 may be conformally deposited over the workpiece 200, including over top surfaces and sidewalls of the fins 204 and top surfaces of the isolation features 208 and the substrate 202. The term "conformally" may be used herein for ease of description of a layer having substantially uniform thickness over various regions. In some embodiments, the dummy dielectric layer 210 may be deposited by any suitable method, such as chemical vapor deposition (CVD), atomic layer deposition (ALD), physical vapor deposition (PVD), other suitable methods, or combinations thereof and may include an oxide material, such as silicon oxide, a low-k dielectric material, tetraethyl orthosilicate (TEOS), doped silicon oxide (e.g., BPSG, FSG, PSG, BSG, etc.), other suitable dielectric materials, or combinations thereof.

Still referring to FIGS. 1 and FIGS. 3A-3D, method 100 includes a block 106 where a dummy electrode layer 212 is deposited over the dummy dielectric layer 210. The dummy electrode layer 212 may be deposited on the dummy dielectric layer 210 by any suitable method, such as CVD, ALD, PVD, other suitable methods, or combinations thereof. A planarization process (e.g., chemical mechanical polishing) may be performed to provide a planar top surface for the deposited dummy electrode layer 212. The dummy electrode layer 212 may be formed of any suitable materials. In an embodiment, the dummy electrode layer 212 includes polysilicon. As depicted in FIGS. 3B-3D, the dummy electrode layer 212 includes a top portion 212*t* formed over the top surface 204*t* of the fin 204 and a bottom portion 212*b* formed under the top surface of the fin 204.

Figure 4:
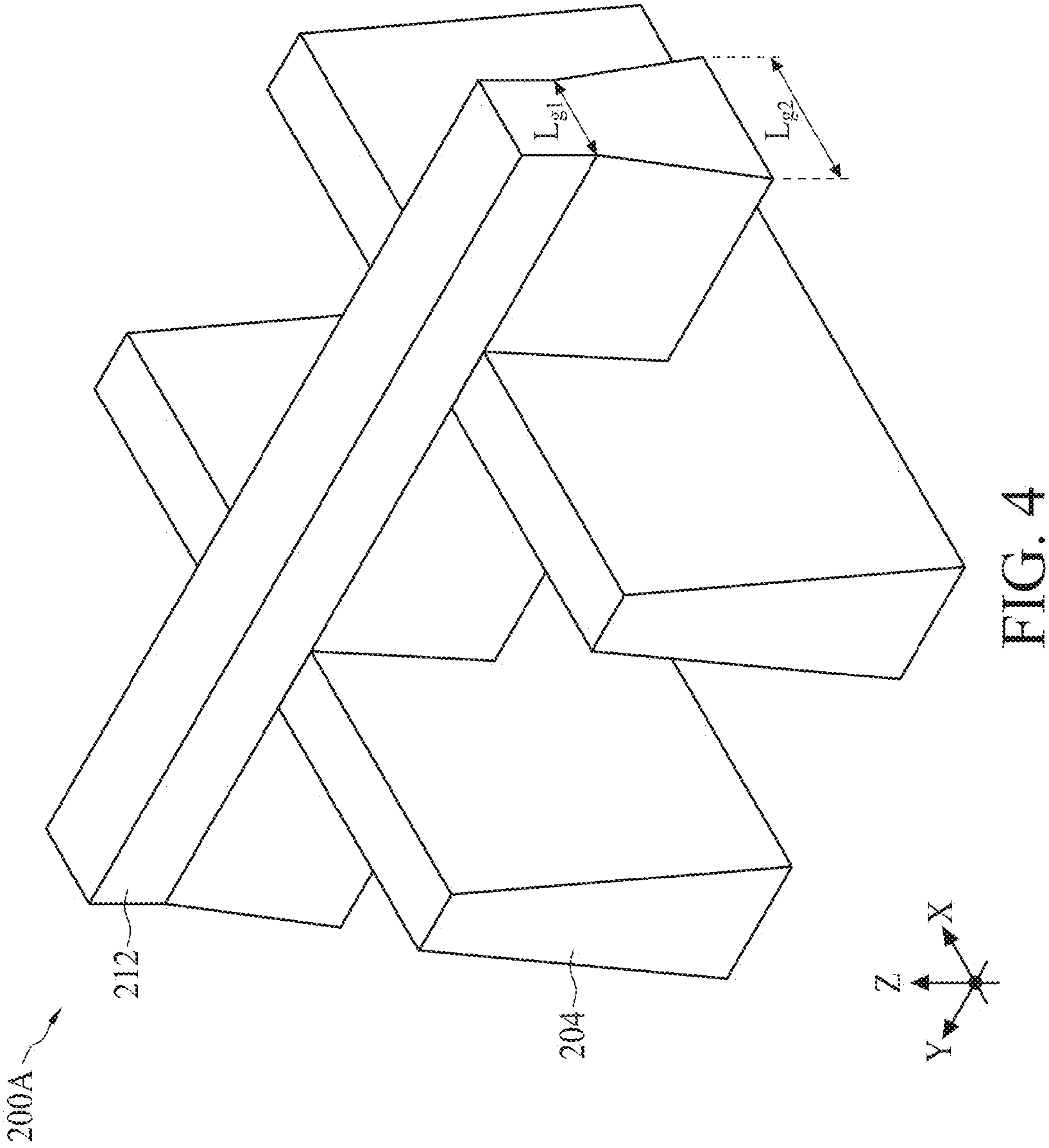
FIG. 4 depicts a fragmentary perspective view of the workpiece shown in FIG. 4A, according to various aspects of the present disclosure.
Figure 4B:
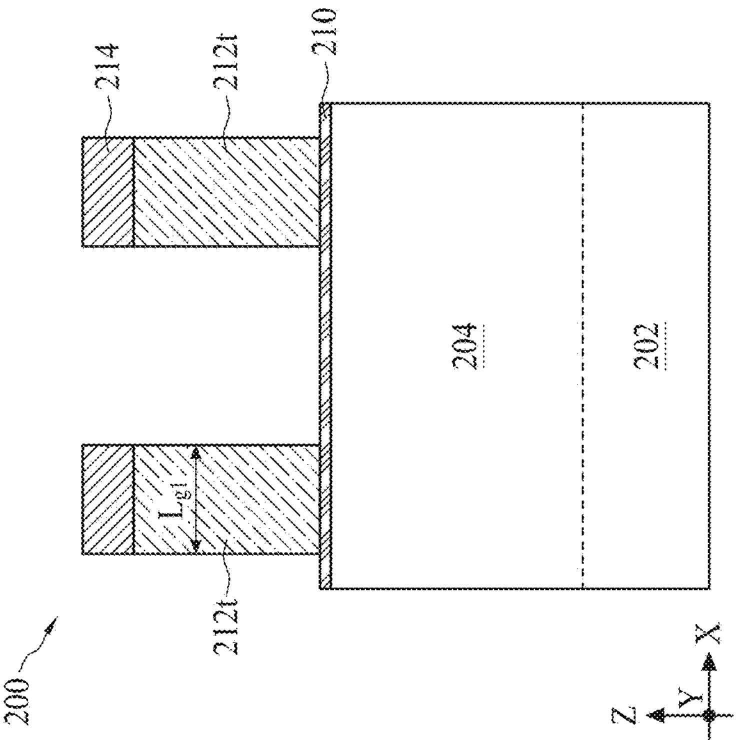
Figure 4A:
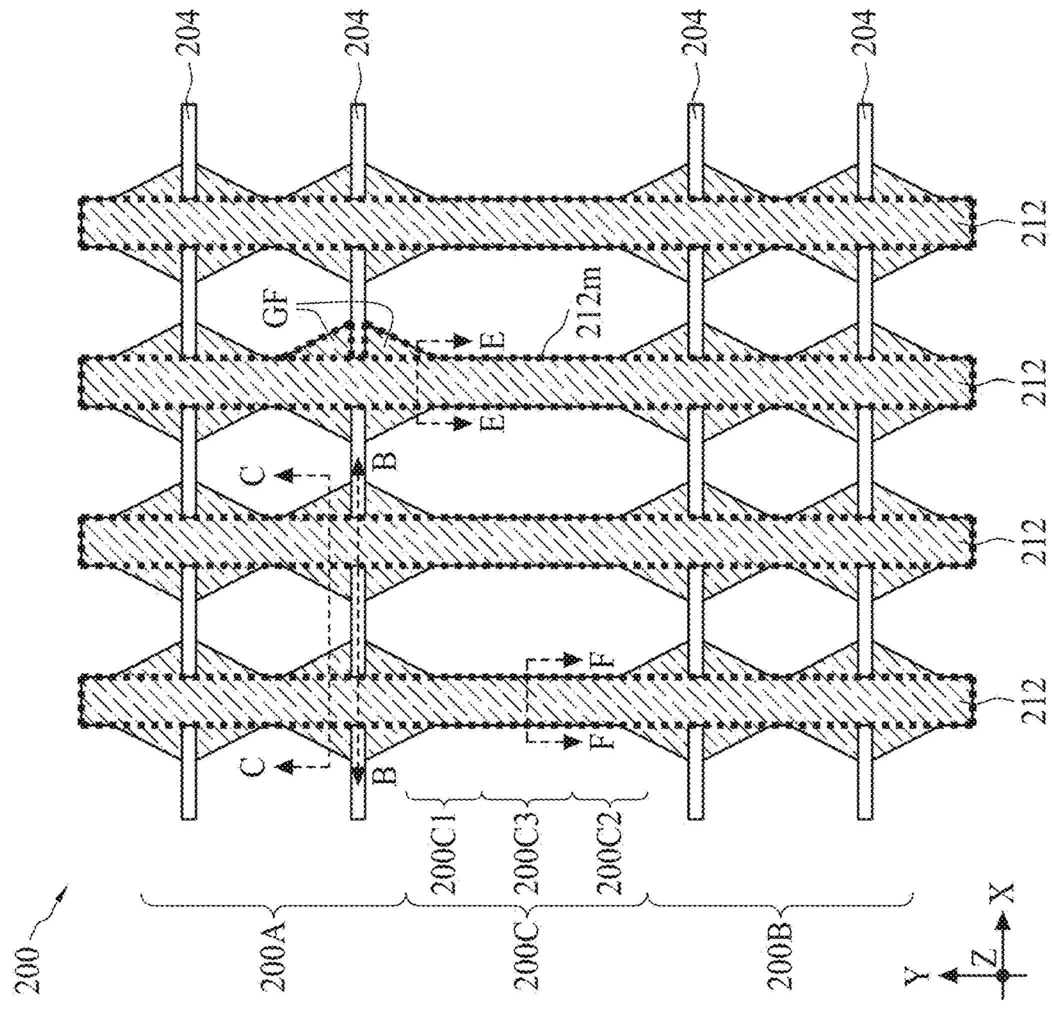
Figure 4F:
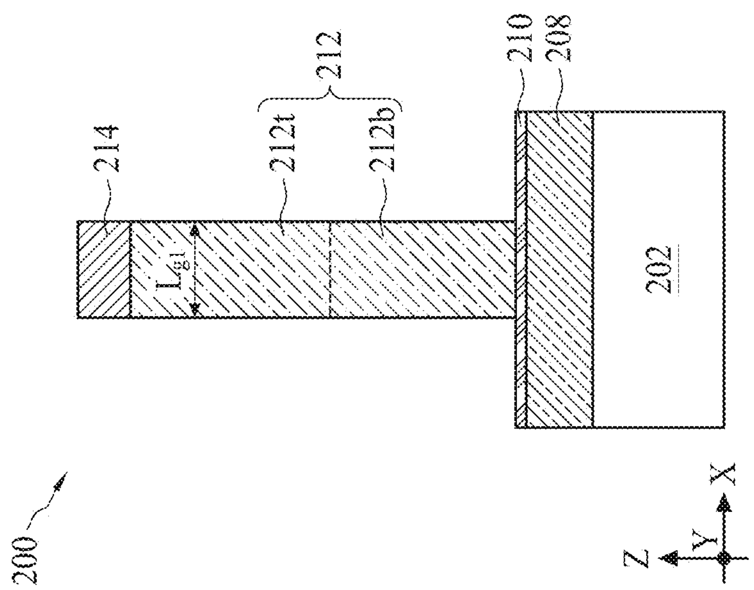
FIGS. 4F, 5F, 6F, 7F, 8F, 9F, 10F, 11F and 12F depict fragmentary cross-sectional views of the workpiece taken along line F-F (shown in FIG. 4A) during various fabrication stages in the method of FIG. 1, according to various aspects of the present disclosure.
Figure 4C:
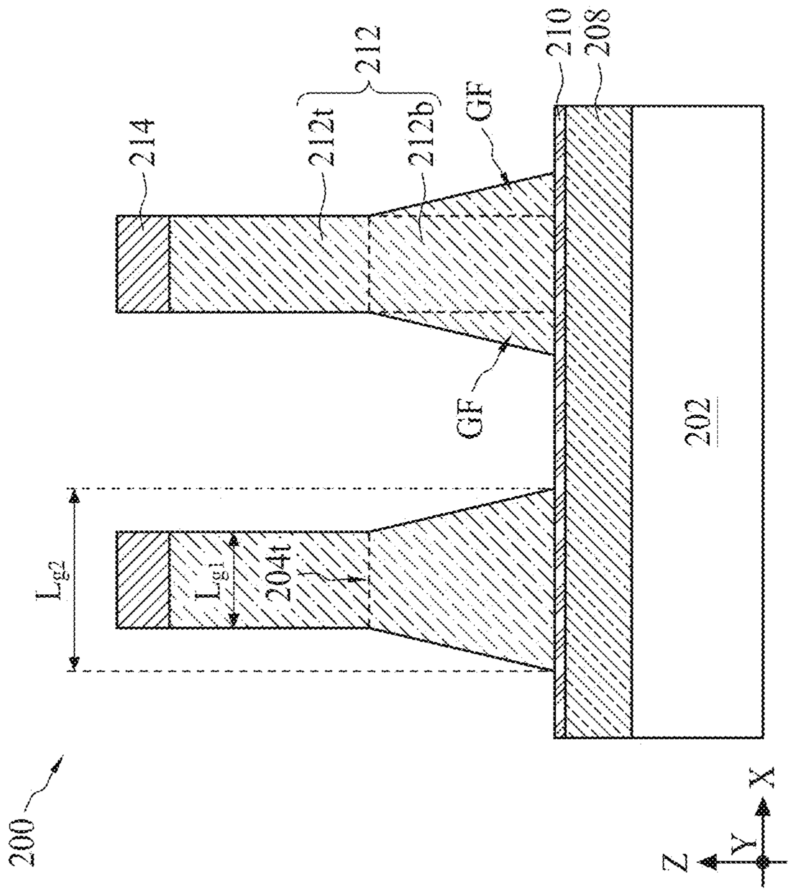

Referring now to FIGS. 1, FIGS. 3A-3D, and FIGS. 4A, 4B, 4C, 4F and 4, method 100 includes a block 108 where the dummy electrode layer 212 is patterned to form dummy gate electrodes. FIG. 4A is a fragmentary top view of the workpiece 200, FIGS. 4B, 4C, 4F depict fragmentary cross-sectional views of the workpiece 200 taken along line B-B, line C-C, and line F-F shown in FIG. 4A, respectively, and FIG. 4 depicts a fragmentary perspective view of the device region 200A of the workpiece 200. In an example process, with reference to FIGS. 3B-3D, a hard mask layer 214 is formed over the dummy electrode layer 212. The hard mask layer 214 may be a single-layer structure or a multi-layer structure and may be formed by any suitable method, such as CVD, atomic layer deposition (ALD), other suitable methods, or combinations thereof. In the present embodiments, the hard mask layer 214 includes silicon nitride (SiN), carbon-containing silicon nitride (SiCN), carbon-containing silicon oxide (SiOC), oxygen-containing silicon nitride (SiON), Si, carbon-and-oxygen-doped silicon nitride (SiOCN), a low-k dielectric material, other suitable materials, or combinations thereof. After forming the hard mask layer 214, the hard mask layer 214 is patterned using photolithography process to form a patterned hard mask layer 214 exposing portions of the dummy electrode layer 212 that will be removed while covering other portions.

With reference to FIGS. 4B, 4C, 4F, and 4, the patterned hard mask layer 214 is then applied as an etch mask in an etching process to pattern the dummy electrode layer 212. The etching process selectively etches the dummy electrode layer 212 without substantially etching the patterned hard mask layer 214 and the dummy dielectric layer 210. The patterning of the dummy electrode layer 212 forms one or more dummy gate electrodes. For ease of description, the dummy gate electrodes and the dummy electrode layer 212 use same reference number. The dummy gate electrode 212 has the top portion 212*t* over the top surface 204*t* of the fins 204 and the bottom portion 212*b* under the top portion 212*t*. The number of dummy gate electrodes 212 shown in the figures is just an example and is not intended to be limiting.

The top portion 212*t* of the dummy gate electrode 212 has a gate length $L_{g1}$, which defines a distance (or length) that current (e.g., carriers, such as electrons or holes) travels between source/drain regions of fins 204. The dummy gate electrode 212 has a gate footing GF (also referred to as gate skirt, gate ledge, or footing feature) disposed along the bottom portion 212*b* of the dummy gate electrode 212, which results in the bottom portion 212*b* of the dummy gate electrode 212 having a gate length $L_{g2}$ that is greater than the gate length $L_{g1}$ of the top portion 212*t* of the dummy gate electrode 212. Gate footing GF has a tapered width that decreases along the Z direction, such that gate length $L_{g2}$ also decreases along the Z direction. Gate footing GF (or a bottom gate profile) of dummy gate electrodes 212 may vary depending on patterning environment (e.g., isolated pattern or dense pattern), locations of the dummy gate electrodes 212 on a wafer (e.g., edge or center), and/or proximity of area of dummy gate electrodes 212 relative to fins 204 (e.g., gate area directly adjacent to fins 204 or gate area further away from fins 204). In some embodiments, as depicted in FIG. 4A, gate footing GF is present only at an interface region between fins 204 and dummy gate electrodes 212, such as at corners between fins 204 and dummy gate electrodes 212. In this depicted example, the gate footing GF appears in the device regions 200A and 200B, and also shows up in the connector regions 200C1 and 200C2 that are adjacent to the device regions 200A and 200B. The portions of the dummy gate electrodes 212 in the connector region 200C3 do not have the gate footing GF. That is, in a cross-sectional view cut through line E-E, the profile of the dummy gate electrode 212 is similar to the profile of the dummy gate electrode 212 depicted in FIG. 4C; and, in a cross-sectional view cut through line F-F, the profile of the dummy gate electrode 212 resembles a rectangular and is different from the profile of the dummy gate electrode 212 depicted in FIG. 4C. It is noted that some features (e.g., the dummy dielectric layer 210, the isolation features 208, the patterned hard mask layer 214) are omitted in FIGS. 4A and 4. In embodiments represented by FIG. 4A, the dummy gate electrode 212 may be regarded as a main portion 212*m* extending along the Y direction that has a uniform length $L_{g1}$ and an auxiliary portion (i.e., the gate footing GF) extending outwardly and laterally from the main portion 212*m*.

Gate footing GF presents challenges for forming gate isolation structures that are configured to provide isolation between different pieces of a gate structure. For example, a gate isolation structure that is able to cut the portion of the gate structure in the connector region 200C3 may not be able to the cut the portion of the gate structure in the connector region 200C1/200C2 due to the presence of the gate footing GF, leading to isolation failure and electrical shorts. The presence of the gate footing GF also decreases a distance between the gate structure and an adjacent source/drain contact, which disadvantage affects parasitic capacitance. The proposed fabrication techniques in the present disclosure solve those problems.

Figure 5B:
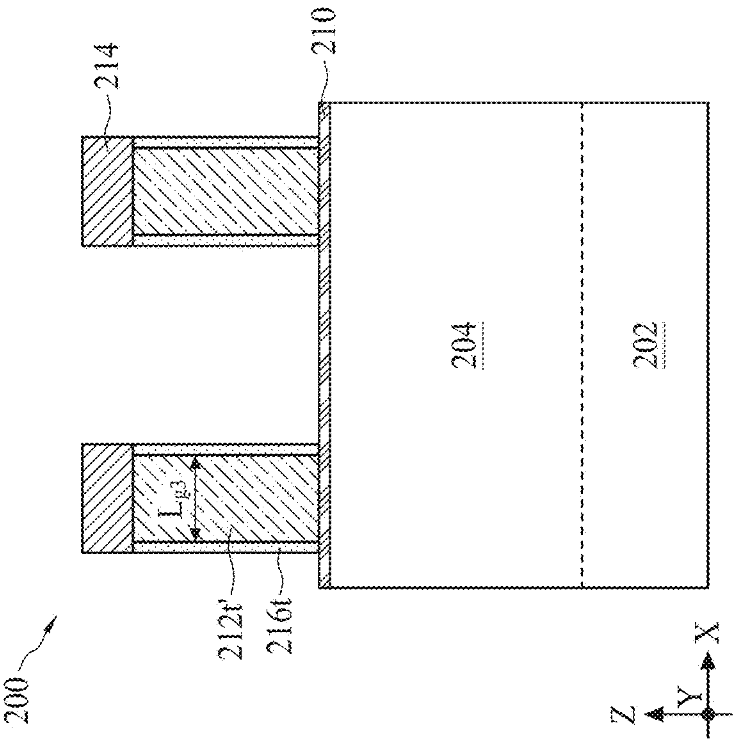
Figure 5A:
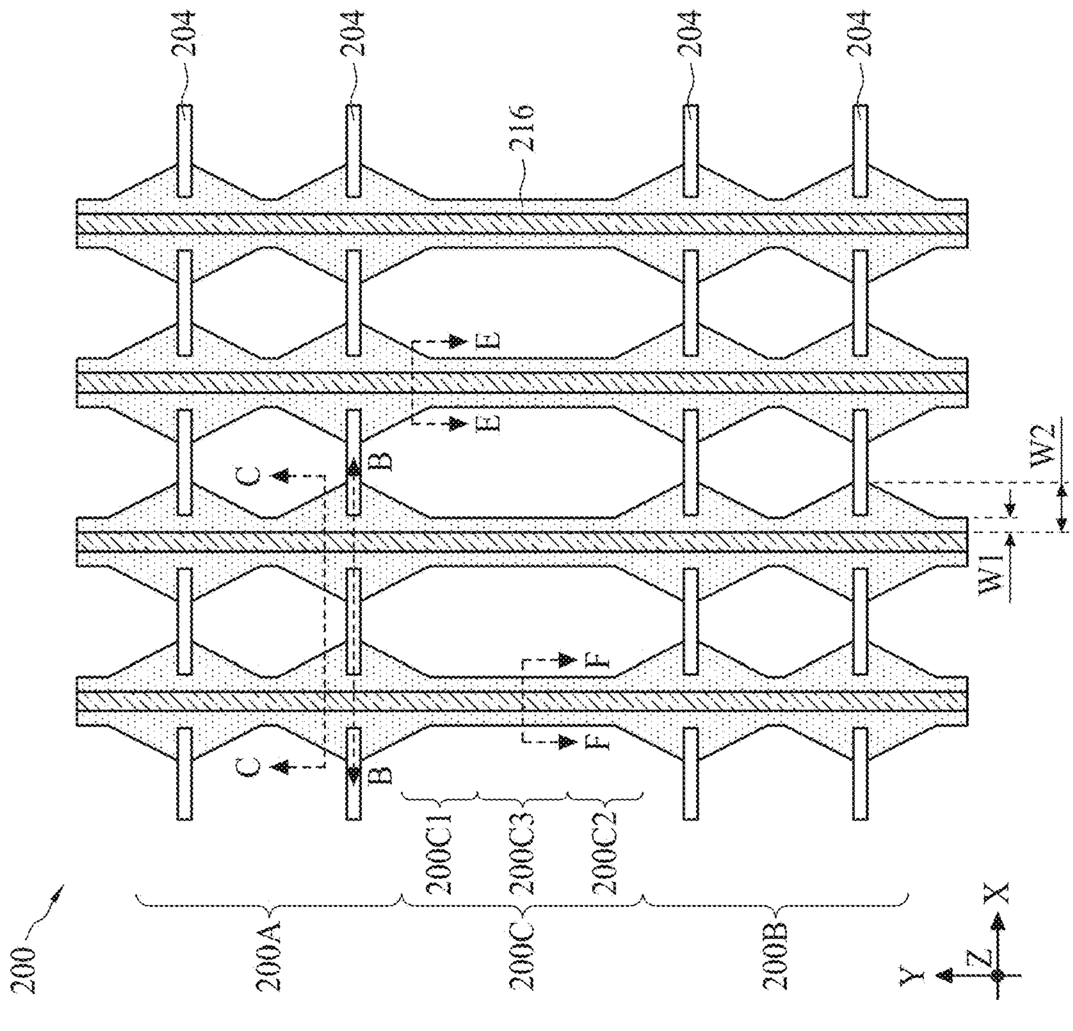
Figure 5F:
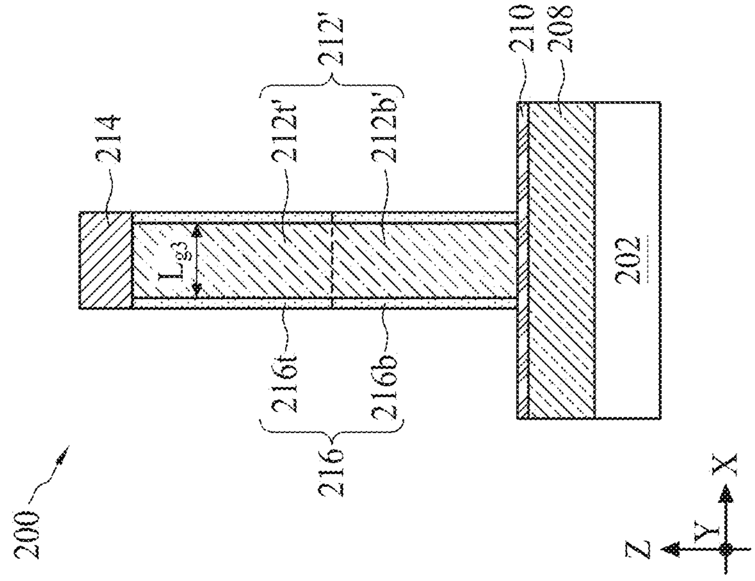
Figure 5C:
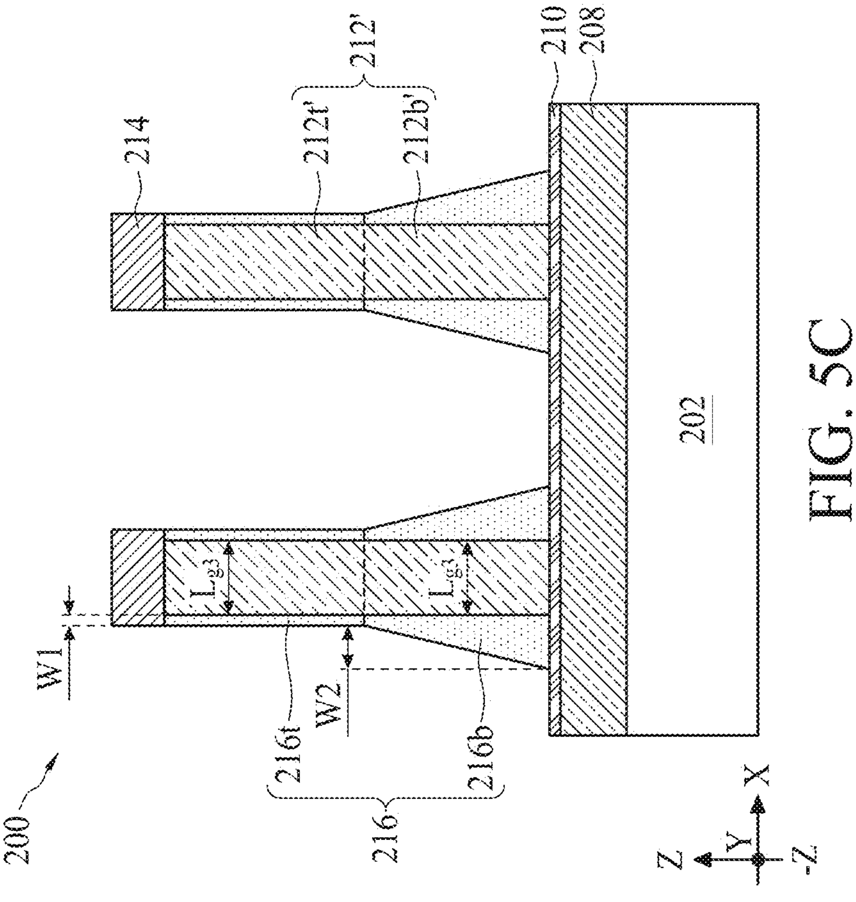

Referring now to FIGS. 1 and FIGS. 5A-5C and 5F, method 100 includes a block 110 where an oxidization treatment is performed to oxidize a side portion and the footing feature GF of the dummy gate electrode 212 to form a first gate spacer 216. FIG. 5A is a fragmentary top view of the workpiece 200, FIGS. 5B, 5C, and 5F depict fragmentary cross-sectional views of the workpiece 200 taken along line B-B, line C-C, and line F-F shown in FIG. 5A, respectively. A cross-sectional view of the workpiece 200 taken along line E-E shown in FIG. 5A is substantially similar to the cross-sectional view represented by FIG. 5C and is thus omitted for reason of simplicity.

While using the patterned hard mask layer 214 to protect the top surface of the dummy gate electrode 212, the oxidization treatment is performed to oxidize portions (including the sidewall and the gate footing GF) of the dummy gate electrode 212 not covered by the patterned hard mask layer 214. The dummy gate electrode 212 after the performing of the oxidization may be referred to as the dummy gate electrode 212'. The dummy gate electrode 212' has a top portion 212*t*' above the top surface 204*t* of the fin 204 and a bottom portion 212*b*' below the top surface 204*t* of the fin 204. The top portion 212*t*' and the bottom portion 212*b*' of the dummy gate electrode 212' have a same length $L_{g3}$ along the X direction. Due to the performing of the oxidization treatment, the length $L_{g3}$ is less than the length $L_{g2}$. In an embodiment, a ratio of the length $L_{g3}$ to the length $L_{g1}$ is no less than 0.6.

The first gate spacer 216 extends along the sidewall surface of the dummy gate electrode 212' and has a top portion **216*t* above the top surface 204*t* of the fin 204 and a bottom portion below the top surface 204*t* of the fin 204. The top portion 216*t* has a uniform width W1, and the part of the bottom portion 216*b* in the connector region 200C3 has the same width W1 as the top portions 216*t*. Due to the oxidization of the gate footing GF, as represented by FIGS. 5A and 5C, the part of the bottom portion 216*b* in the device region 200A/200B and in the connector region 200C1/200C2 has a tapered width W2 that changes (e.g., gradually increases) along −Z direction. In an embodiment, the width W2 is twice of the width W1. Due to the formation of the first gate spacer 216, the dummy gate electrode 212' has a substantially uniform length $L_{g3}$ that is less than the length $L_{g1}$ or $L_{g2}$. Thus, a distance between source/drain contact and the gate structure that will replace the dummy gate electrode 212' is increased, leading to a reduced parasitic capacitance. In addition, since the performing of the oxidization treatment converts the footing feature GF of the dummy gate electrode 212 from polysilicon to a dielectric layer (i.e., the first gate spacer 216**), the gate isolation structure would be able to provide satisfactory isolation between pieces of the gate structure without increasing fabrication complexity.

In an embodiment, the oxidization treatment includes thermal oxidation, chemical oxidation, other suitable methods, or combinations thereof. For embodiments in which the dummy gate electrode 212 includes polysilicon and the oxidization treatment includes providing oxygen, the first gate spacer 216 includes silicon oxide, such as SiO and/or $SiO_2$. The oxidization treatment may provide other gases such as $NH_3$ and the resulted first gate spacer 216 may include silicon oxynitride. In some embodiments, the first gate spacer 216 may also include silicon oxycarbonitride, silicon carbonite, other suitable materials. In an alternative embodiment, the first gate spacer 216 is a multi-layer structure, and details of this alternative embodiment will be further described below with reference to FIGS. 17A-17C.

Figure 6B:
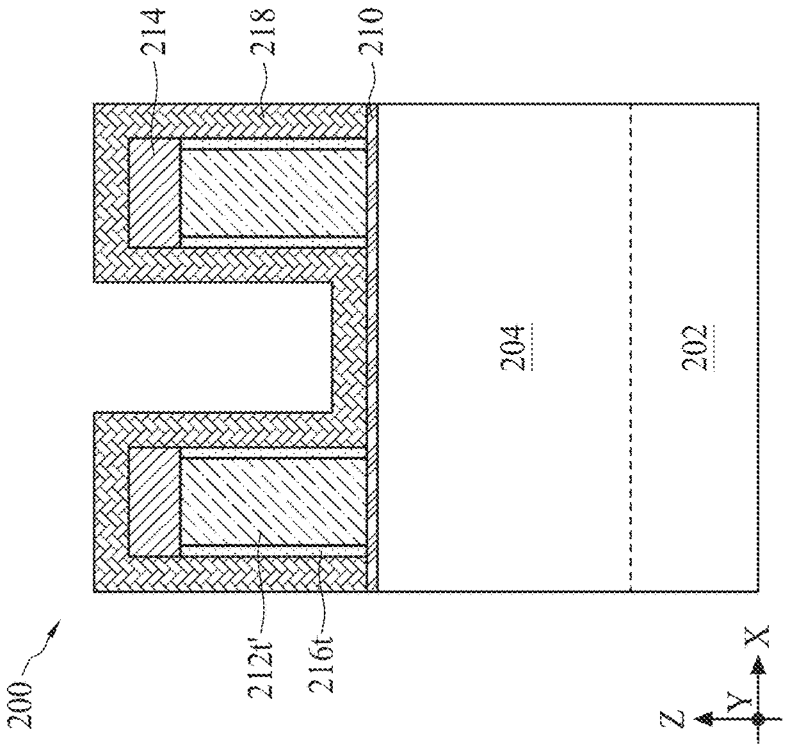
Figure 6A:
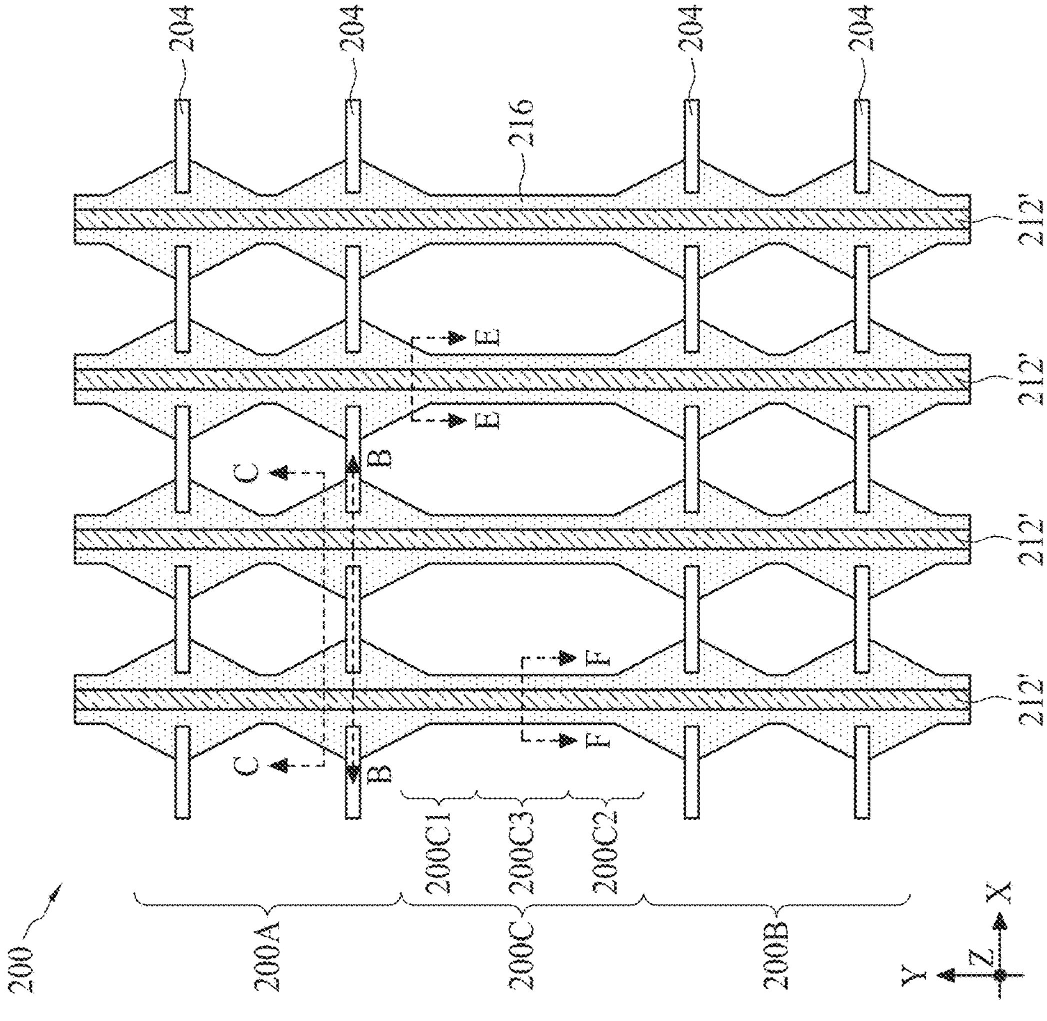
Figure 6F:
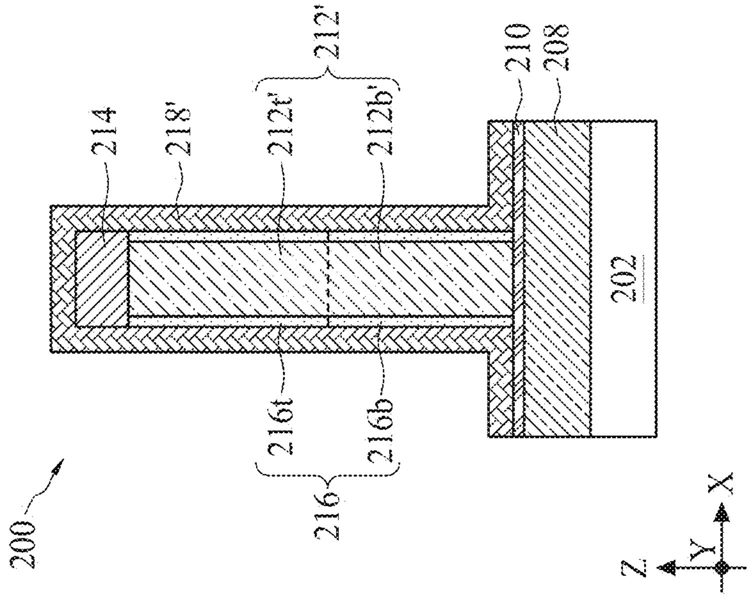
Figure 6C:
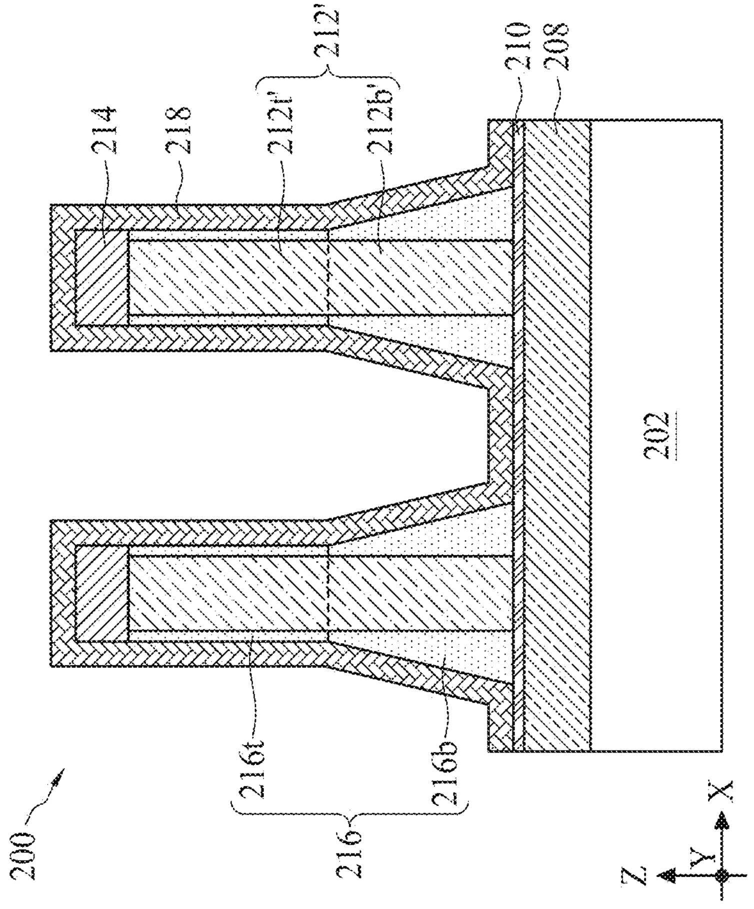
Figure 7B:
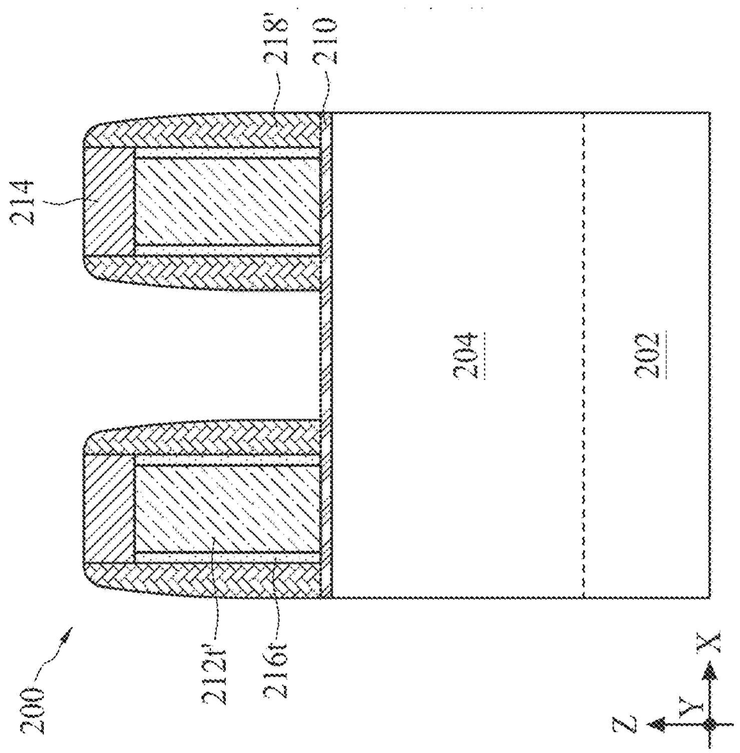
Figure 7A:
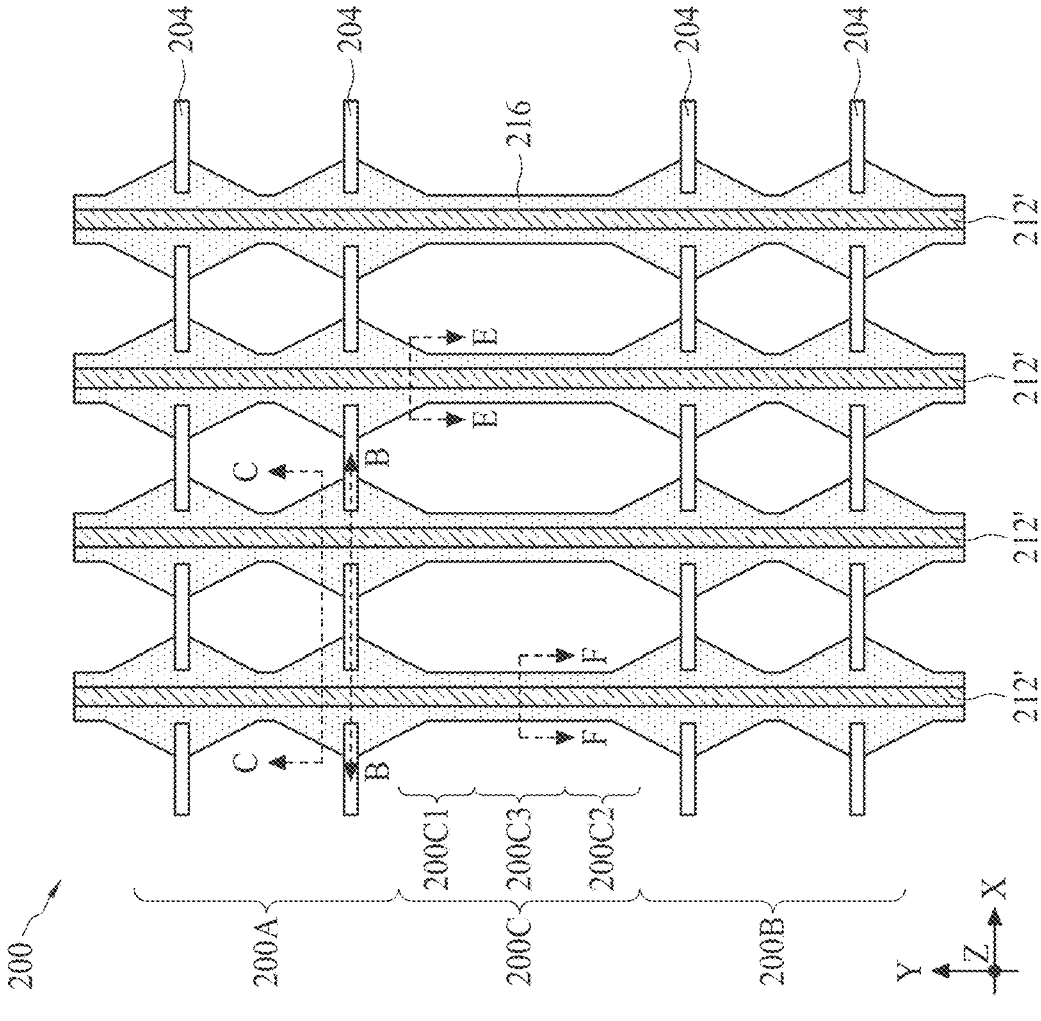
Figure 7F:
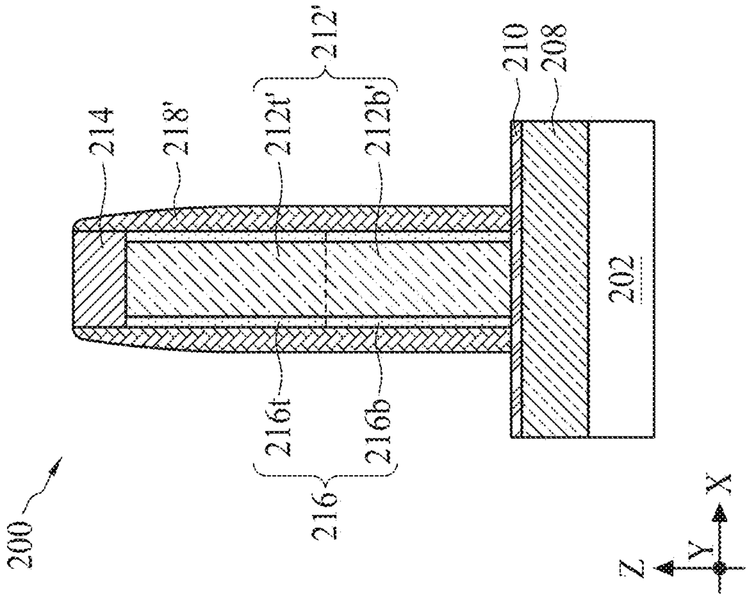
Figure 7C:
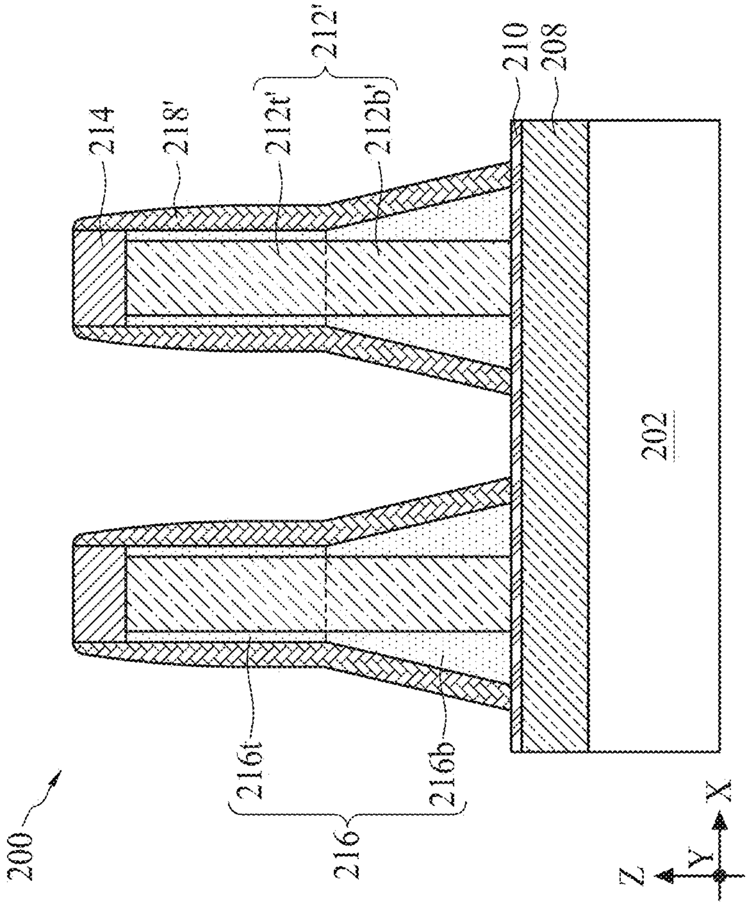
Figure 8B:
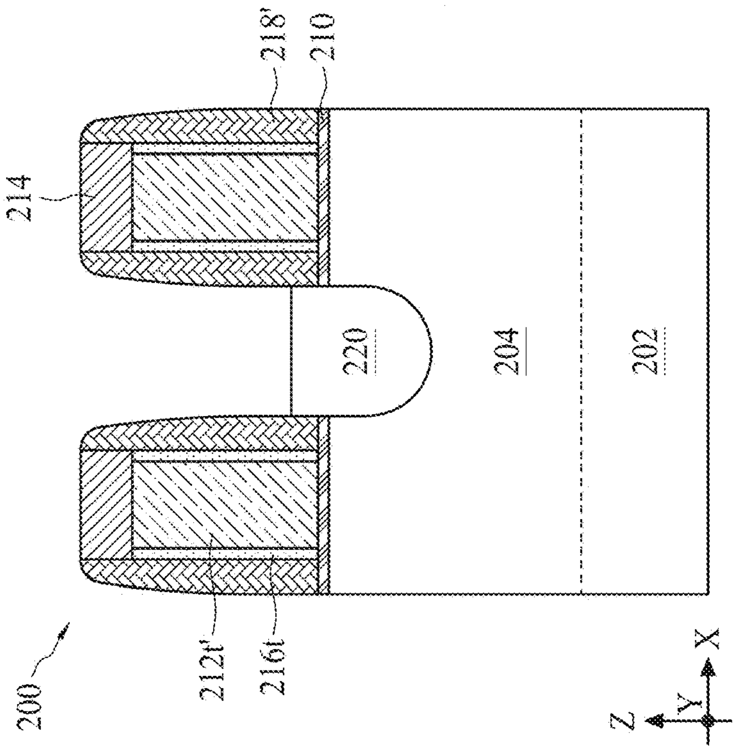
Figure 8A:
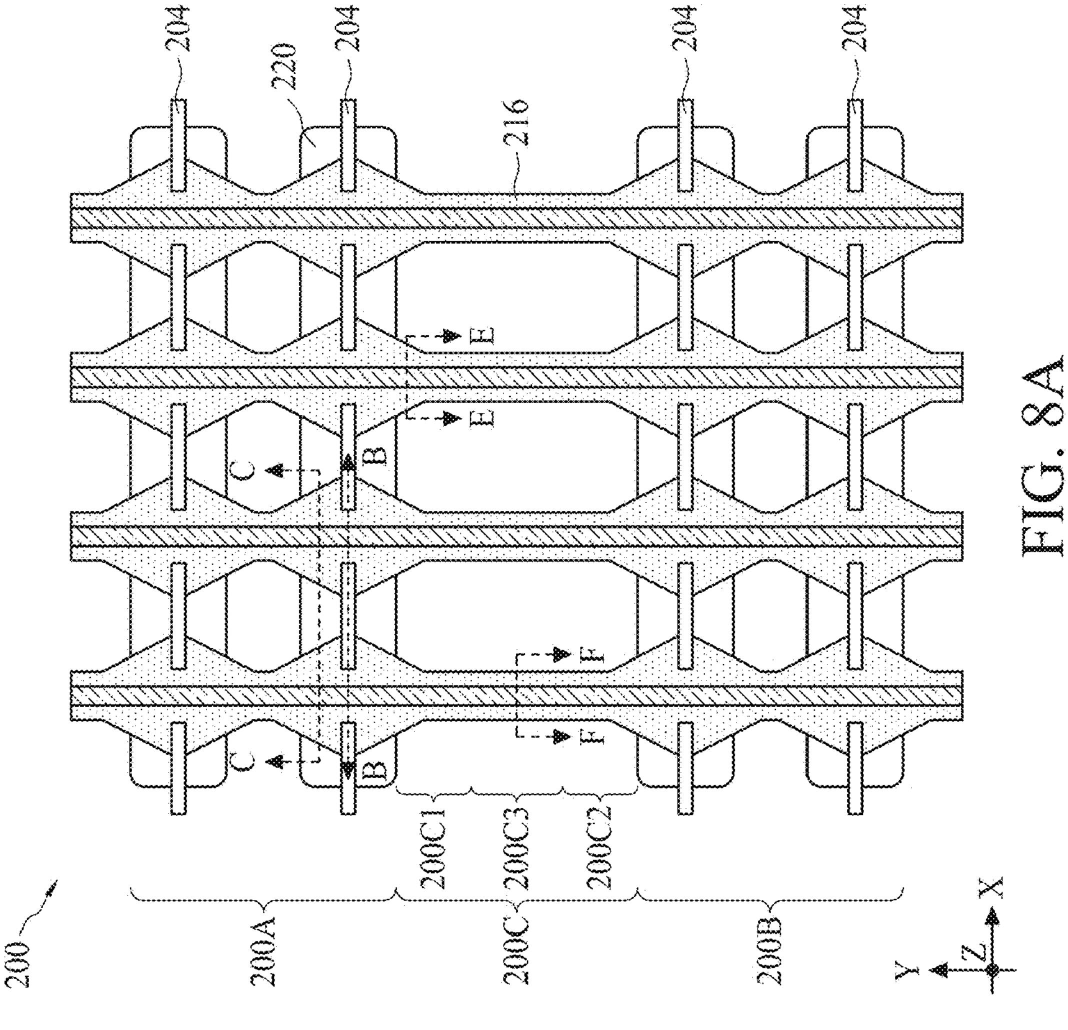
Figure 8C:
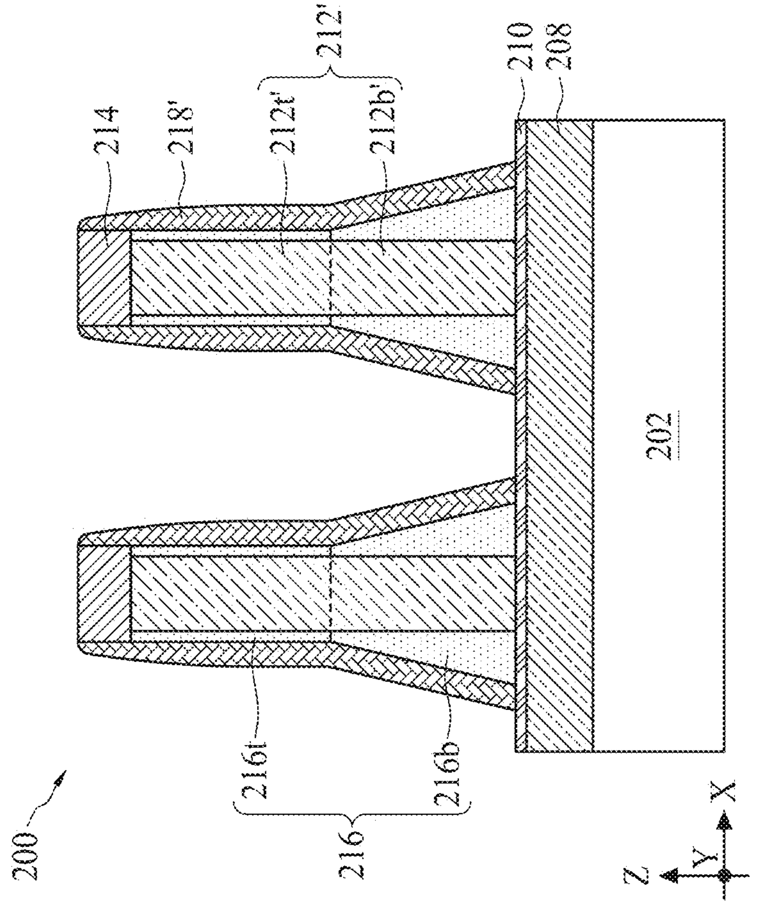
Figure 8F:
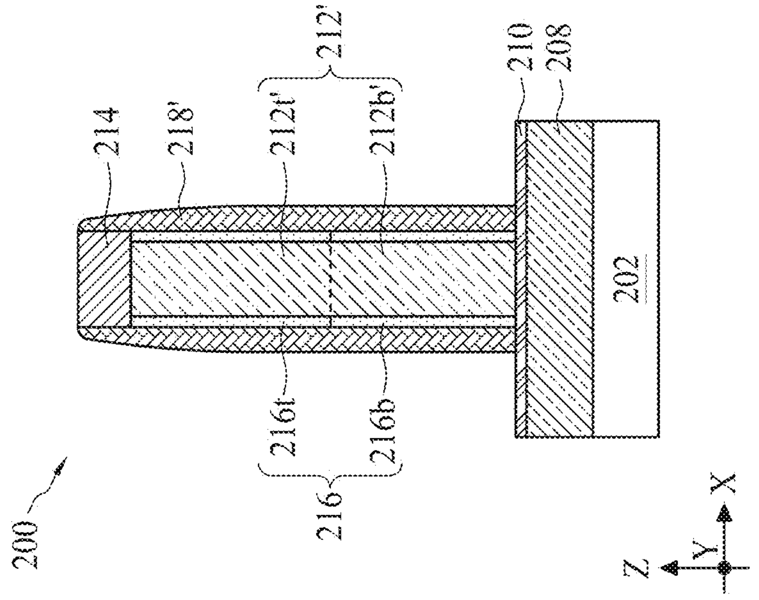
Figure 9B:
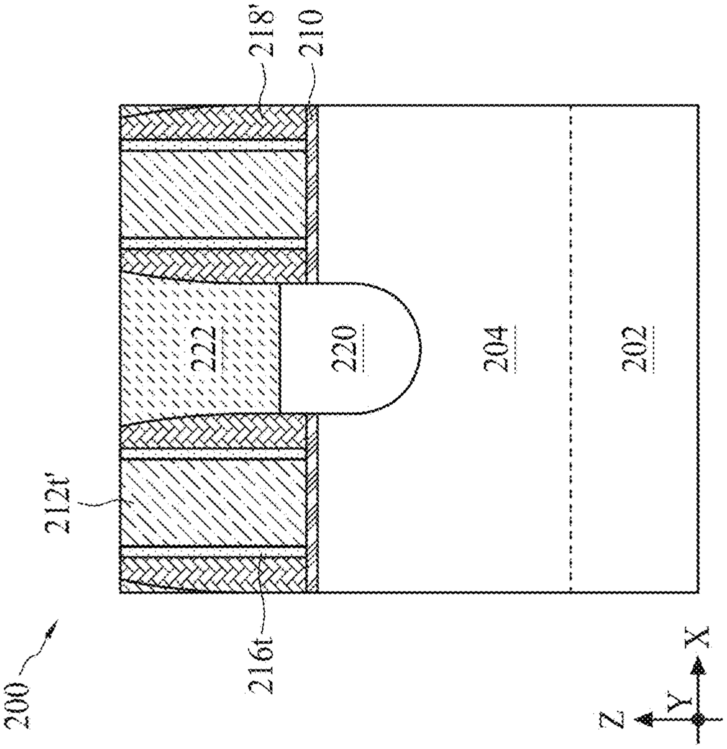
Figure 9A:
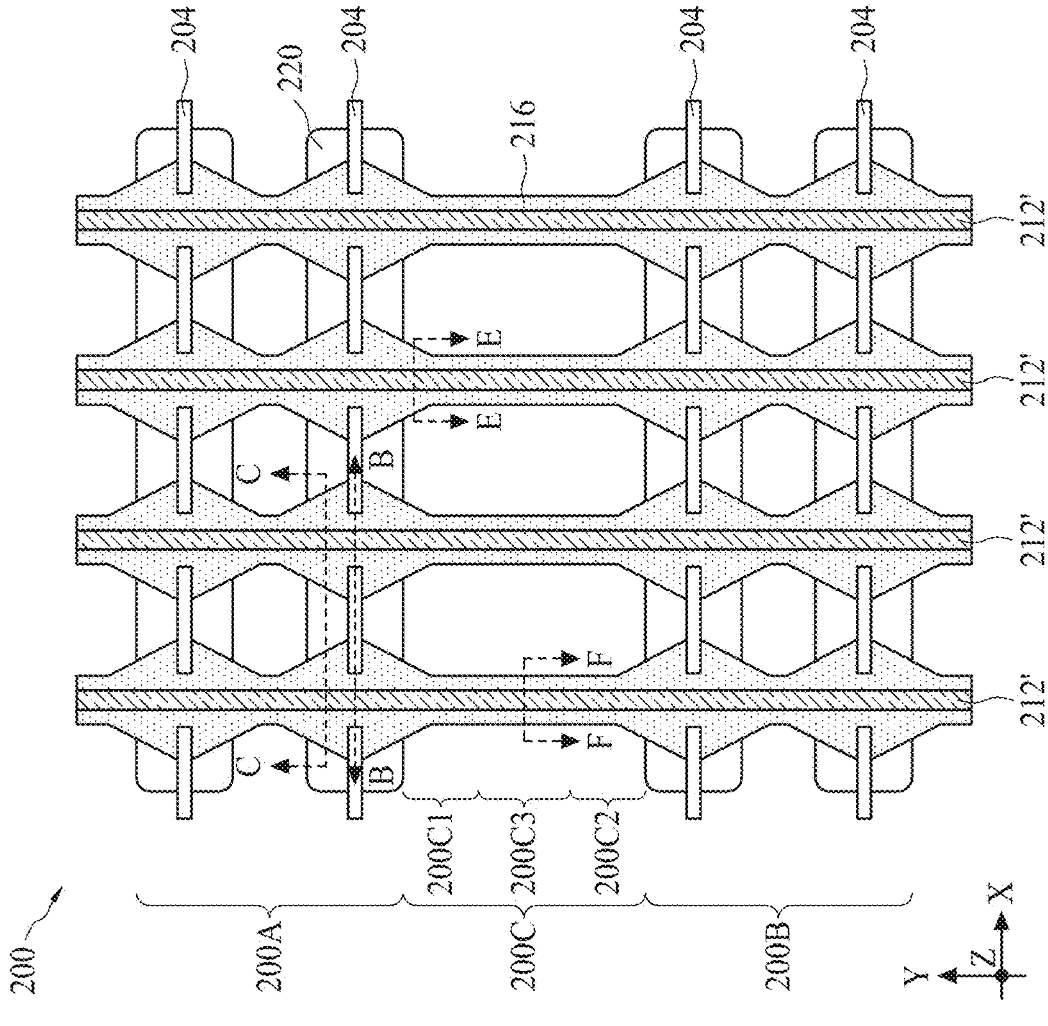
Figure 9F:
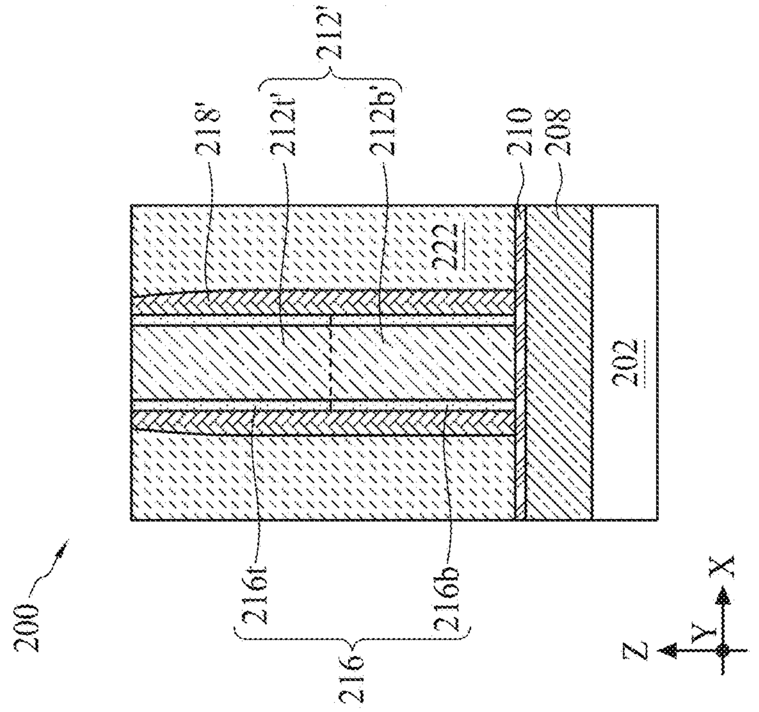
Figure 9C:
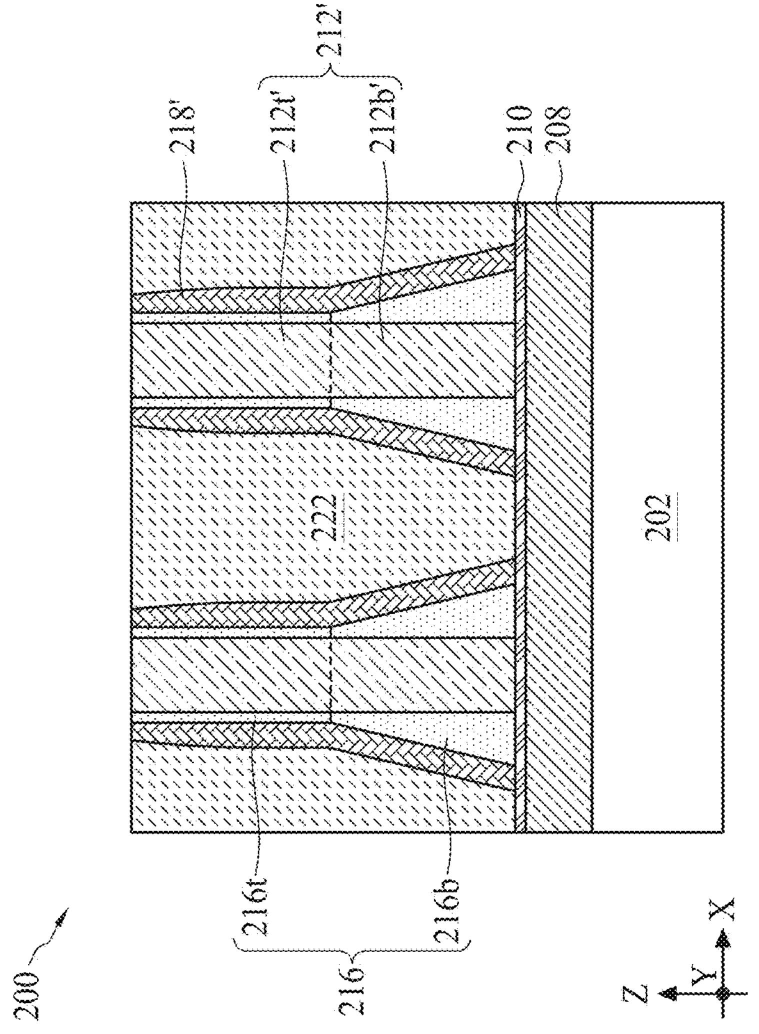

Referring now to FIGS. 1 and FIGS. 6A-6C, 6F, 7A-7C, and 7F, method 100 includes a block 112 where a second gate spacer 218' adjacent to the first gate spacer 216. FIG. 6A is a fragmentary top view of the workpiece 200, FIGS. 6B, 6C, and 6F depict fragmentary cross-sectional views of the workpiece 200 taken along line B-B, line C-C, and line F-F shown in FIG. 6A, respectively. A cross-sectional view of the workpiece 200 taken along line E-E shown in FIG. 6A is substantially similar to the cross-sectional view shown in FIG. 6C and is thus omitted for reason of simplicity. FIG. 7A is a fragmentary top view of the workpiece 200, FIGS. 7B, 7C, and 7F depict fragmentary cross-sectional views of the workpiece 200 taken along line B-B, line C-C, and line F-F shown in FIG. 7A, respectively. A cross-sectional view of the workpiece 200 taken along line E-E shown in FIG. 7A is substantially similar to the cross-sectional view shown in FIG. 7C and is thus omitted for reason of simplicity.

In an example process, with reference to FIGS. 6A-6C and 6F, in the present embodiments, a dielectric layer 218 is deposited as a blanket layer over the workpiece 200 by a suitable method, such as CVD, ALD, PVD, other suitable methods, or combinations thereof. The dielectric layer 218 may include SiN, SiCN, SiOC, SiON, SiOCN, $Al_2O_3$, $HfO_2$, a low-k dielectric material, other suitable materials, or combinations thereof. In the present embodiments, the dielectric layer 218 has a composition different from that of the first gate spacer 216. Subsequently, with reference to FIGS. 7A-7C and 7F, an etching process is performed to anisotropically removes portions of the dielectric layer 218 deposited over top surfaces of the patterned hard mask layer 214, the isolation features 208 and the fins 204, leaving behind portions along the sidewalls of the patterned hard mask layer 214 and the first gate spacer 216 as the second gate spacer 218'. It is noted that the second gate spacers 218' are omitted in FIG. 7A and subsequent top views.

Referring now to FIGS. 1 and FIGS. 8A-8C and 8F, method 100 includes a block 114 where source/drain features 220 are formed in the device regions 200A and 200B. The formation of the source/drain features 220 includes performing an etching process to form source/drain recesses in source/drain regions of the fins 204. The etching process also removes portions of the dummy dielectric layer 210 on the source/drain regions of the fins 204. Epitaxial source/drain features 220 are then formed in the source/drain recesses by using an epitaxial process, such as vapor phase epitaxy (VPE), ultrahigh vacuum chemical vapor deposition (UHV-CVD), molecular-beam epitaxy (MBE), and/or other suitable processes. The source/drain features 220 are therefore coupled to channel regions of the fins 204. Depending on the conductivity type of the to-be-formed transistor, the source/drain features 220 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Referring now to FIGS. 1 and FIGS. 9A-9C and 9F, method 100 includes a block 116 where a dielectric structure 222 is formed over the workpiece 200. In an example process, the formation of the dielectric structure 222 includes forming a contact etch stop layer (CESL) over the workpiece 200 and an interlayer dielectric layer (ILD) layer over the CESL. The CESL may include silicon nitride, silicon oxynitride, and/or other materials known and may be formed by ALD, plasma-enhanced chemical vapor deposition (PECVD) process and/or other suitable deposition or oxidation processes. The ILD layer is deposited by a PECVD process or other suitable deposition technique over the workpiece 200 after the deposition of the CESL. The ILD layer may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A planarization process may be then performed to remove excess materials over the dummy gate electrodes 212' to expose top surfaces of the dummy gate electrodes 212'.

Figure 10A:
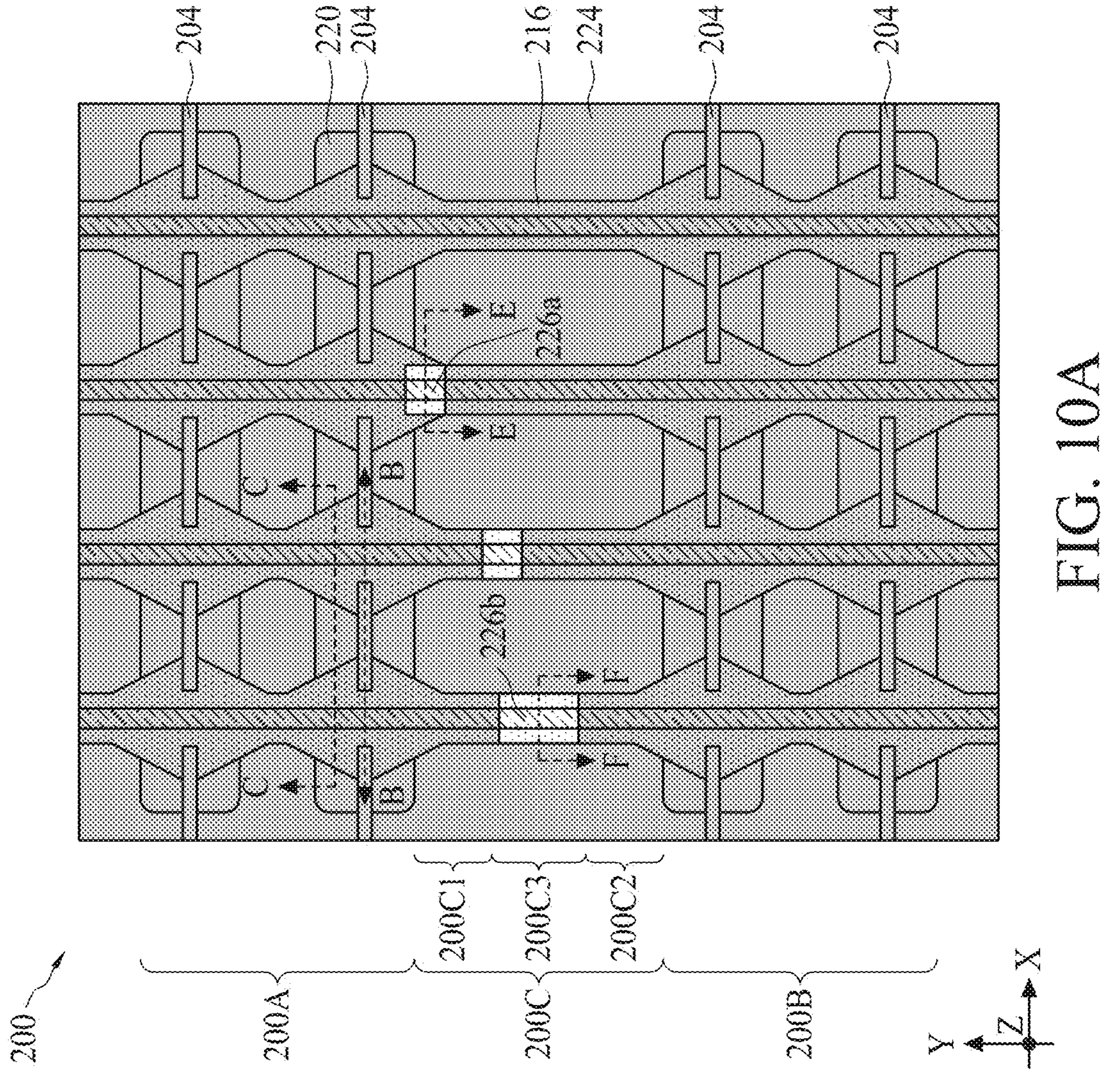
Figure 10E:
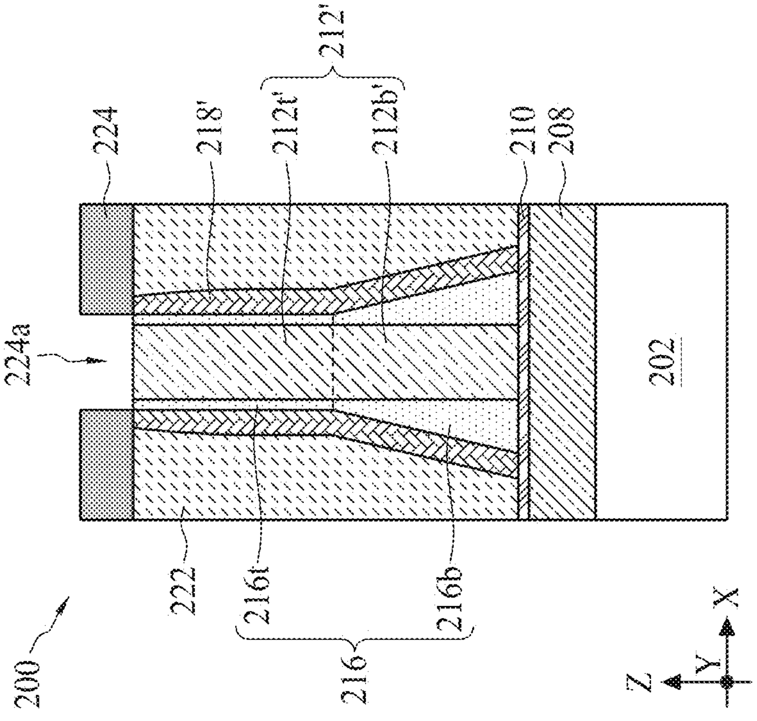
FIGS. 10E, 11E and 12E depict fragmentary cross-sectional views of the workpiece taken along line E-E (shown in FIG. 4A) during various fabrication stages in the method of FIG. 1, according to various aspects of the present disclosure.
Figure 10F:
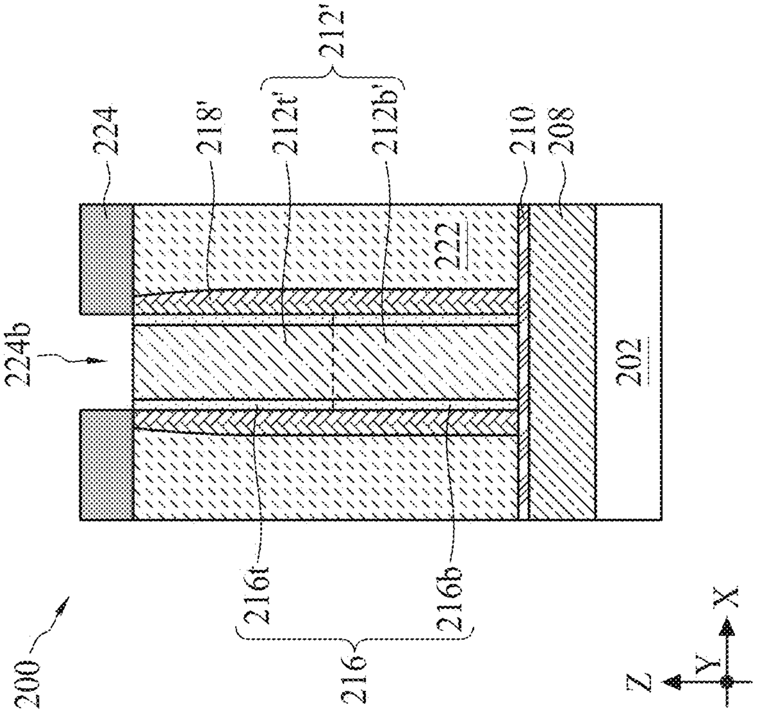
Figure 11A:
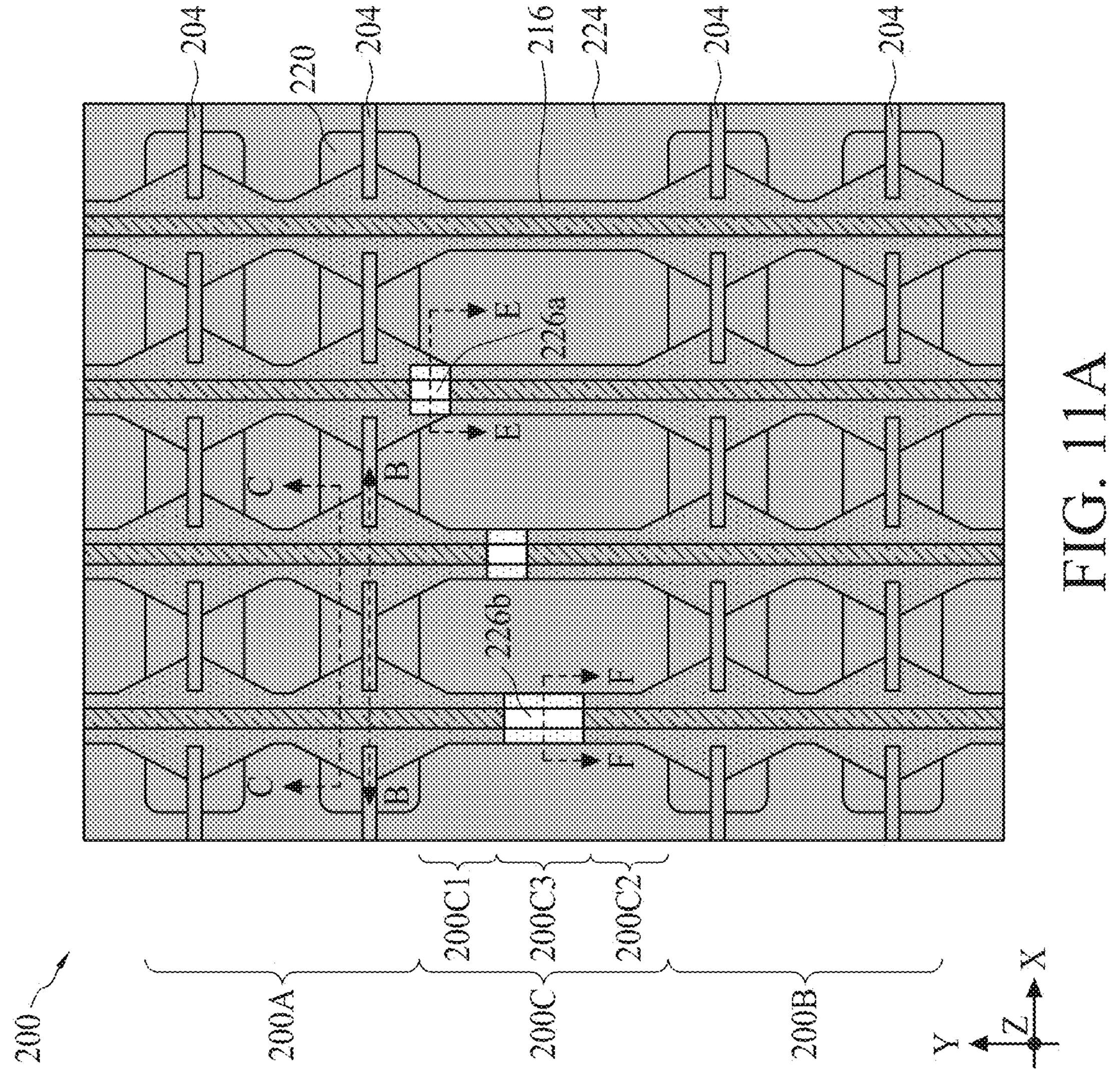
Figure 11E:
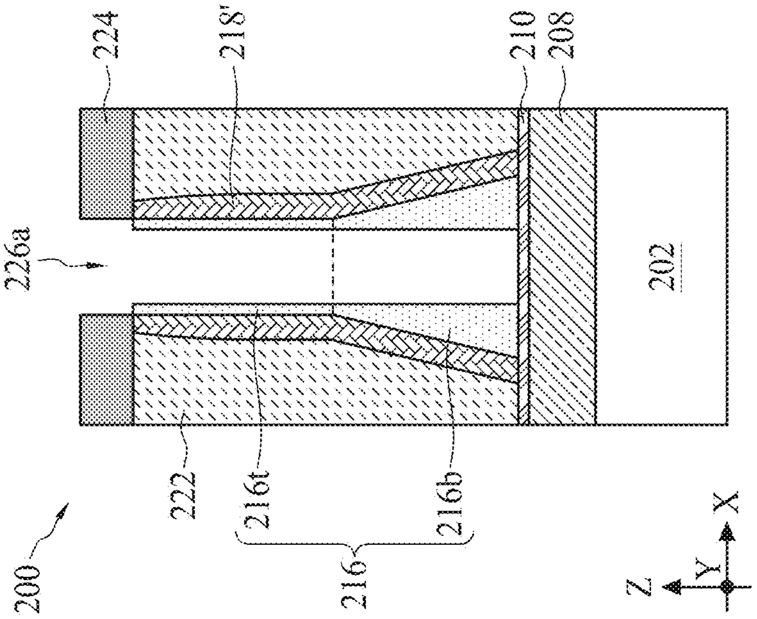
Figure 11F:
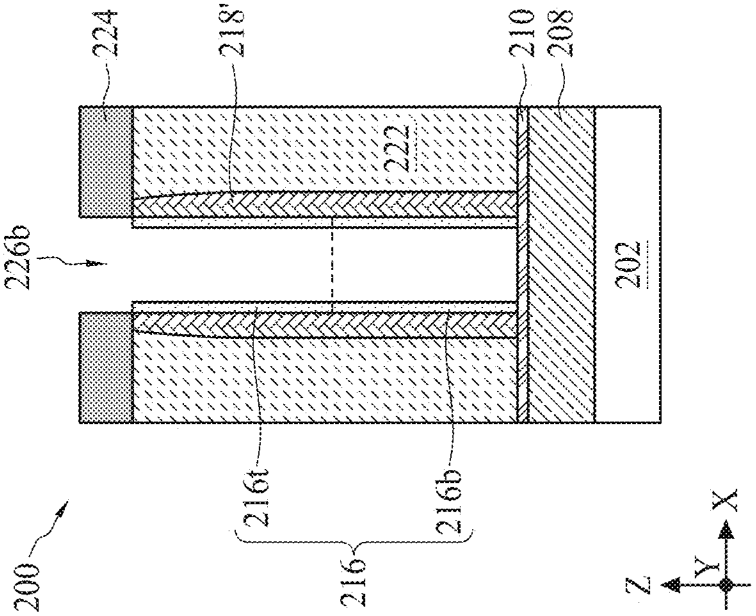
Figure 12A:
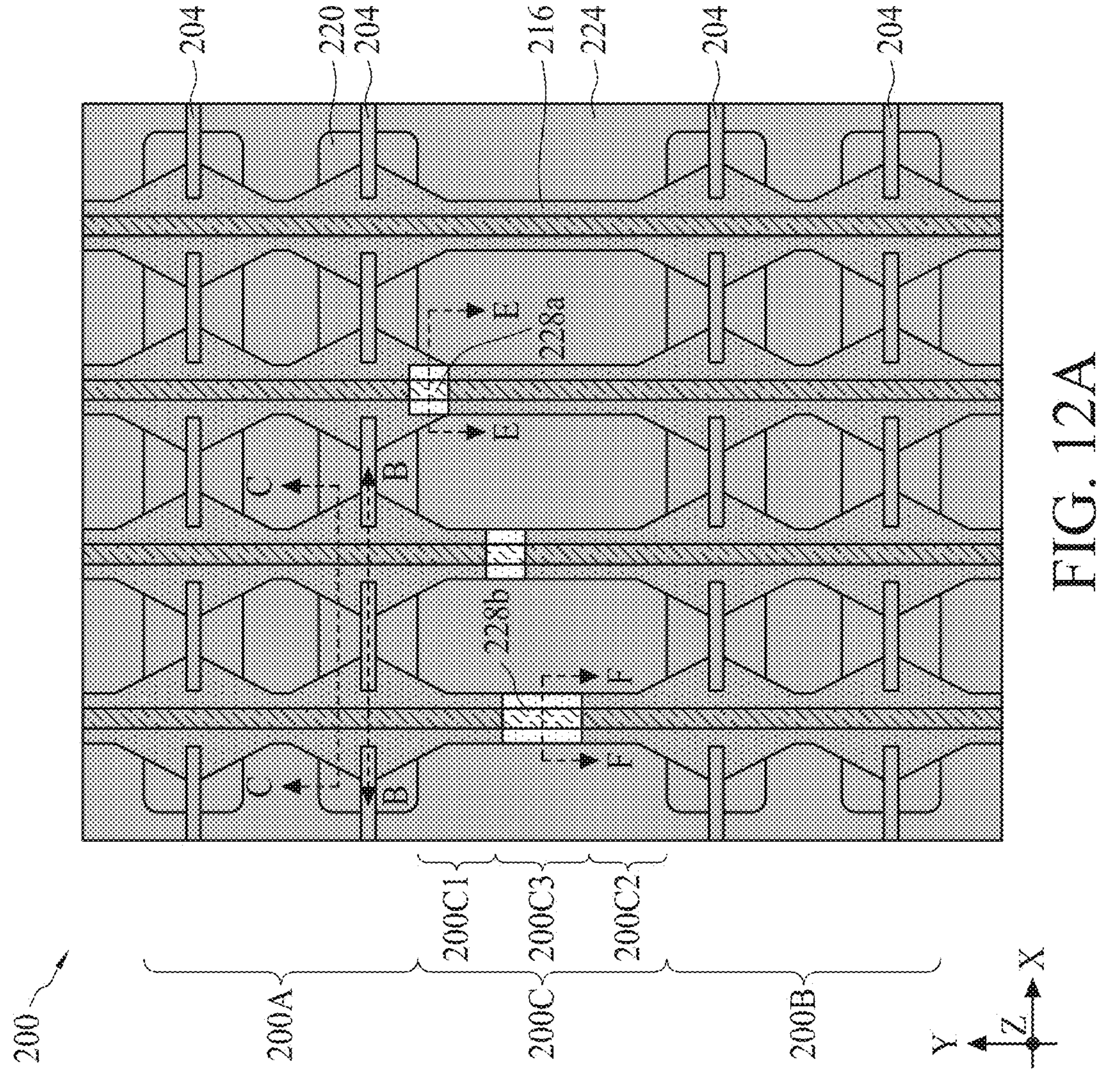
Figure 12E:
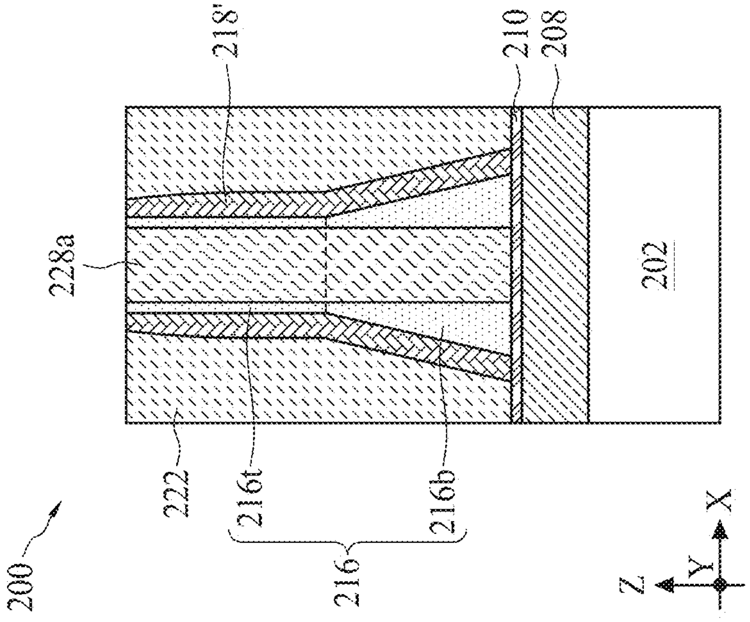
Figure 12F:
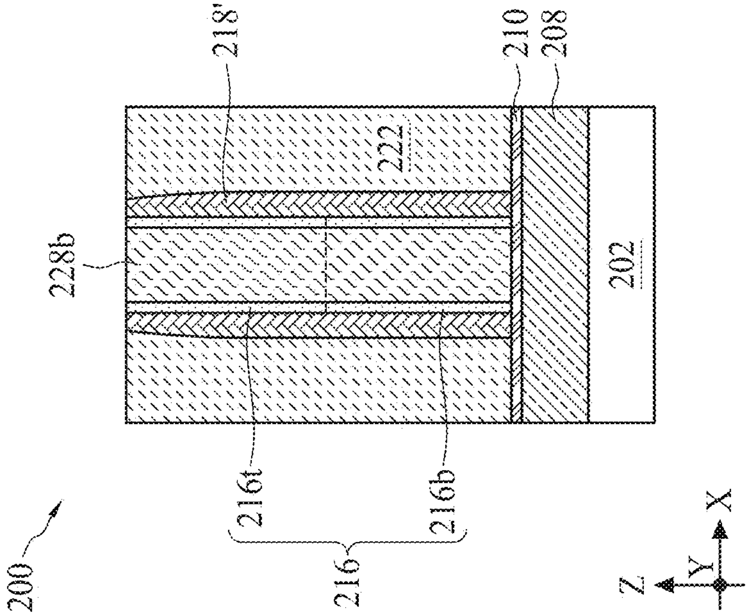

Referring now to FIGS. 1 and FIGS. 10A, 10E, 10F, 11A, 11E, 11F, 12A, 12E, and 12F, method 100 includes a block 118 where gate isolation structures are formed in the connector region 200C to cut the dummy gate electrodes 212' into pieces. FIG. 10A is a fragmentary top view of the workpiece 200, FIGS. 10E and 10F depict fragmentary cross-sectional views of the workpiece 200 taken along line E-E and line F-F shown in FIG. 10A, respectively. FIG. 11A is a fragmentary top view of the workpiece 200, FIGS. 11E and 11F depict fragmentary cross-sectional views of the workpiece 200 taken along line E-E and line F-F shown in FIG. 11A, respectively. FIG. 12A is a fragmentary top view of the workpiece 200, FIGS. 12E and 12F depict fragmentary cross-sectional views of the workpiece 200 taken along line E-E and line F-F shown in FIG. 12A, respectively.

With reference to FIGS. 10A, 10E, and 10F, a patterned mask film 224 is formed over the workpiece 200. In some embodiments, the patterned mask film 224 may include photoresist, aluminum oxide, silicon oxide, silicon nitride, silicon carbonitride, silicon oxycarbide, silicon oxynitride, silicon oxycarbonitride, other suitable materials, or combinations thereof, and may be formed by CVD, ALD, PVD, other suitable methods, or combinations thereof. The patterned mask film 224 includes openings (e.g., openings 224*a* and 224*b*) exposing portions of the dummy gate electrode 212' in the connector region 200C to facilitate the formation of gate isolation structures. In this depicted embodiment, the opening 224*a* exposes a portion of one dummy gate electrode 212' in the connector region 200C1, and the opening 224*b* exposes a different portion of another dummy gate electrode 212' in the connector region 200C2.

With reference to FIGS. 11A, 11E, and 11F, while using the patterned mask film 224 as an etch mask, an etching process is performed to the workpiece 200 to selectively remove portions of the dummy gate electrodes 212' exposed by the openings (e.g., openings 224*a* and 224*b*) to form trenches (e.g., a first trench 226*a* and a second trench 226*b*). Each of the trenches separates a corresponding dummy gate electrode 212' into pieces. In some implementations, the etching process may be a dry etching process.

With reference to FIGS. 12A, 12E, and 12F, a dielectric layer is deposited over the workpiece 200, including in the trenches (e.g., first trench 226*a* and second trench 226*b*). A planarization process may be then performed to remove excess portions of the dielectric layer outside of the trenches, thereby forming gate isolation structures (e.g., gate isolation structures 228*a* and 228*b*) in the trenches (e.g., first trench 226*a* and second trench 226*b*). The dielectric layer may be deposited by CVD, ALD, other suitable methods, or combinations thereof. In some embodiments, the gate isolation structures (e.g., gate isolation structures 228*a* and 228*b*) may include a nitrogen-containing dielectric material (e.g., silicon nitride (SiN), silicon oxycarbonitride (SiOCN), silicon oxynitride (SiON)). The combination of the first gate spacer 216 and the gate isolation structures would provide satisfactory isolation between different pieces of a gate structure. In some other alternative embodiments, the first trench 226*a* and second trench 226*b* may be vertically extended along the −Z direction by performing another etching process to selectively remove portions of the dummy dielectric layer 210 exposed by the first trench 226*a* and second trench 226*b*. The gate isolation structures (e.g., gate isolation structures 228*a* and 228*b*) may extend through the dummy dielectric layer 210 and be in direct contact with or further extend into the isolation features 208.

Figure 13A:
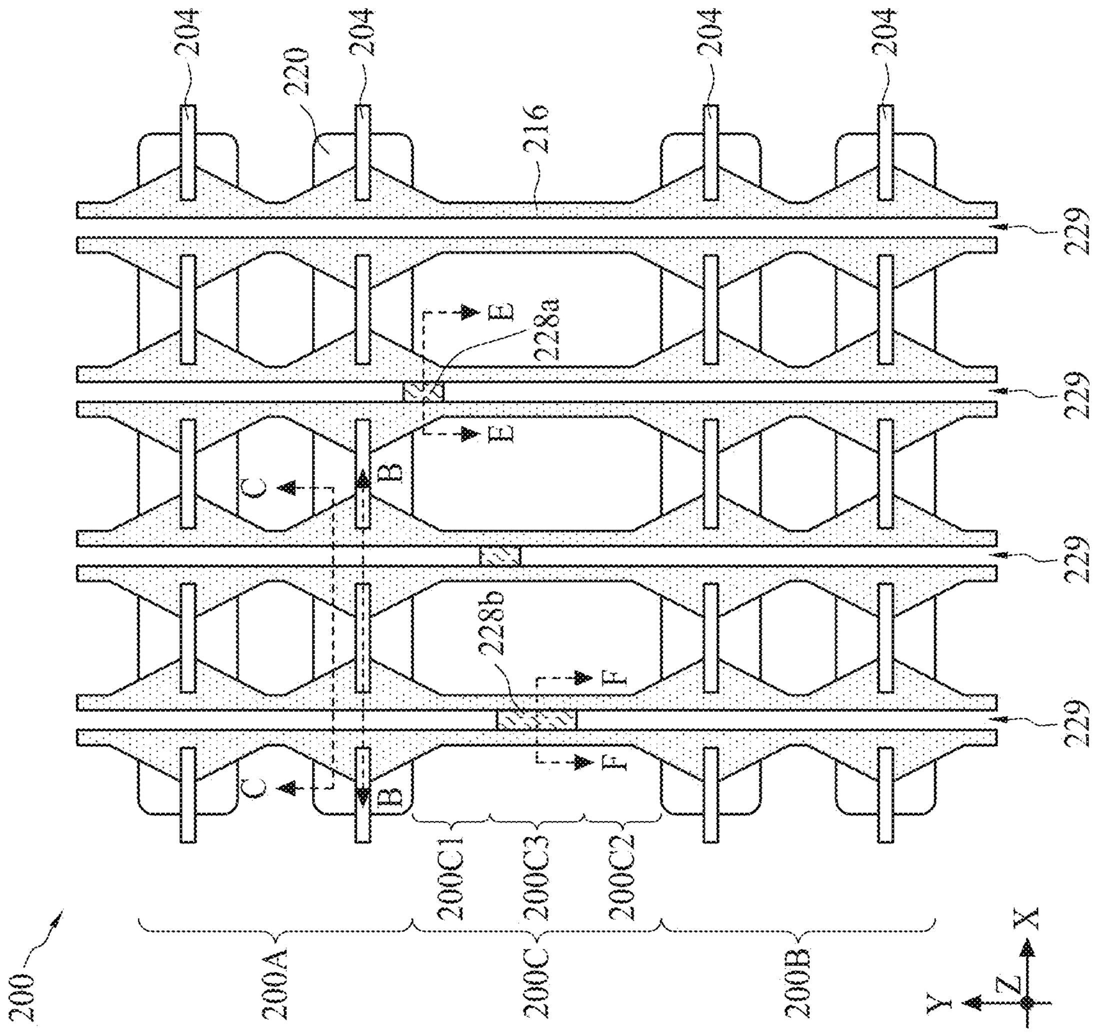
Figure 13C:
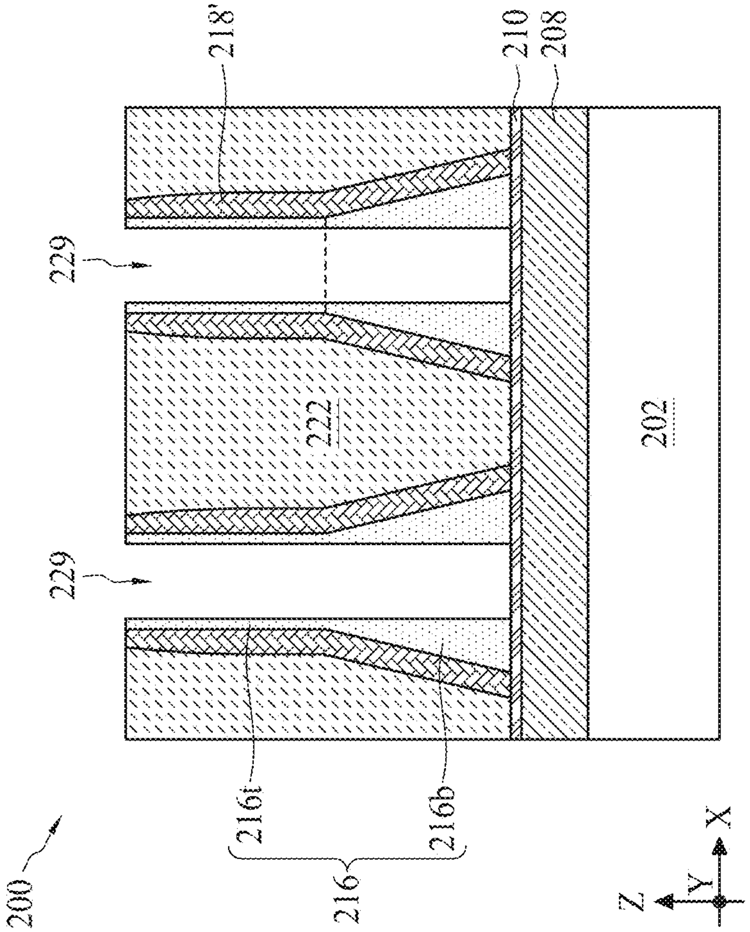
Figure 13B:
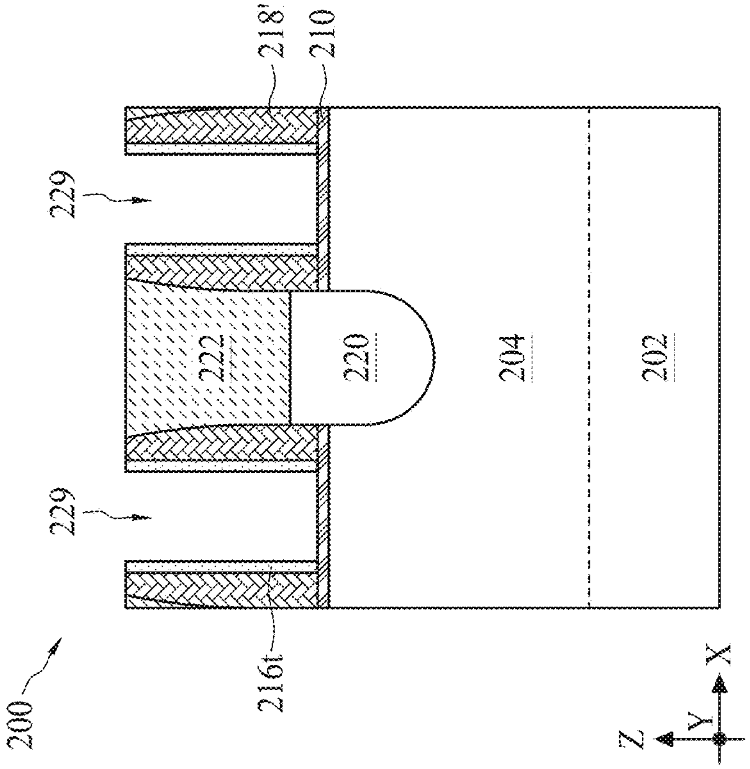

Referring now to FIGS. 1 and FIGS. 13A-13C, method 100 includes a block 120 where remaining pieces of the dummy gate electrodes 212' are selectively removed to form gate trenches 229. FIG. 13A is a fragmentary top view of the workpiece 200, FIGS. 13B and 13C depict fragmentary cross-sectional views of the workpiece 200 taken along line B-B and line C-C shown in FIG. 13A, respectively. With the exposure of the top surfaces of the dummy gate electrodes 212', a first etching process is performed to selectively remove the remaining pieces of the dummy gate electrodes 212' not replaced by the gate isolation structures (e.g., gate isolation structures 228*a* and 228*b*) to form gate trenches 229.

Figure 14A:
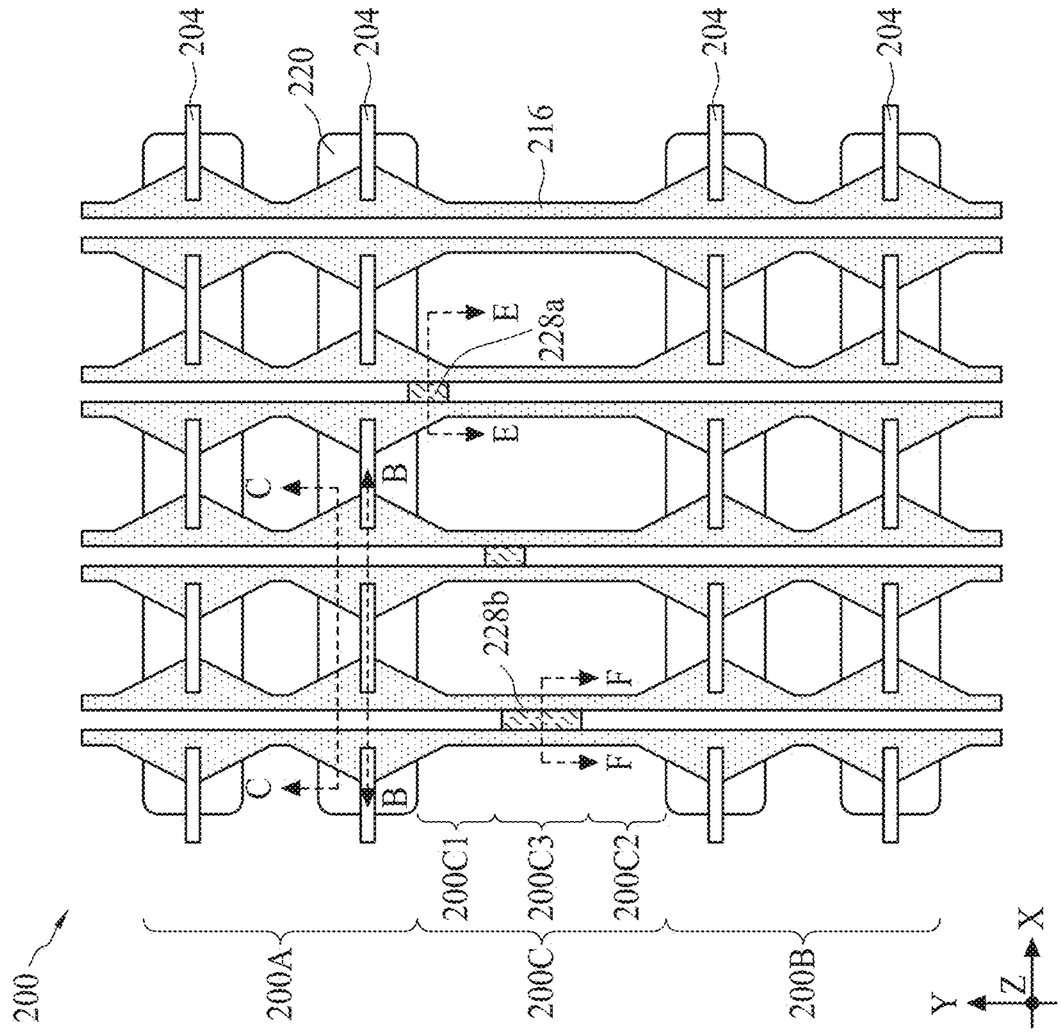
Figure 14C:
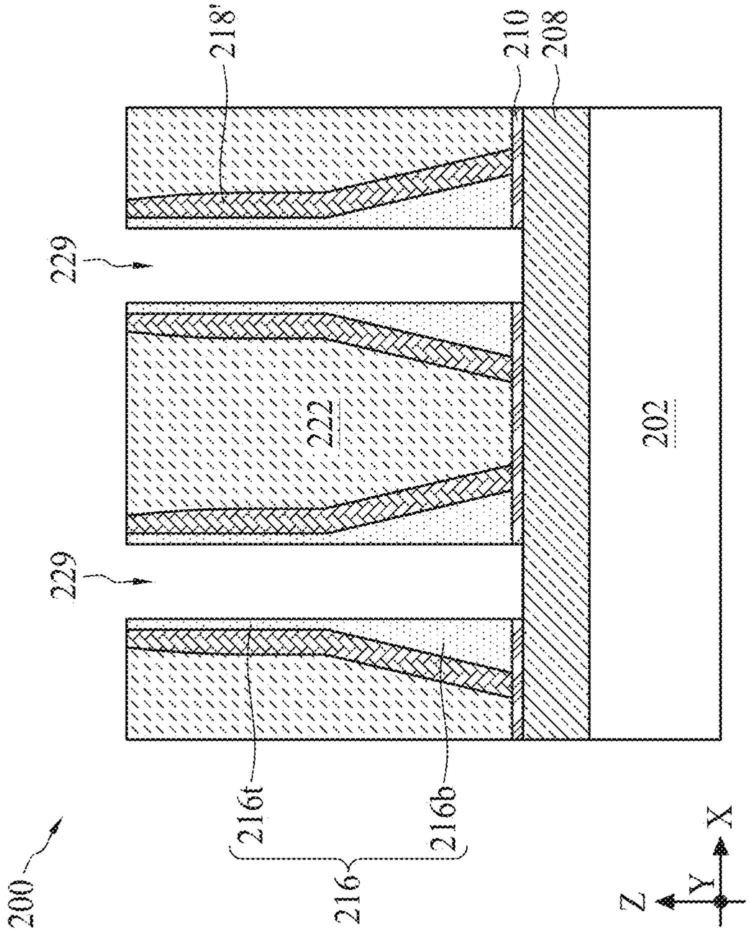
Figure 14B:
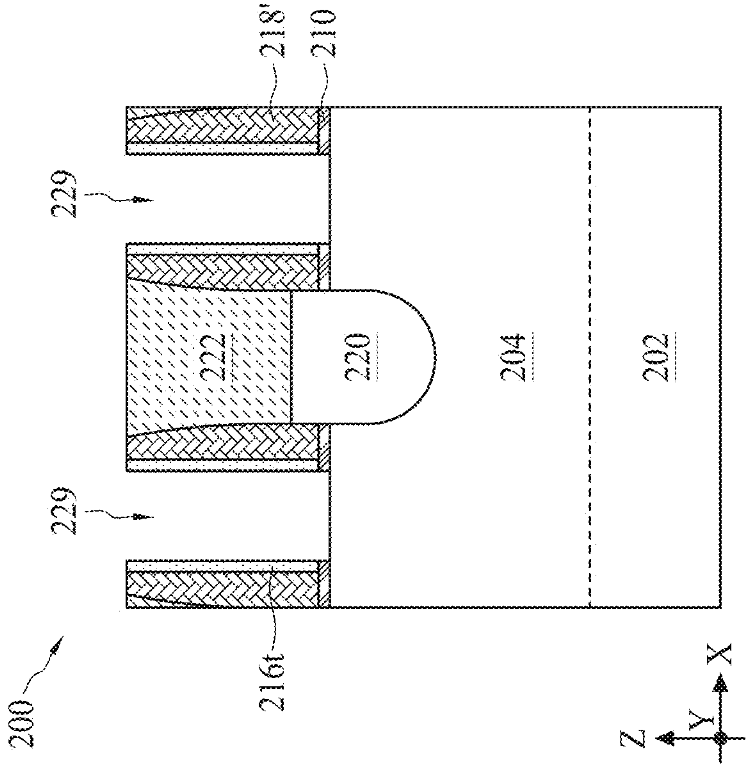
Figure 14C:
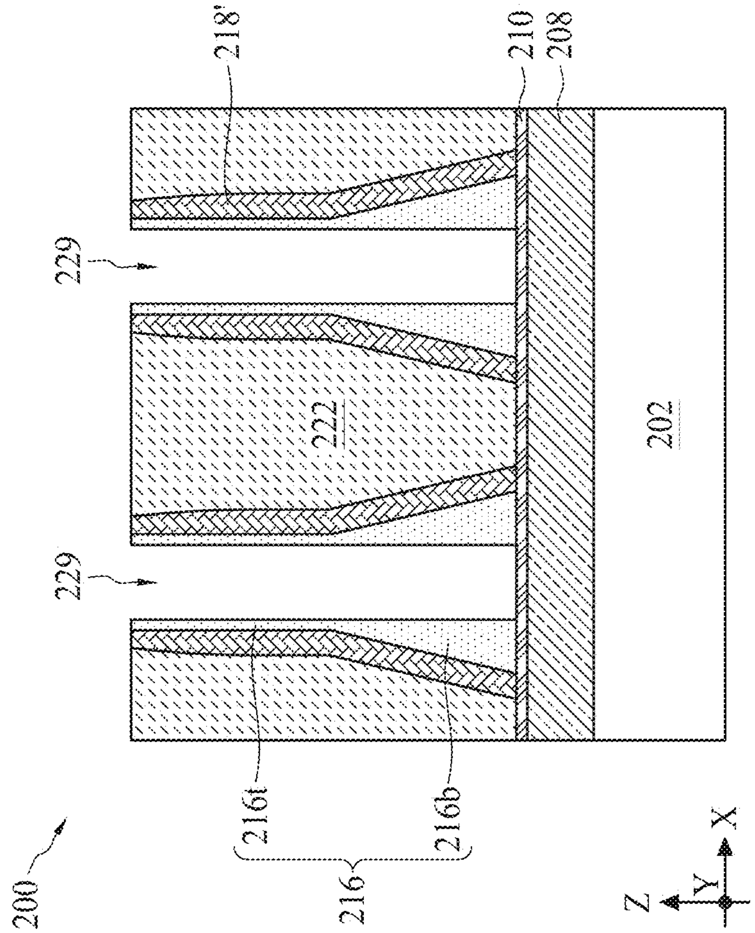
Figure 14B:
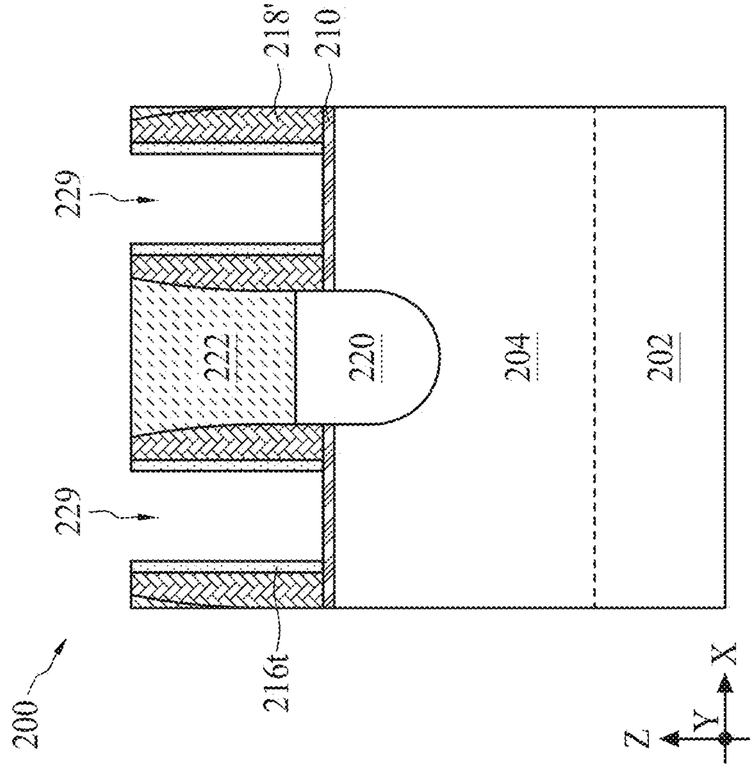

Referring now to FIGS. 1 and FIGS. 14A, 14B, 14C and FIGS. 14B' and 14C', method 100 includes a block 122 where portions of the dummy dielectric layer 210 exposed by the gate trenches 229 are selectively removed in a core device region (not shown), but remains over an I/O device region (not shown). More specifically, for embodiments in which the workpiece 200 will be fabricated to be a portion of a core device, FIG. 14A is a fragmentary top view of the workpiece 200 in the core device region, FIGS. 14B and 14C depict fragmentary cross-sectional views of the workpiece 200 taken along line B-B and line C-C shown in FIG. 14A, respectively. The formation of the gate trenches 229 exposes portions of the dummy dielectric layer 210. A second etching process may be performed to remove the exposed portions of the dummy dielectric layer 210 to vertically extend the gate trenches 229. In an embodiment, the second etching process selectively etches the dummy dielectric layer 210 without substantially etching the first gate spacers 216. After the performing of the second etching process, the gate trenches 229 expose the top surface 204*t* of the fins 204 and the top surface of the isolation features 208. For embodiments in which the workpiece 200 will be fabricated to form a portion of an I/O device, as represented by FIGS. 14B' and 14C', which are fragmentary cross-sectional views of the workpiece 200 of the I/O device, the portions of the dummy dielectric layer 210 exposed by the gate trenches 229 in the I/O device region will remain.

Figure 15A:
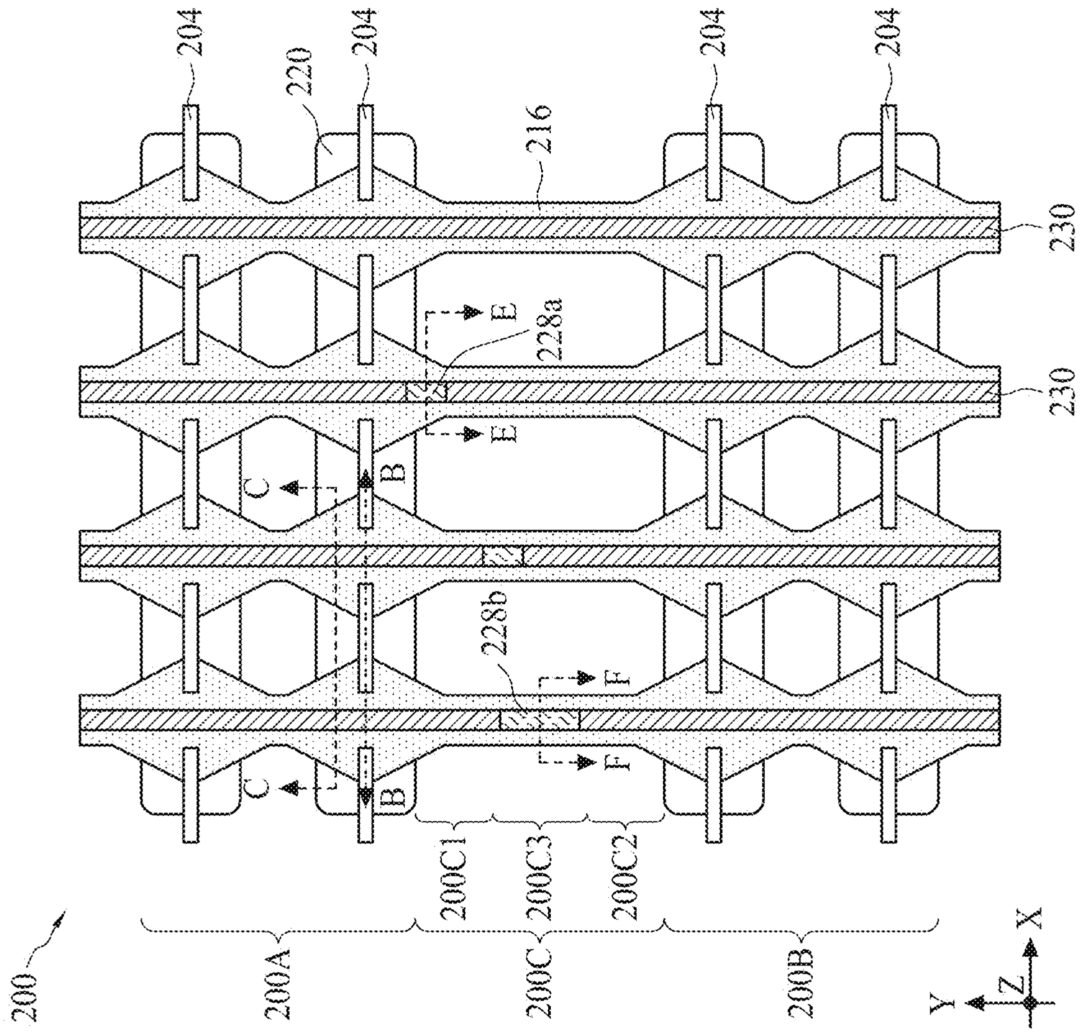
Figure 15C:
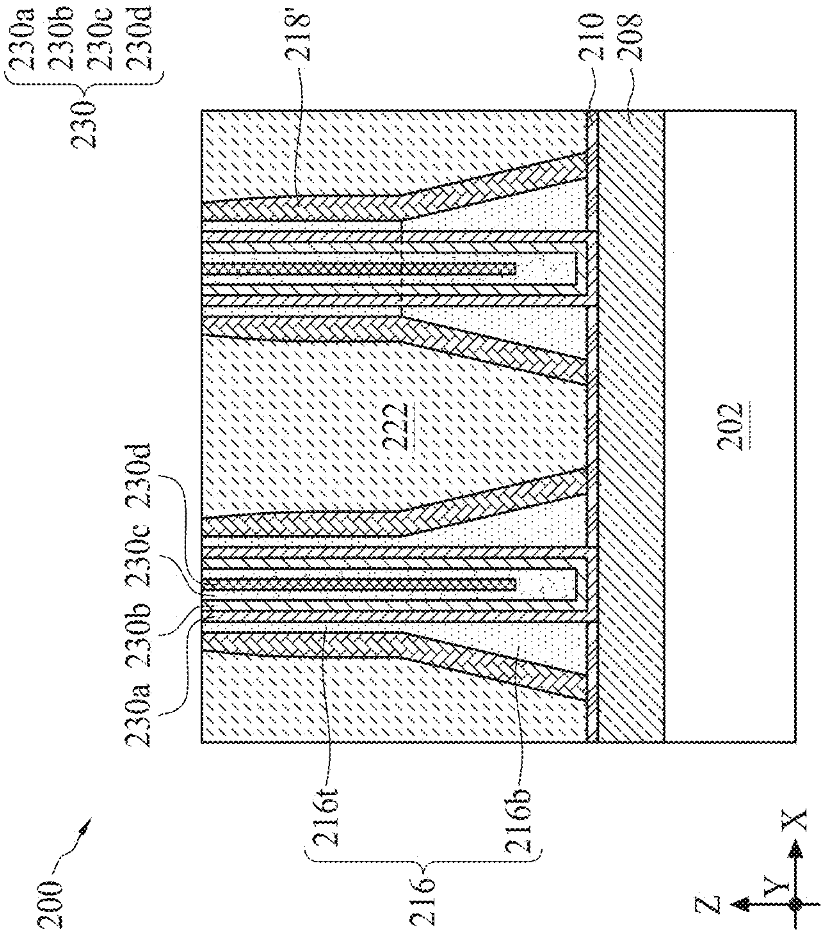
Figure 15B:
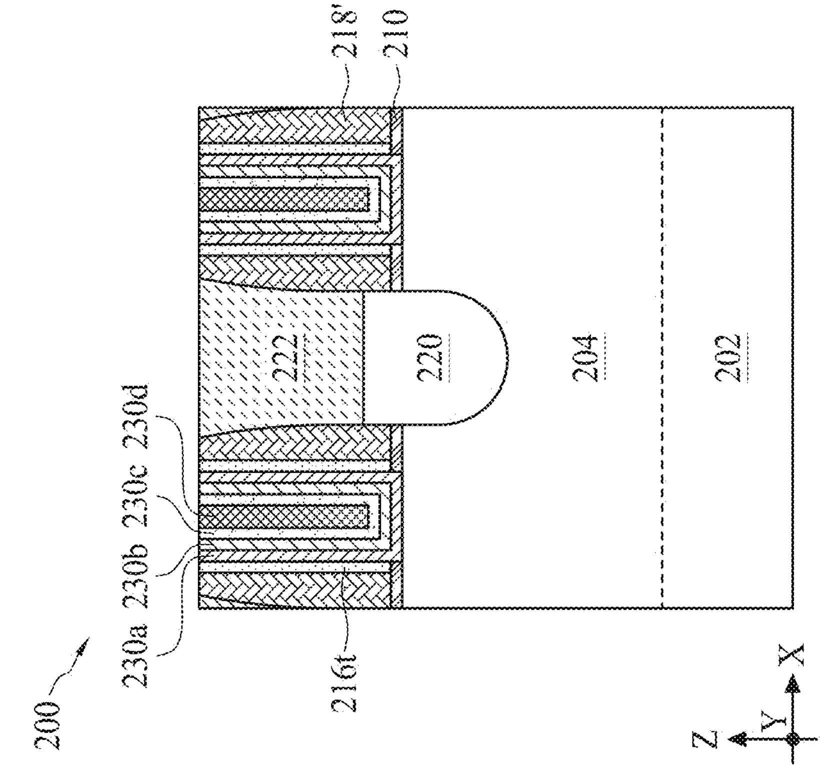
Figure 15C:
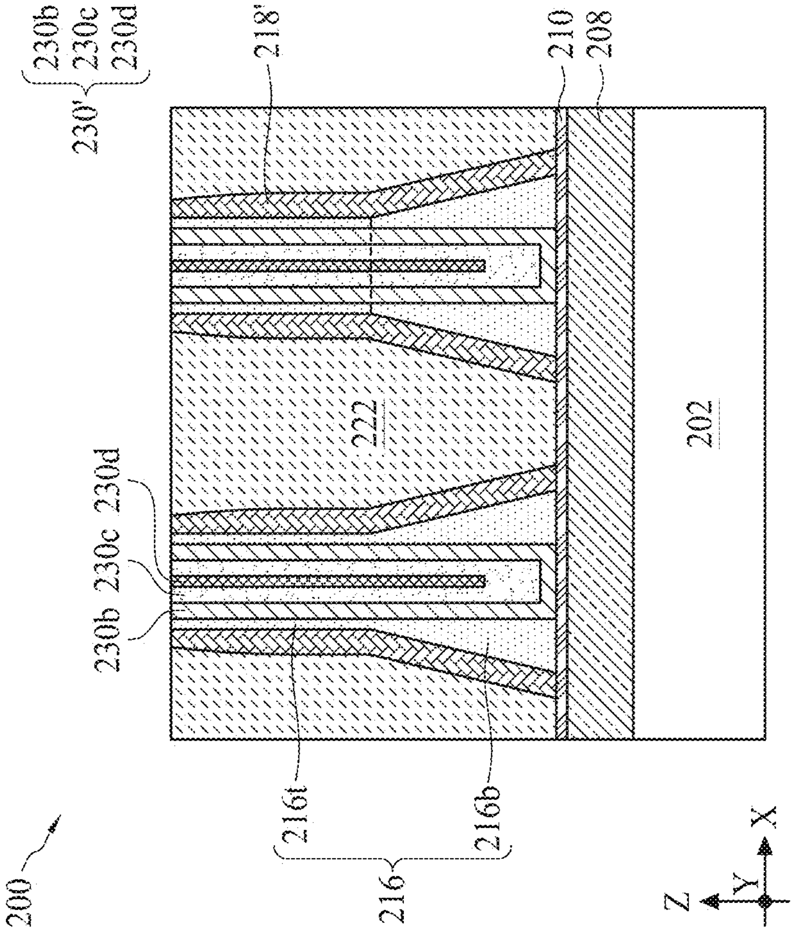
Figure 15B:
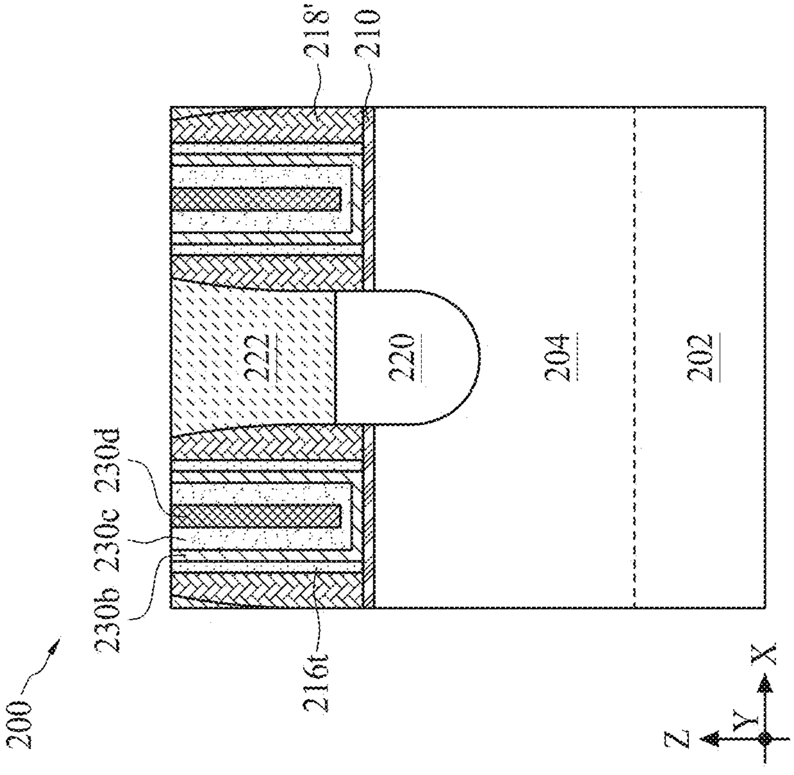
Figure 16A:
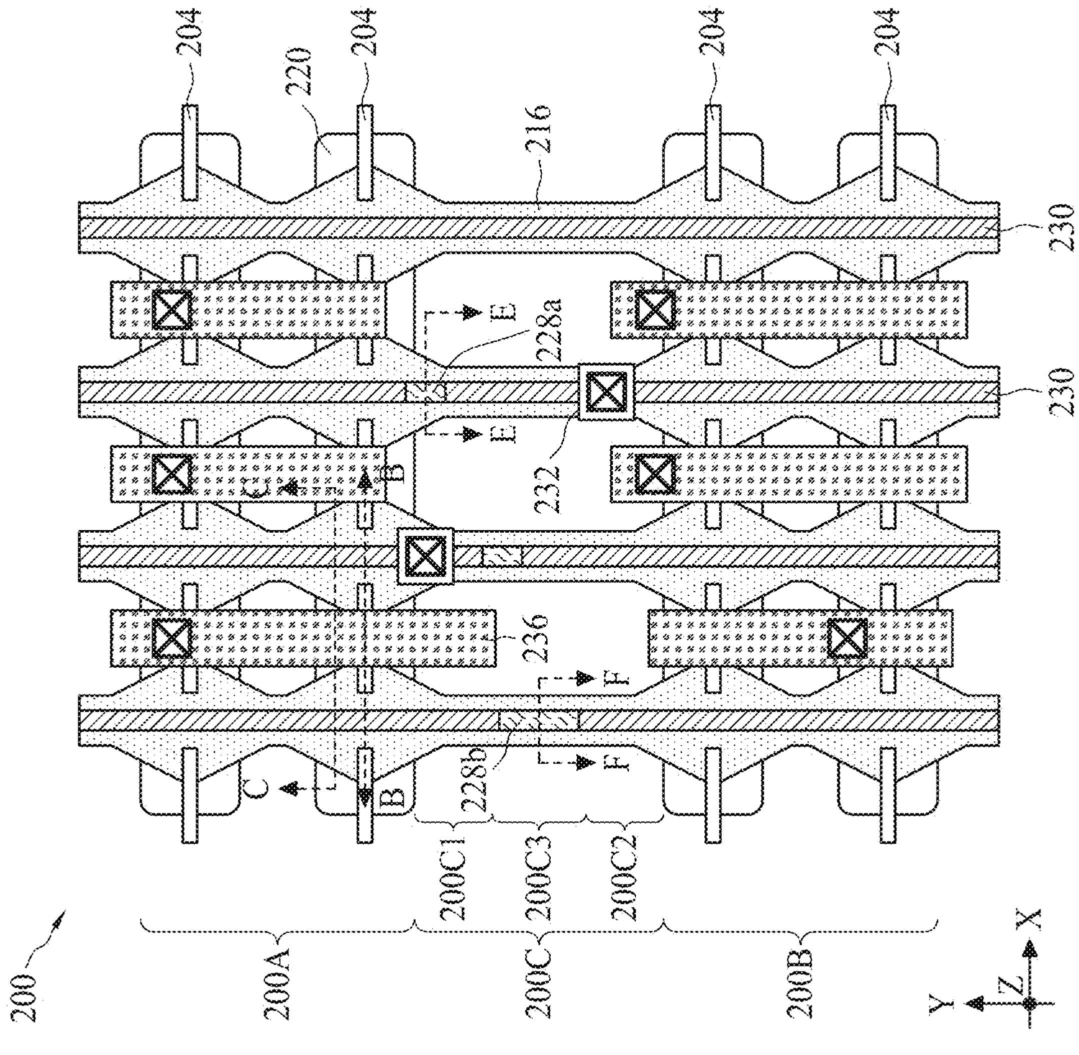
Figure 16C:
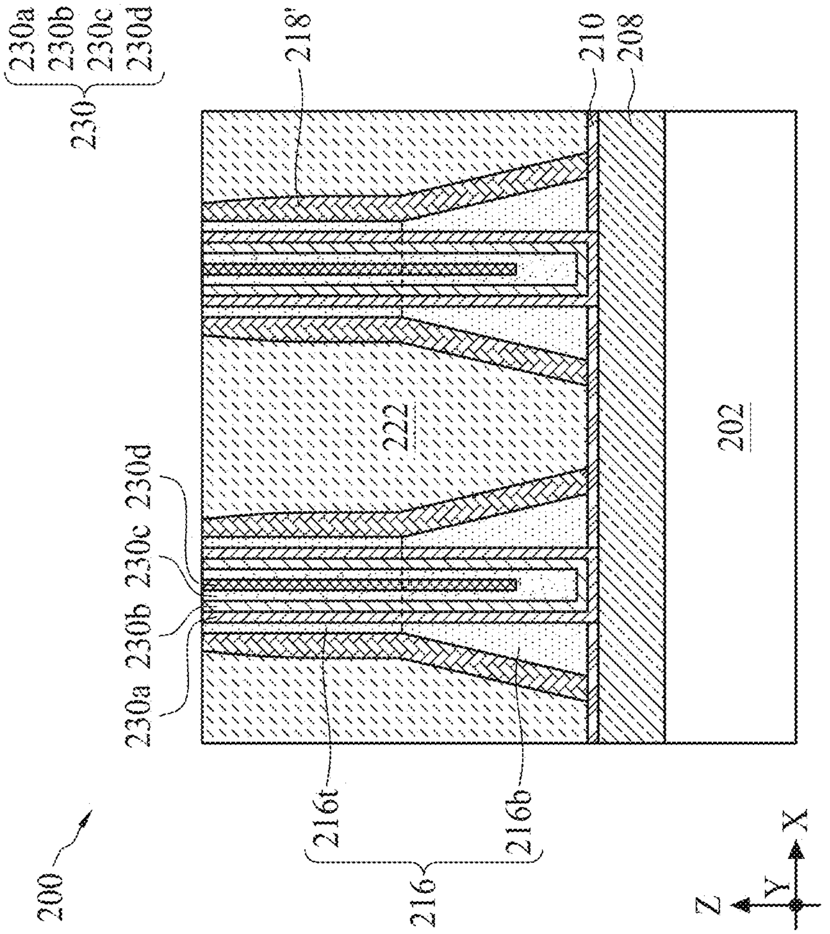
Figure 16B:
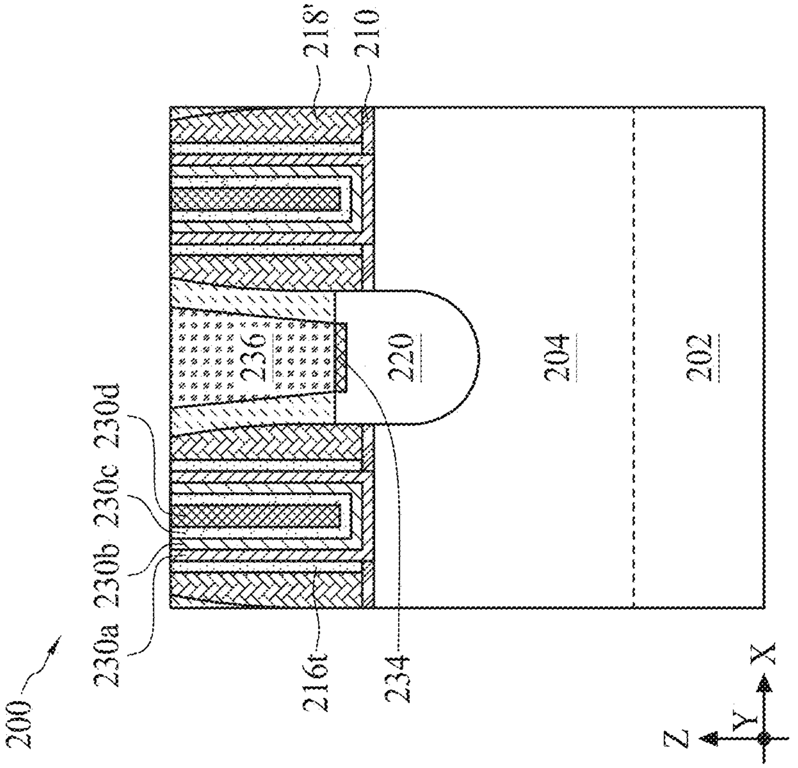
Figure 17A:
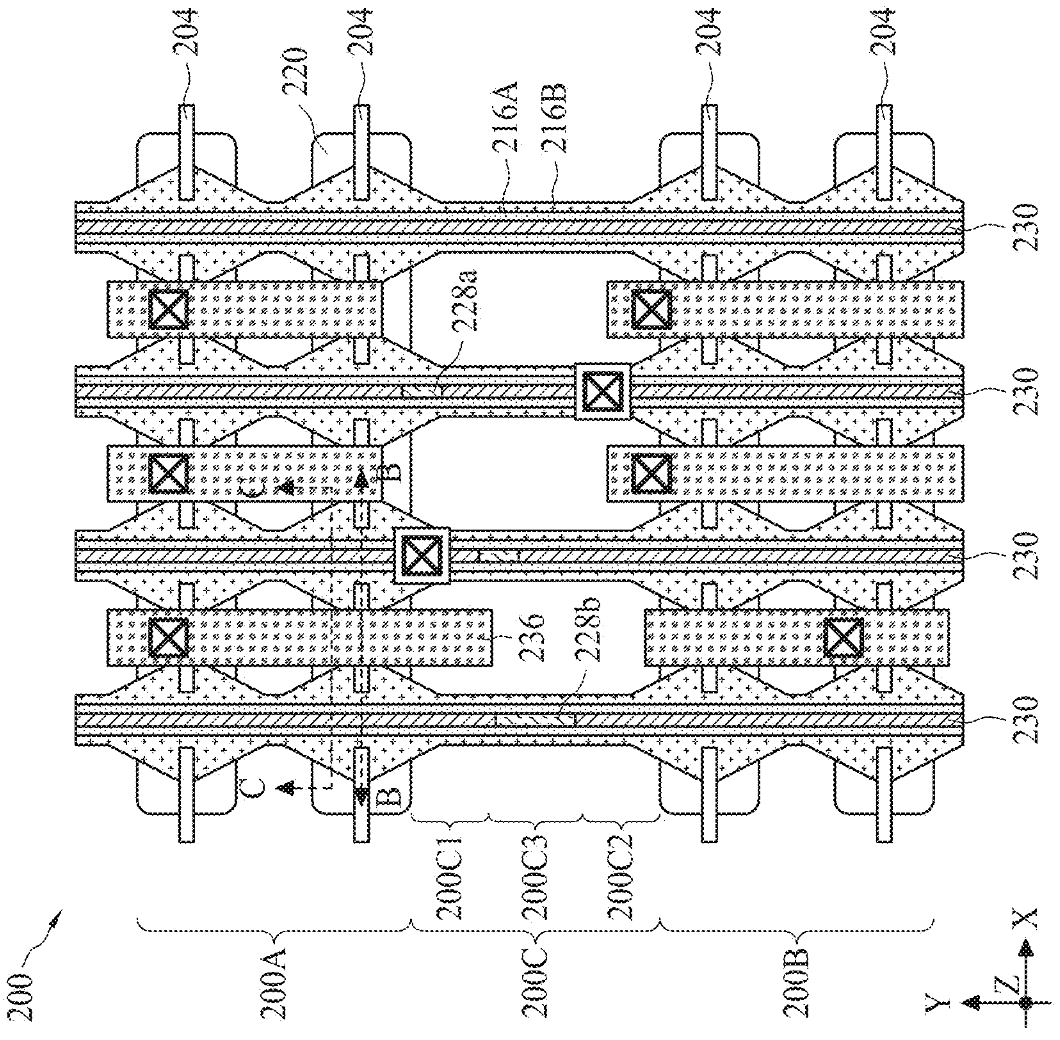
Figure 17B:
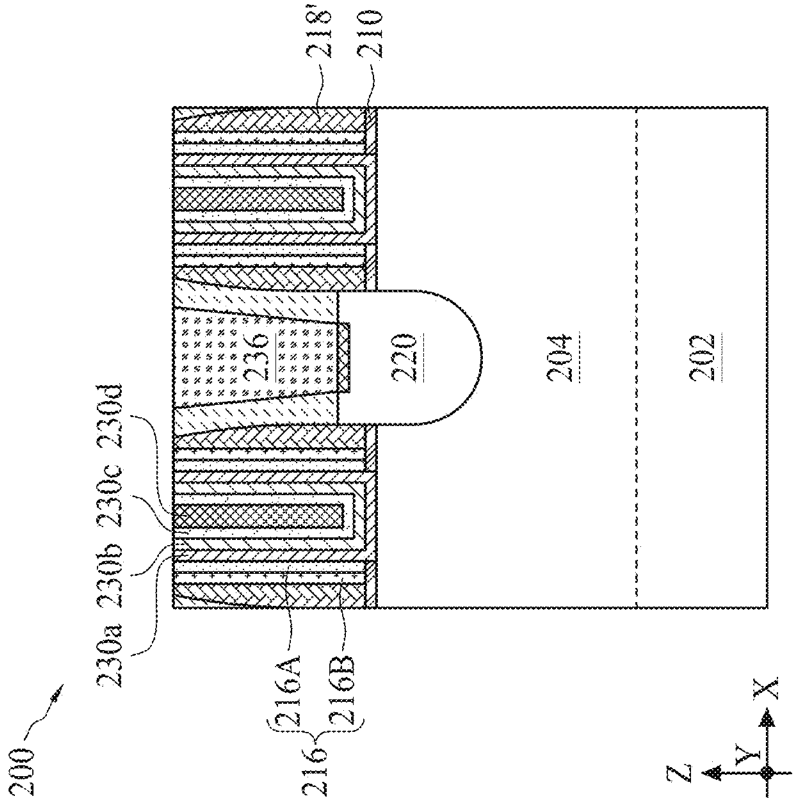
Figure 17C:
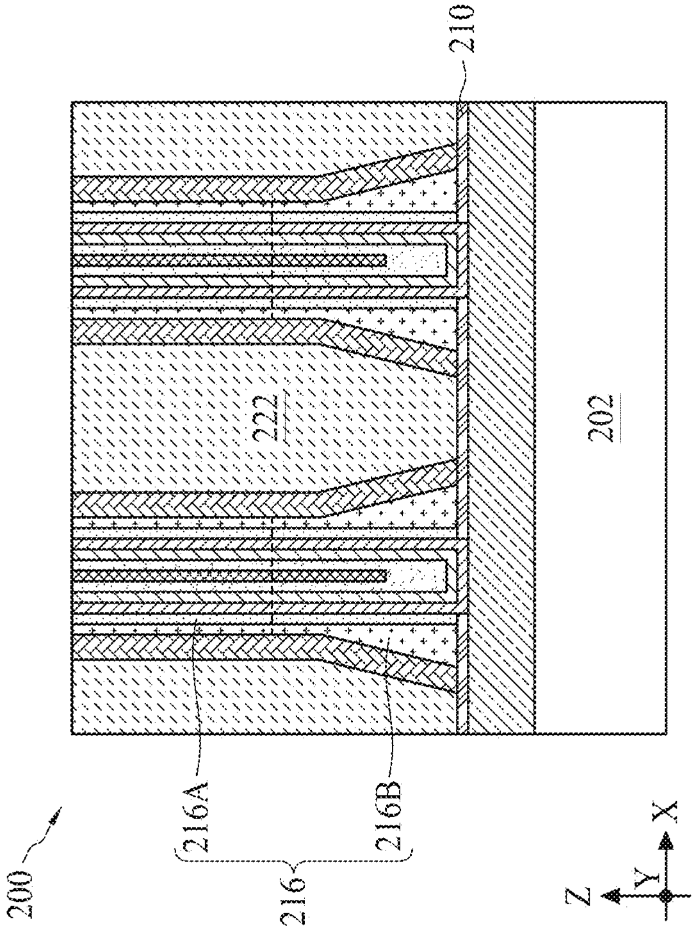

Referring now to FIGS. 1 and FIGS. 15A, 15B, 15C, 15B' and 15C', method 100 includes a block 124 where gate structures 230 are formed in the gate trenches 229 in the core device region and gate structures 230' are formed in the gate trenches 229 in the I/O device region. FIG. 15A is a fragmentary top view of the workpiece 200 in the core device region, FIGS. 15B and 15C depict fragmentary cross-sectional views of the workpiece 200 taken along line B-B and line C-C shown in FIG. 15A, respectively. FIGS. 15B' and 15C' depict fragmentary cross-sectional views of the workpiece 200 in the I/O device region taken along line B-B and line C-C shown in FIG. 15A, respectively. Each of the gate structures 230 includes a gate dielectric layer and a gate electrode layer over the gate dielectric layer. In some embodiments, the gate dielectric layer includes an interfacial layer and a high-k dielectric layer 230*a* over the interfacial layer. Here, a high-k dielectric layer 230*a* refers to a dielectric material having a dielectric constant greater than that of silicon dioxide, which is about 3.9. In some embodiments, the interfacial layer includes silicon oxide and may be formed by a thermal oxidization process. The high-k dielectric layer 230*a* is then deposited over the interfacial layer using ALD, CVD, and/or other suitable methods. The high-k dielectric layer 230*a* may include hafnium oxide. Alternatively, the high-k dielectric layer 230*a* may include other high-k dielectrics, such as titanium oxide, hafnium zirconium oxide, tantalum oxide, hafnium silicon oxide, zirconium silicon oxide, lanthanum oxide, aluminum oxide, yttrium oxide, SrTiO3, BaTiO3, BaZrO, hafnium lanthanum oxide, lanthanum silicon oxide, aluminum silicon oxide, hafnium tantalum oxide, hafnium titanium oxide, (Ba,Sr) TiO3 (BST), silicon nitride, silicon oxynitride, combinations thereof, or other suitable material.

The gate electrode layer is then deposited over the high-k dielectric layer 230*a* using ALD, PVD, CVD, e-beam evaporation, or other suitable methods. The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. In an embodiment, the gate electrode layer includes a first work function metal layer 230*b* formed on the high-k dielectric layer 230*a*, a second work function metal layer 230*c* formed on the first work function metal layer 230*b*, and a low-resistance metal layer 230*d* formed on the second work function metal layer 230*c*. By way of example, the first and second work function metal layers 230*b*-230*c* may include titanium nitride, titanium aluminum, titanium aluminum nitride, tantalum nitride, tantalum aluminum, tantalum aluminum nitride, tantalum aluminum carbide, tantalum carbonitride, and the metal layer 230*d* may include aluminum, tungsten, nickel, titanium, ruthenium, cobalt, platinum, copper, other refractory metals, or other suitable metal materials or a combination thereof. In the illustrated embodiment represented by FIG. 15A, some of the gate structures 230 are cut into segments or pieces by the gate isolation structures (e.g., gate isolation structures 228*a*-228*b*). The gate structures 230' in the I/O device region is similar to the gate structure 230 in the core device region, and one of the differences includes that, the gate structure 230' is free of the high-k dielectric layer 230*a* and is over and in direct contact with the dummy dielectric layer 210, as represented by FIGS. 15B' and 15C'.

Referring now to FIGS. 1 and FIGS. 16A-16C, method 100 includes a block 126 where further processes are performed. Such further processes may include forming device-level contacts, such as gate contacts 232 formed over the segments of gate structures 230, silicide layers 234 formed on the source/drain features 220, source/drain contacts 236 formed over source/drain features 220. Such further processes may also include forming a multi-layer interconnect (MLI) structure (not depicted) over the workpiece 200. The MLI may include various interconnect features, such as vias and conductive lines, disposed in dielectric layers, such as etch-stop layers and ILD layers. In some embodiments, the vias are vertical interconnect features configured to interconnect device-level contacts.

In the above embodiments, the first gate spacer 216 is a single-layer structure. In alternative embodiments depicted by FIGS. 17A-17C, the first gate spacer 216 may be a multi-layer structure. In an embodiment, to form the dual-layer first gate spacer 216, the oxidization treatment includes providing a first gas (e.g., oxygen) to facilitate the formation of a first layer 216A of the first gate spacer 216 and then providing a second gas (e.g., $NH_3$) to facilitate the formation of a second layer 216B of the first gate spacer 216 on the sidewall of the first layer 216A. The first layer 216A has a uniform thickness bottom to top, and the second layer 216B has a non-uniform thickness. In some embodiments, a profile of the second layer 216B is substantially similar to the profile of the single-layer first gate spacer 216 described with reference to FIGS. 5A-5C and 5F.

FIG. 18 illustrates a flowchart of a first alternative method 100' for forming a semiconductor structure, according to various embodiments of the present disclosure. Method 100' is similar to method 100, and one of the differences between methods 100 and 100' includes that method 100' also includes performing operations to enlarge the gate trenches in the device region 200A/200B. Referring to FIG. 18 and FIGS. 14A-14C, method 100' includes blocks 102-122 of method 100. Repeated descriptions of operations of blocks 102-122 of method 100 are omitted for reason of simplicity.

Figure 19A:
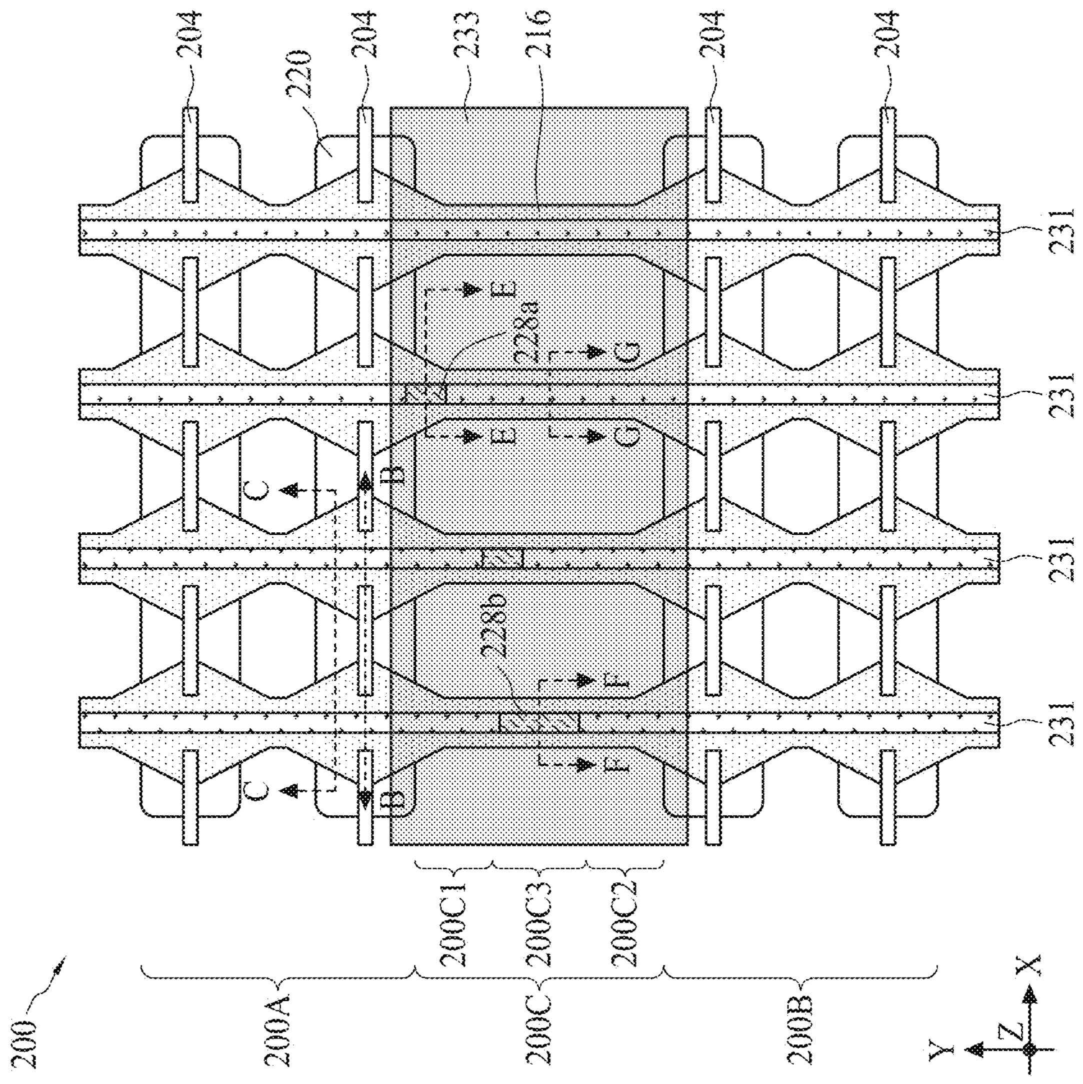
FIG. 19A depict a fragmentary top view of a workpiece during various fabrication stages in the method of FIG. 18, according to various aspects of the present disclosure.
Figure 19C:
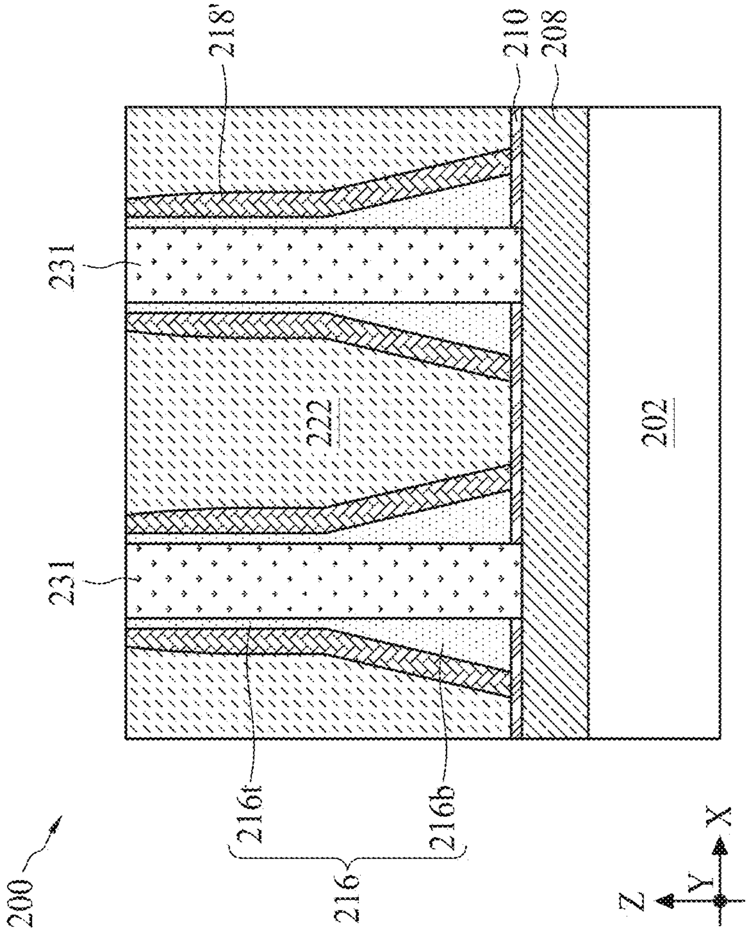
FIGS. 19C, 20C, 21C, 22C, 23C and 24C depict fragmentary cross-sectional views of the workpiece taken along line C-C (shown in FIG. 19A) during various fabrication stages in the method of FIG. 18, according to various aspects of the present disclosure.
Figure 19B:
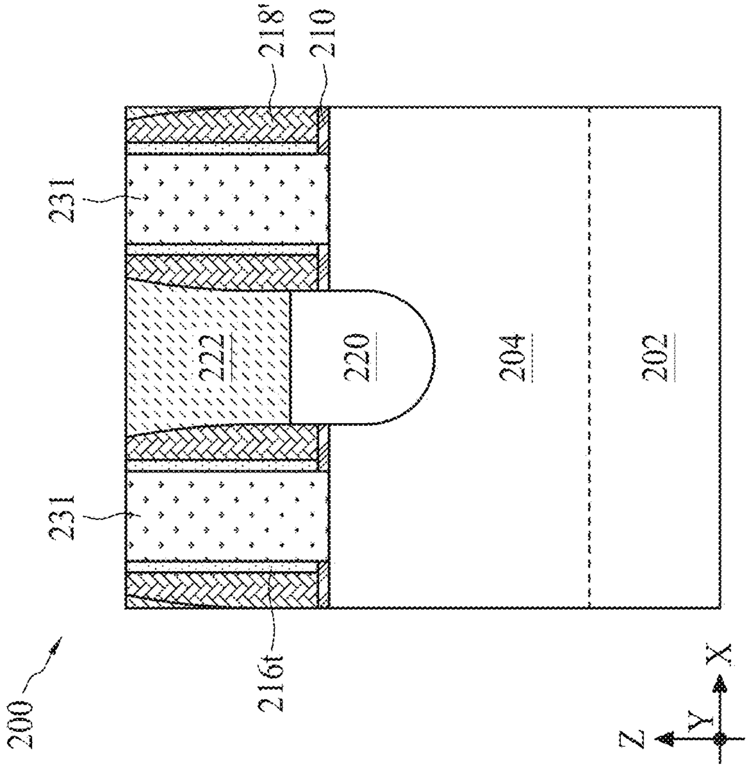
FIGS. 19B, 20B, 21B, 22B, 23B and 24B depict fragmentary cross-sectional views of the workpiece taken along line B-B (shown in FIG. 19A) during various fabrication stages in the method of FIG. 18, according to various aspects of the present disclosure.
Figure 19F:
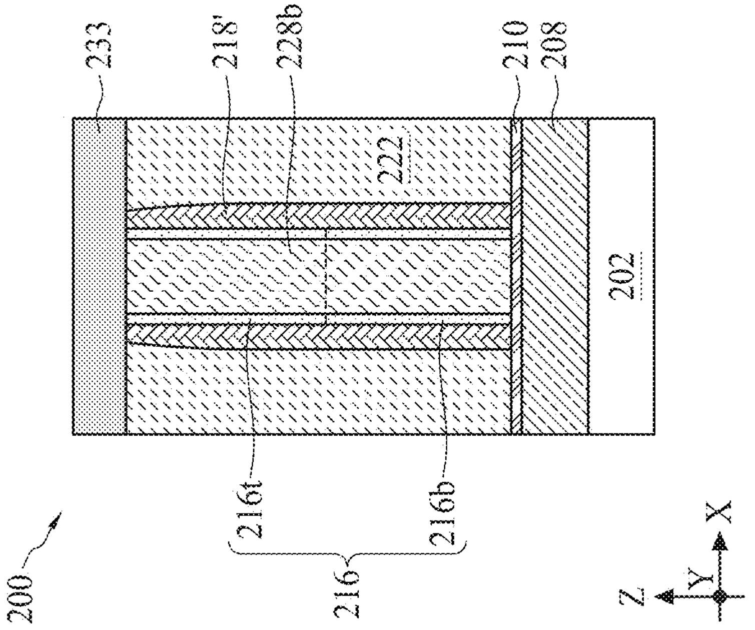
FIGS. 19F, 20F, and 22F depict fragmentary cross-sectional views of the workpiece taken along line F-F (shown in FIG. 19A) during various fabrication stages in the method of FIG. 18, according to various aspects of the present disclosure.
Figure 19E:
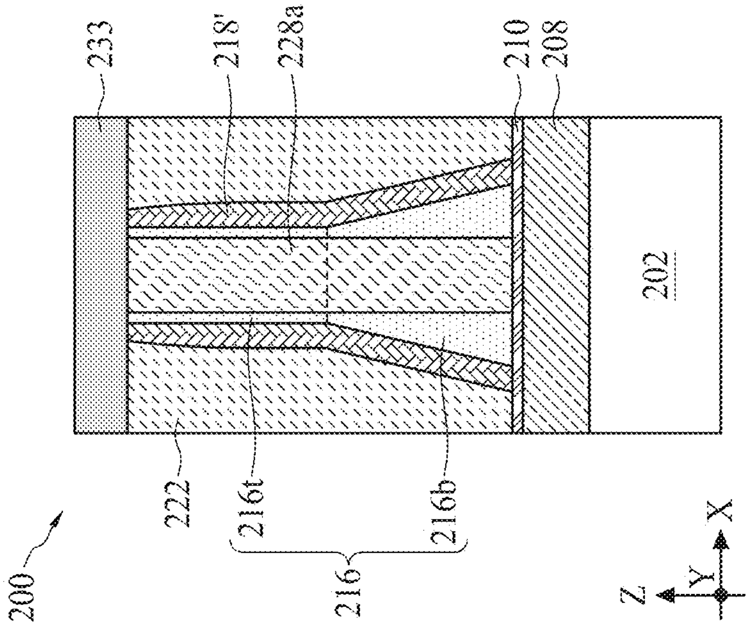
FIGS. 19E, 20E, and 22E depict fragmentary cross-sectional views of the workpiece taken along line E-E (shown in FIG. 19A) during various fabrication stages in the method of FIG. 18, according to various aspects of the present disclosure.
Figure 19G:
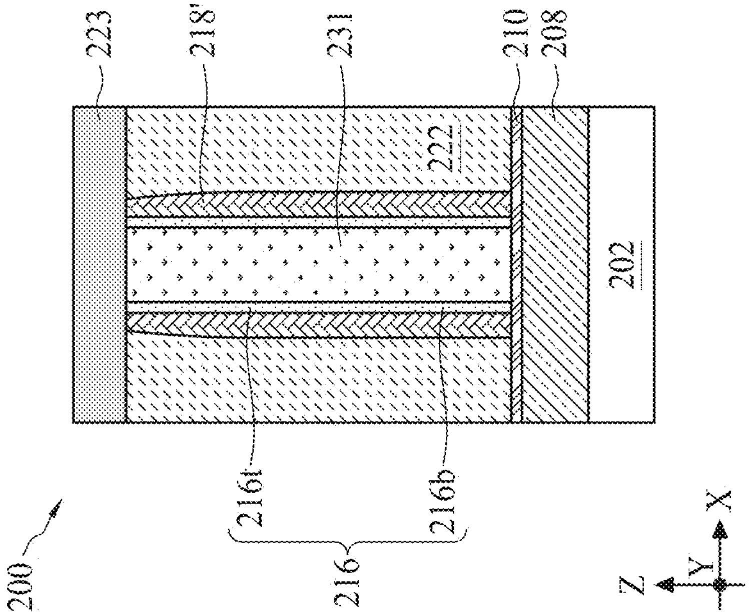
FIGS. 19G, 20G, and 22G depict fragmentary cross-sectional views of the workpiece taken along line G-G (shown in FIG. 19A) during various fabrication stages in the method of FIG. 18, according to various aspects of the present disclosure.
Figure 20C:
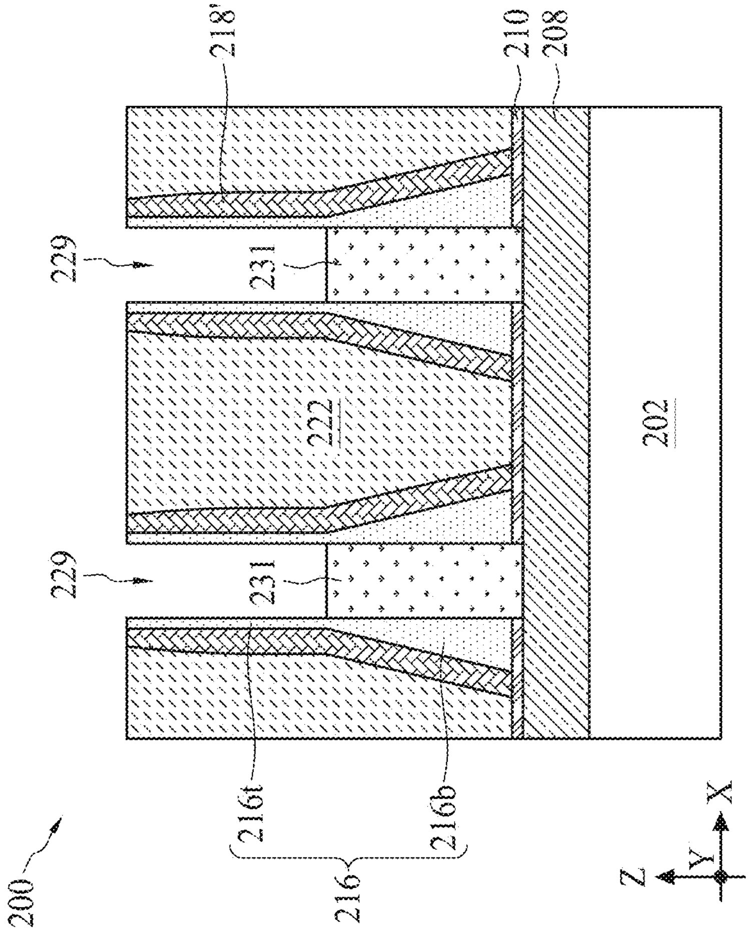
Figure 20B:
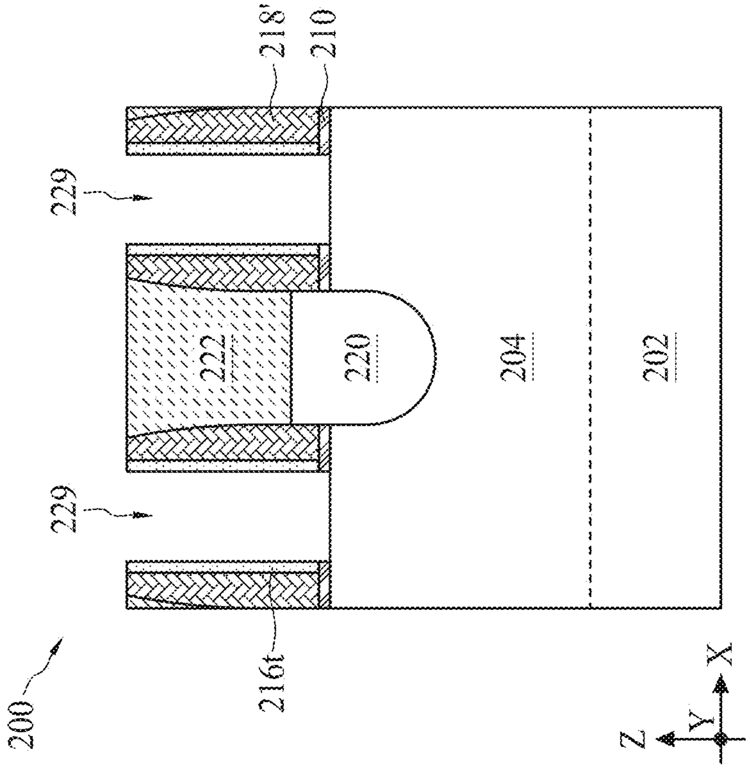
Figure 20E:
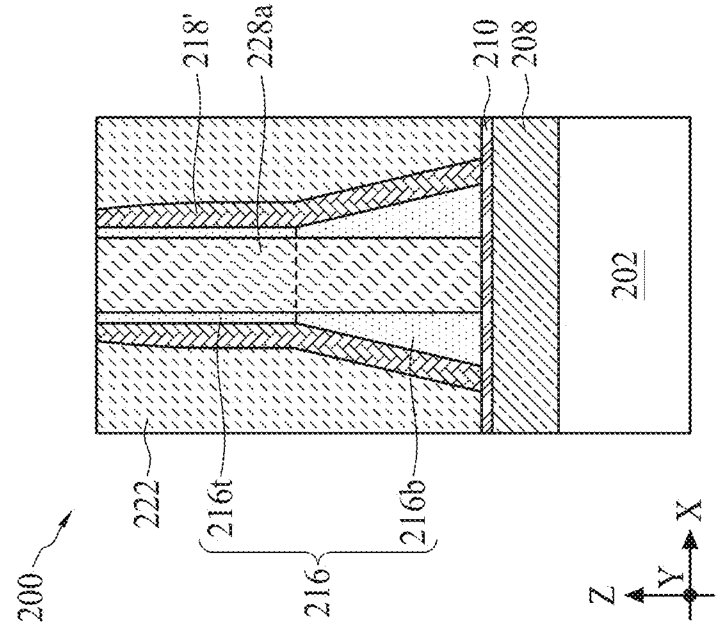
Figure 20F:
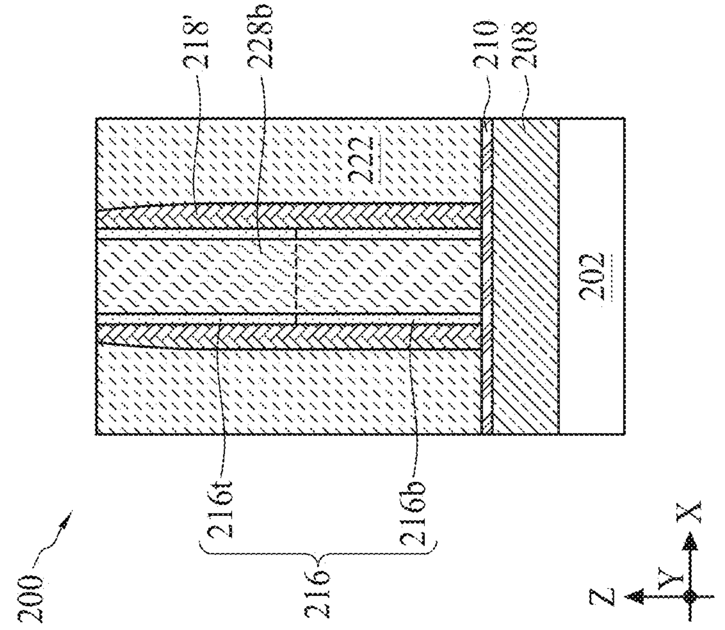
Figure 20G:
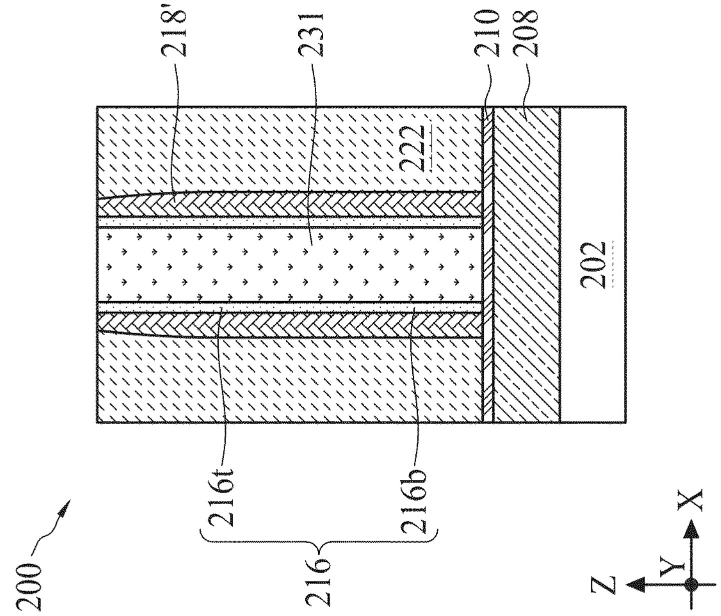

Referring now to FIG. 18 and FIGS. 19A-19C, 19E-19G, 20B-20C and 20E-20G, method 100' includes a block 123*a* where a recessed sacrificial layer 231 is formed in the gate trenches 229 to expose portions of the first gate spacer 216 in the device regions 200A and 200B. With reference to FIGS. 19A-19C and 19E-19G, a sacrificial layer 231 is formed over the workpiece 200 to fill the gate trenches 229. FIG. 19A is a fragmentary top view of the workpiece 200 in the core device region, FIGS. 19B, 19C, 19E, 19F, and 19G depict fragmentary cross-sectional views of the workpiece 200 taken along line B-B, line C-C, line E-E, line F-F, and line G-G shown in FIG. 19A, respectively. In some embodiments, the sacrificial layer 231 includes a polymeric material, such as one used for a bottom anti-reflective coating (BARC) in a multi-layer photoresist material. After forming the sacrificial layer 231, a patterned photoresist layer 233 is formed to cover features in the connector region 200C of the workpiece 200, features in the device regions 200A and 200B remain exposed. Then, with reference to FIGS. 20B-20C and 20E-20G, an etching process is performed to recess the portion of the sacrificial layer 231 formed in the gate trenches 229 in the device regions 200A and 200B. As depicted by FIGS. 20B-20C, in the device region 200A/200B, the recessed sacrificial layer 231 fills lower portions of the gate trenches 229 and thus covers at least lower portions of the first gate spacer 216, leaving upper portions of the first gate spacer 216 exposed. In embodiments represented by FIGS. 20B-20C, a top surface of the sacrificial layer 231 is coplanar with or lower than the top surface 204*t* of the fin 204. That is, the sacrificial layer 231 covers the bottom portion 216*b* of the first gate spacer 216. As depicted by FIG. 20G, the sacrificial layer 231 remains intact in the connector region 200C. The patterned photoresist layer 233 may be selectively removed after recessing the sacrificial layer 231 in the device regions 200A and 200B.

Figure 21C:
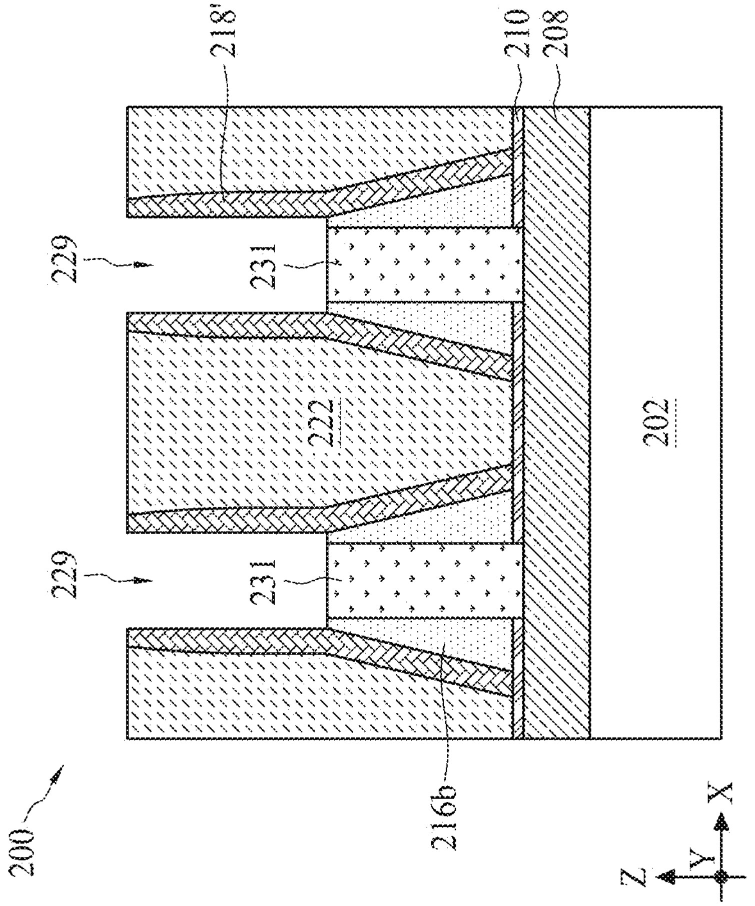
Figure 21B:
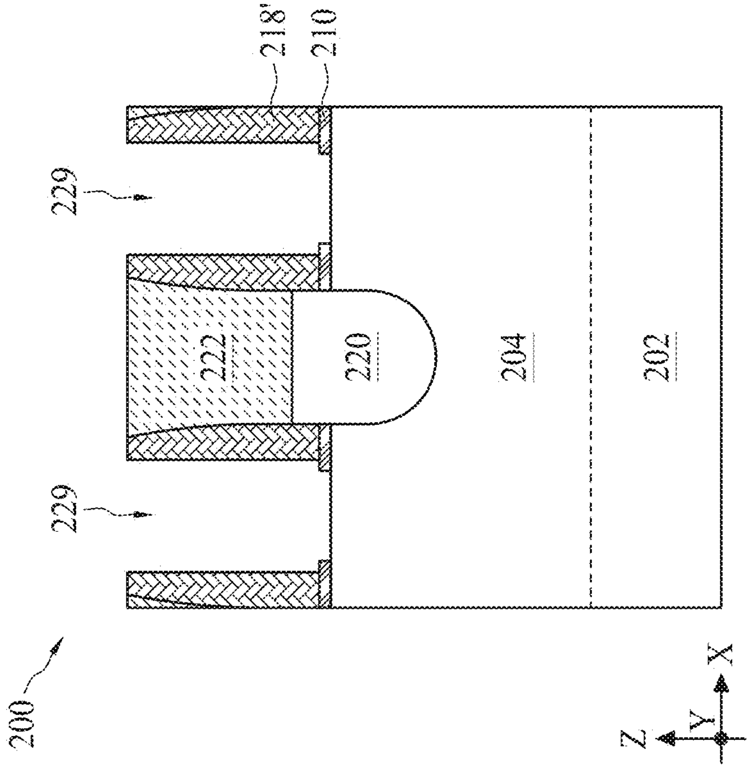

Referring to FIG. 18 and FIGS. 21B-21C, method 100' includes a block 123*b* where an etching process is performed to remove the exposed portion (e.g., the top portion 216*t*) of the first gate spacer 216 to enlarge the gate trench 229 in the device region 200A/200B. In the present embodiments, the etching process is configured to selectively etch the exposed portion of the first gate spacer 216 without substantially etching the sacrificial layer 231 and the bottom portion of the first gate spacer 216 adjacent to the sacrificial layer 231. The etching process may implement an etchant that is configured to remove the first gate spacer 216 at a significantly higher rate than the sacrificial layer 231. Due to the removal of the portion (e.g., the top portion 216*t*) of the first gate spacer 216 not covered by the sacrificial layer 231, the gate trench 229 in the device region 200A/200B is laterally enlarged along the X direction. In an embodiment depicted in FIG. 21B, after the removal of the portion of the first gate spacer 216, the enlarged gate trench 229 exposes a portion of the dummy dielectric layer 210. Since the first gate spacer 216 in the connector region 200C is protected by the gate isolation structure (e.g., gate isolation structure 228*a*/228*b*) or the sacrificial layer 231, it will not be substantially etched during the etching process of operations in block 123*b*. Thus, the gate trench 229 in the connector region 200C will not be enlarged. As a result, parasitic capacitance associated with portions of the gate structures 230 in the connector region 200C will not be disadvantageously increased.

Referring to FIG. 18 and FIGS. 22B-22C and 22E-22G, method 100' includes a block 123*c* where the sacrificial layer 231 is selectively removed. For embodiments in which the sacrificial layer 231 includes a polymer material, such as one used in a BARC, an etching process that may be a resist stripping process or a plasma ashing process may be performed to selectively remove the sacrificial layer 231.

Figure 22B:
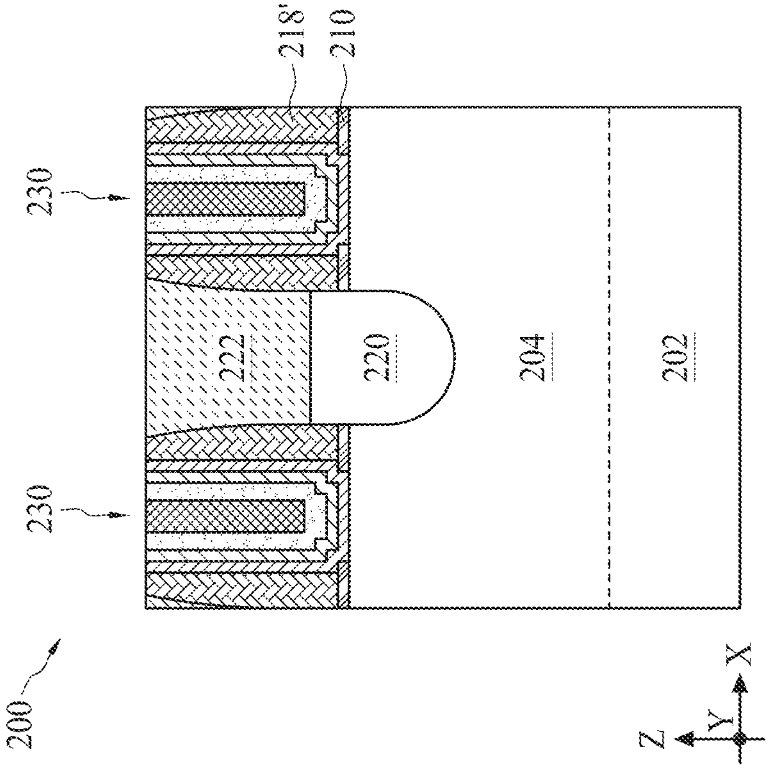
Figure 22C:
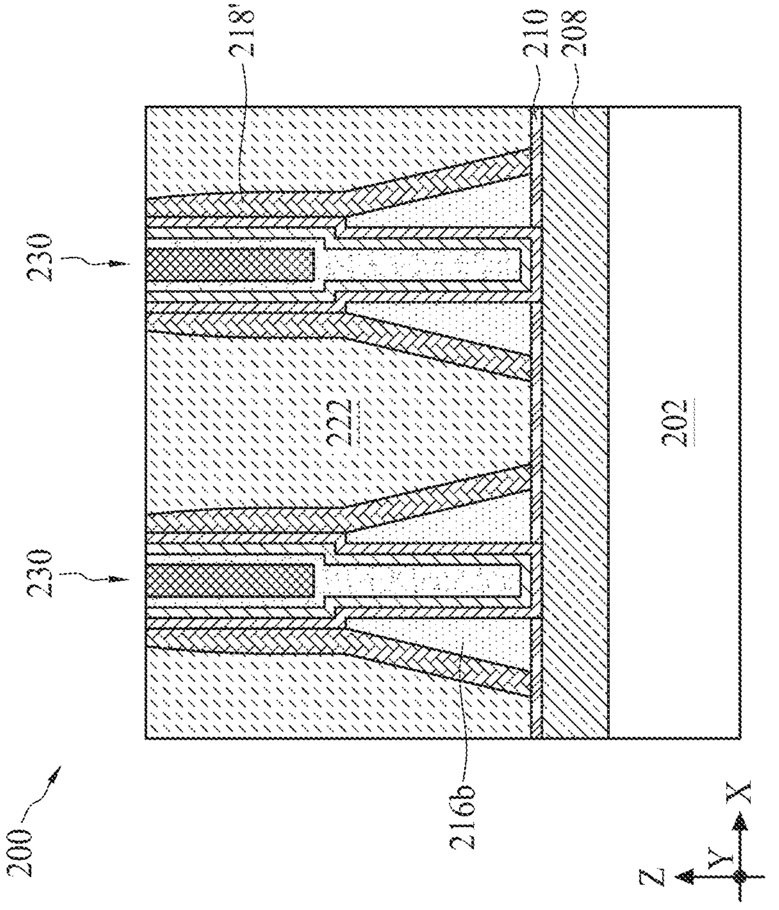
Figure 22F:
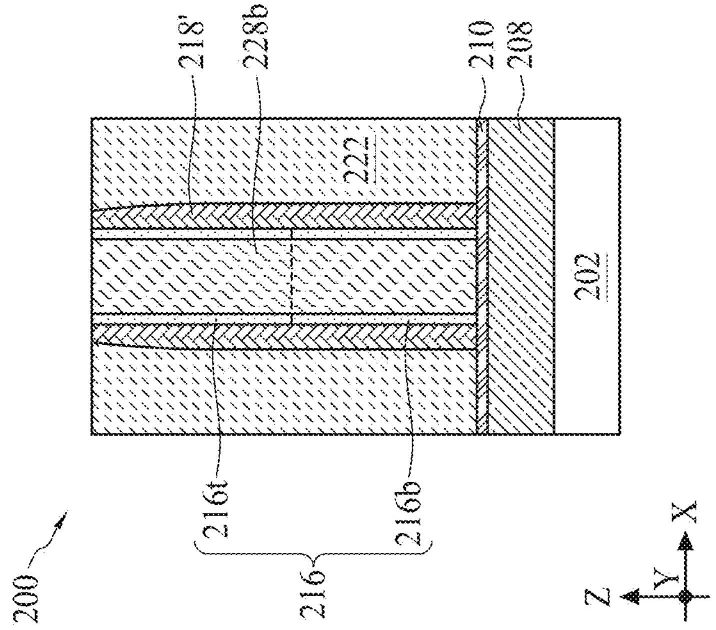
Figure 22E:
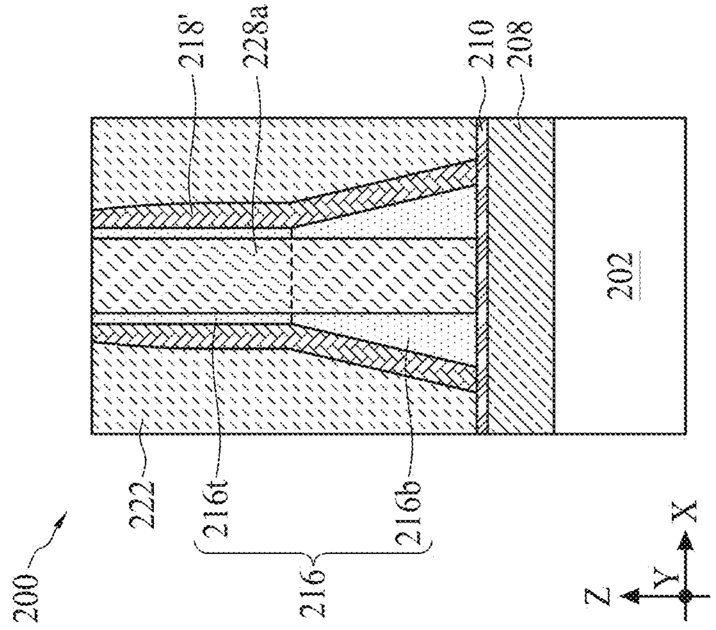
Figure 22G:
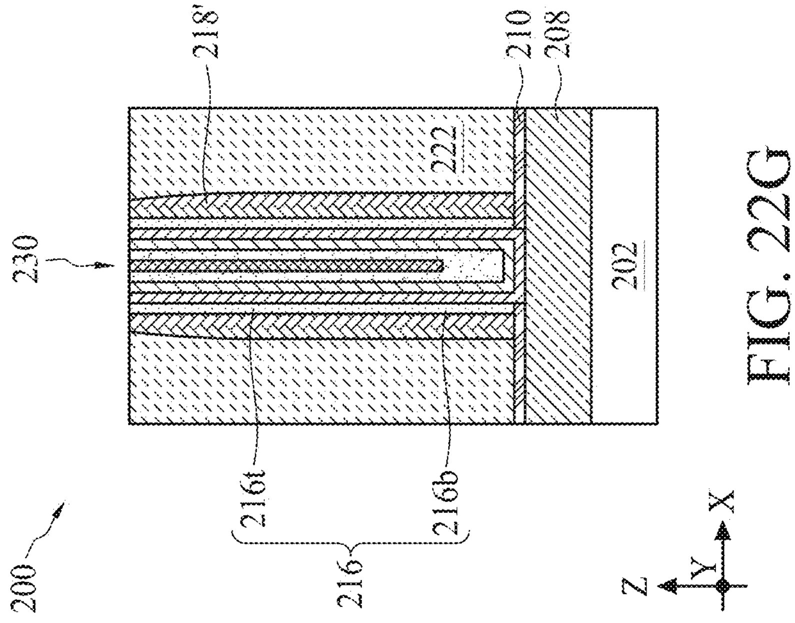
Figure 23B:
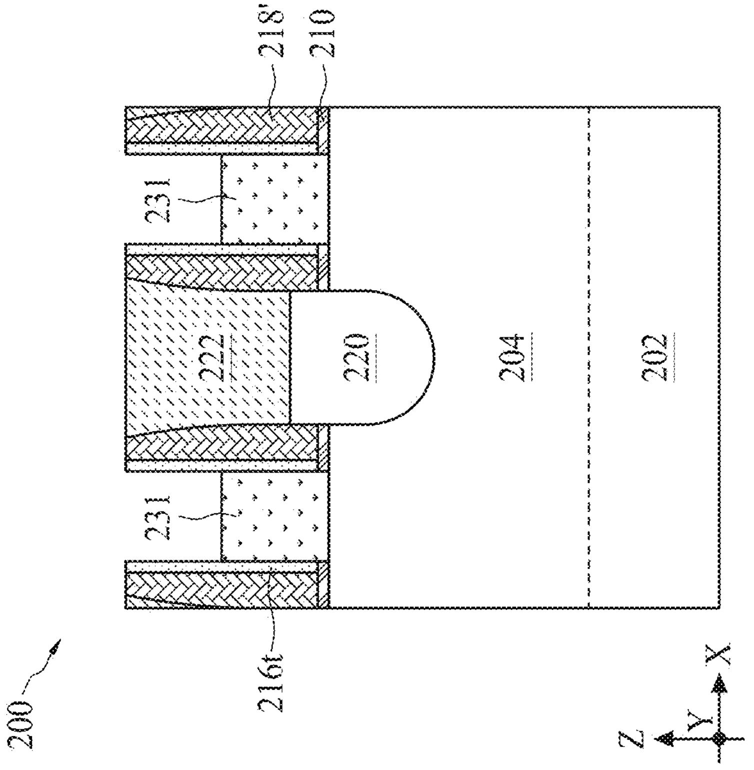
Figure 23C:
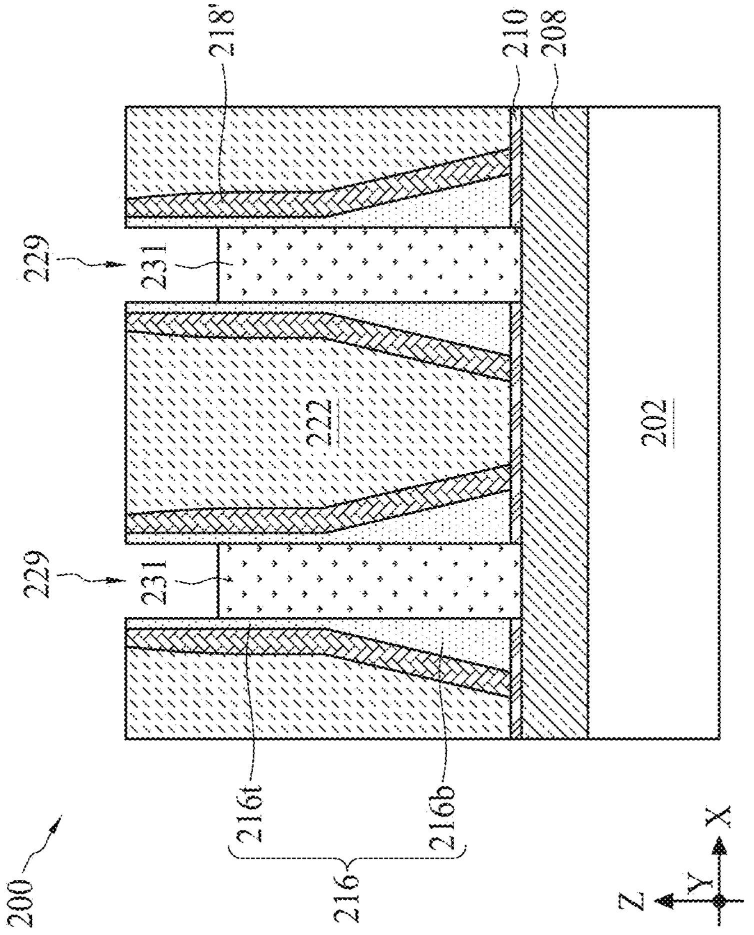

Still referring to FIG. 18 and FIGS. 22B-22C and 22E-22G, method 100' includes blocks 124 and 126 of method 100. After laterally enlarging the gate trenches 229 in the device region 200A/200B, gate structures 230 are formed in the gate trenches 229. The gate structure 230 in the device region 200A/200B represented in FIGS. 22B and 22C tracks the shape of the enlarged gate trench 229 and thus has an increased volume than the gate structure 230 represented by FIGS. 15A-15C. Thus, parasitic resistance and work function of the gate structures 230 in the device region 200A/200B may be adjusted by changing the height of the first gate spacer 216. FIGS. 22E-22F depict fragmentary cross-sectional views of the gate isolation structures 228*a* and 228*b*. The gate isolation structures 228*a* and 228*b* track the shapes of the gate trenches 229 in the connector regions 200C1 and 200C3, respectively. FIG. 22G depicts a fragmentary cross-sectional view of the workpiece 200 taken along line G-G (shown in FIG. 19A). The gate structure 230 in the connector region 200C is formed in the unenlarged gate trench 229.

In embodiments described with reference to FIGS. 20B-20C, the top surface of the recessed sacrificial layer 231 is coplanar with or below the top surface 204*t* of the fins 204, and the top portion 216*t* of the first gate spacer 216 is removed. In an alternative embodiment represented by FIGS. 23B-23C, the top surface of the recessed sacrificial layer 231 is above the top surface 204*t* of the fins 204. That is, the recessed sacrificial layer 231 further covers a lower part of the top portion 216*t* of the first gate spacer 216. Operations in blocks 123*b*, 123*c*, and 124 are then performed. As represented by FIGS. 24B-24C, the gate structure 230 in the device region 200A/200B tracks the shape of the adjusted gate trench 229 and thus has a non-uniform length in the gate trench 229. The gate structure 230 represented by FIGS. 24B-24C has an increased volume than the gate structure 230 represented by FIGS. 15A-15C and a reduced volume than the gate structure 230 represented by FIGS. 22B-22C.

In the above embodiments described with reference to FIG. 4A, when viewed from top, the main portion 212*m* of the dummy gate electrode 212 has a uniform length $L_{g1}$. In an alternative embodiment represented by FIGS. 25-30F, to further reduce the parasitic capacitance, the main portion 212*m* of the dummy gate electrode 212 has a non-uniform length $L_{g1}$. For example, the portion of the dummy gate electrode 212 in the connector region 200C (and thus the gate structure 230 in the connector region 200C) may have a length $L_{g4}$ less than the length $L_{g1}$.

FIG. 25 illustrates a flowchart of a second alternative method 100" for forming a semiconductor structure, according to various embodiments of the present disclosure. Method 100" is similar to method 100, and one of the differences between methods 100 and 100" includes that method 100" further includes performing operations to reduce the length $L_{g1}$ of the portion of dummy gate electrode 212 (and thus the resulted gate structure 230) in the connector region 200C. Referring to FIG. 25 and FIG. 1, method 100" includes blocks 102-108 of method 100. Repeated descriptions of operations of blocks 102-108 of method 100 are omitted for reason of simplicity.

Figure 26A:
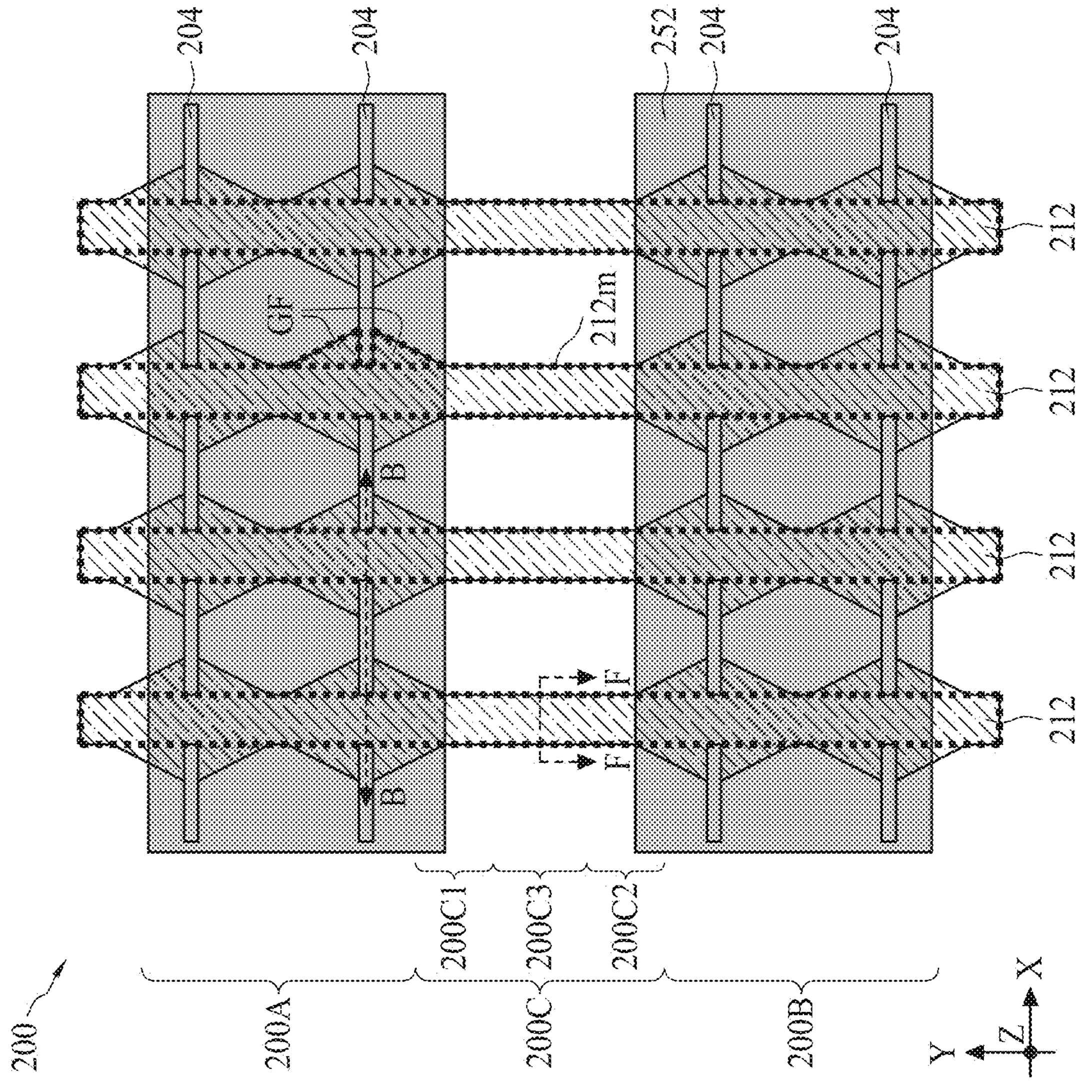
FIGS. 26A, 27A, 28A, 29A, 30A, 31A, 32A, 33A and 34A depict fragmentary top views of a workpiece during various fabrication stages in the method of FIG. 25, according to various aspects of the present disclosure.
Figure 26B:
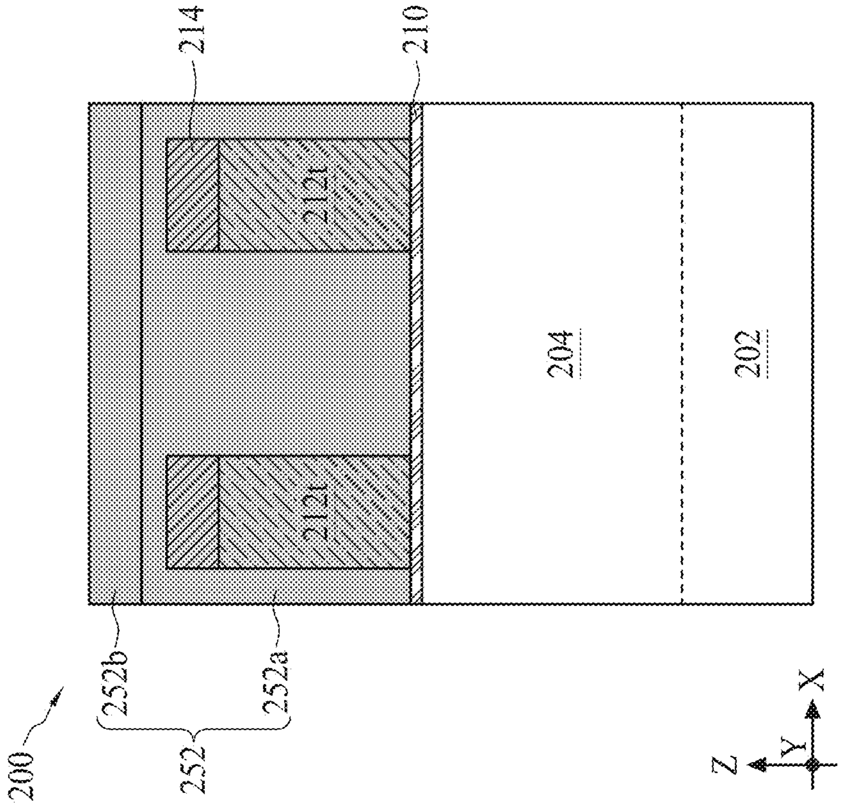
FIGS. 26B, 27B, 28B, 29B, 30B, 31B, 32B, 33B and 34B depict fragmentary cross-sectional views of the workpiece taken along line B-B during various fabrication stages in the method of FIG. 25, according to various aspects of the present disclosure.
Figure 26F:
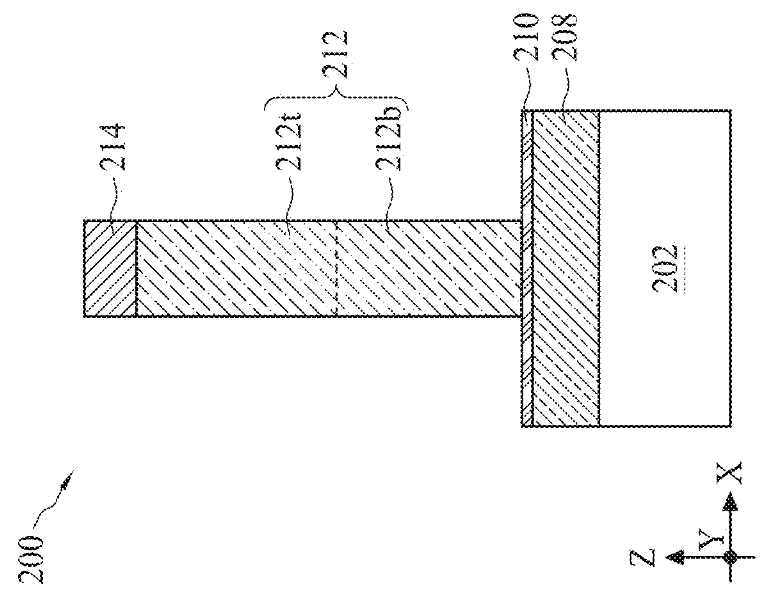
FIGS. 26F, 27F, 28F, 29F, 30F, 31F, 32F, 33F and 34F depict fragmentary cross-sectional views of the workpiece taken along line F-F during various fabrication stages in the method of FIG. 25, according to various aspects of the present disclosure.
Figure 27A:
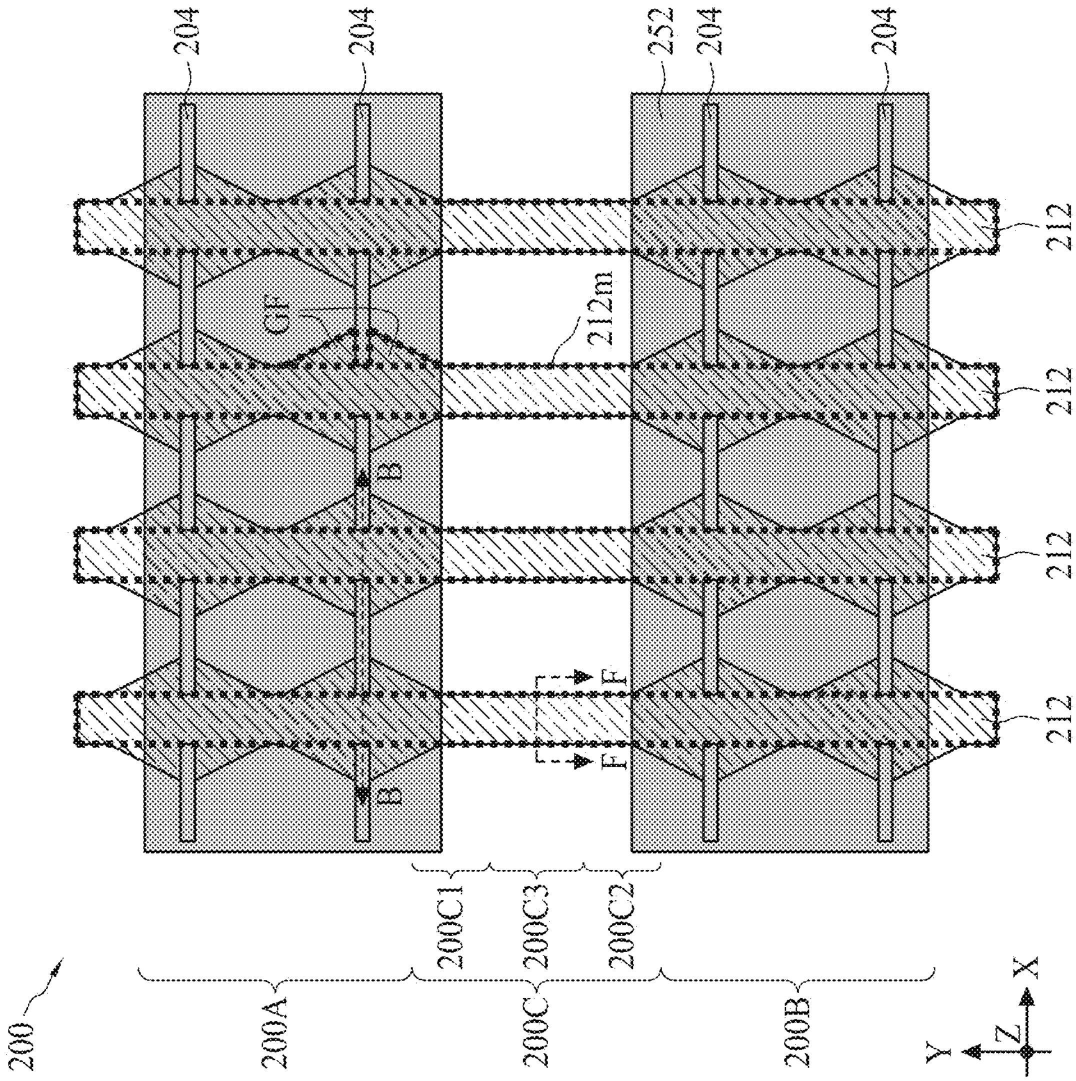
Figure 27B:
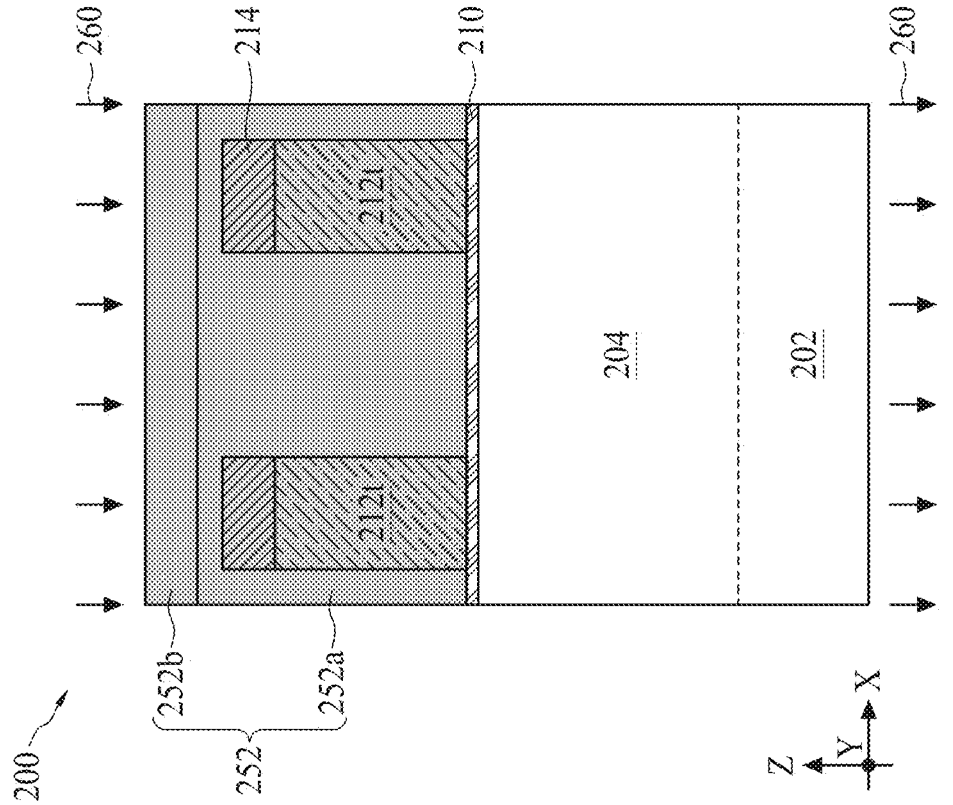
Figure 27F:
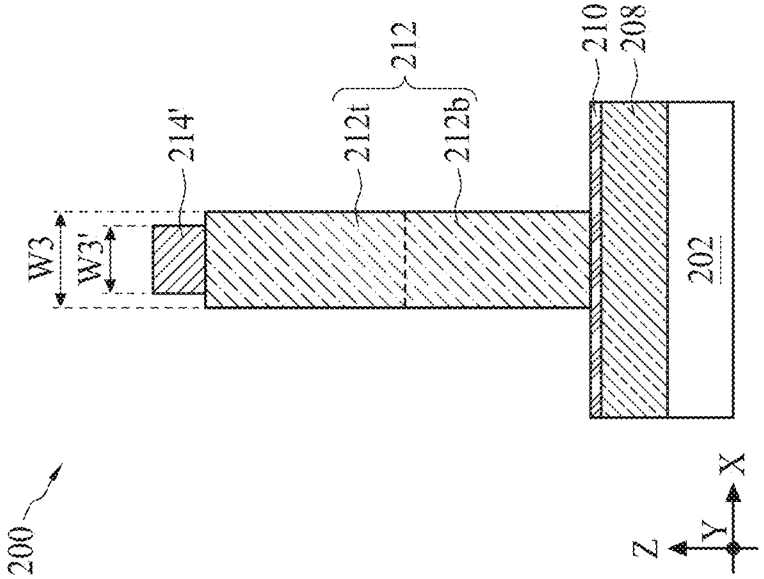

Referring now to FIG. 25, FIGS. 4A-4C and 4F, and FIGS. 26A, 26B, 26F, 27A, 27B, and 27F, method 100" includes a block 109*a* where a first etching process 260 is performed to reduce a width of the patterned hard mask layer 214 in the connector region 203C. FIG. 26A depicts a fragmentary top view of the workpiece 200, FIGS. 26B and 26F depict fragmentary cross-sectional views of the workpiece 200 taken along line B-B and line F-F shown in FIG. 26A, respectively. FIG. 27A depicts a fragmentary top view of the workpiece 200, FIGS. 27B and 27F depict fragmentary cross-sectional views of the workpiece 200 taken along line B-B and line F-F shown in FIG. 27A, respectively.

With reference to FIGS. 26A, 26B and 26F, after performing operations in block 108, a masking layer 252 is formed over the workpiece and is then patterned to cover features in the device region 200A without covering features in at least a part (e.g., the connector region 200C3) of the connector region 200C. In an embodiment, the masking layer 252 includes a bottom layer 252*a* and a photosensitive layer 252*b* over the bottom layer 252*a*.

With reference to FIGS. 27A, 27B and 27F, while using the patterned masking layer 252 as an etch mask, the first etching process 260 is performed to selectively etch the patterned hard mask layer 214 not covered by the patterned masking layer 252. In the present embodiments, after the performing of the first etching process 260, a width of the patterned hard mask layer 214 in the connector region 200C3 is changed from W3 to W3'. W3 is equal to $L_{g1}$ (shown in FIGS. 4C and 4F), and W3' is less than W3. In some embodiments, although not shown, the performing of the first etching process 260 also reduces a thickness of the patterned hard mask layer 214 in the connector region 200C3. The patterned hard mask layer 214 in the connector region 200C3 after the performing of the first etching process 260 may be referred to as the patterned hard mask layer 214'.

Figure 28A:
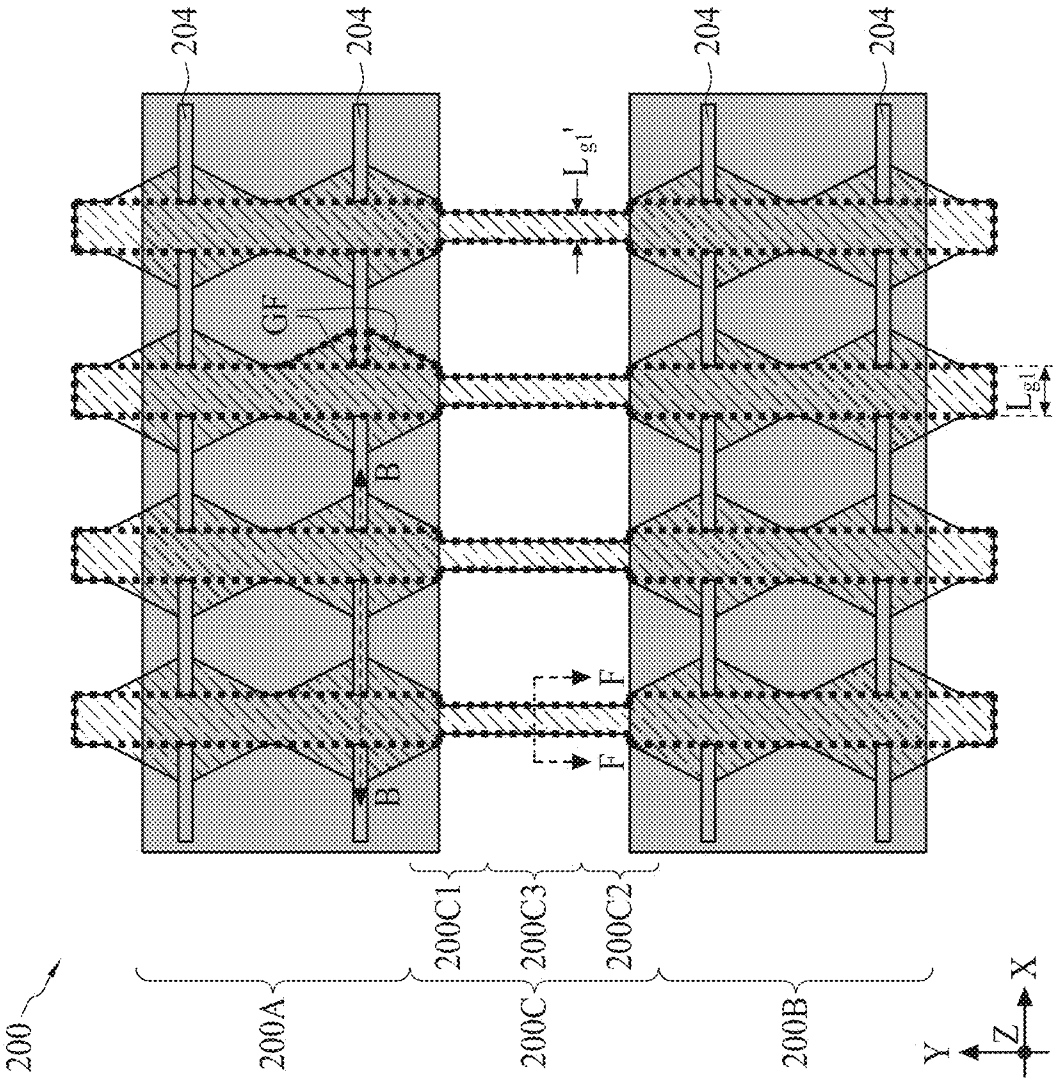
Figure 28B:
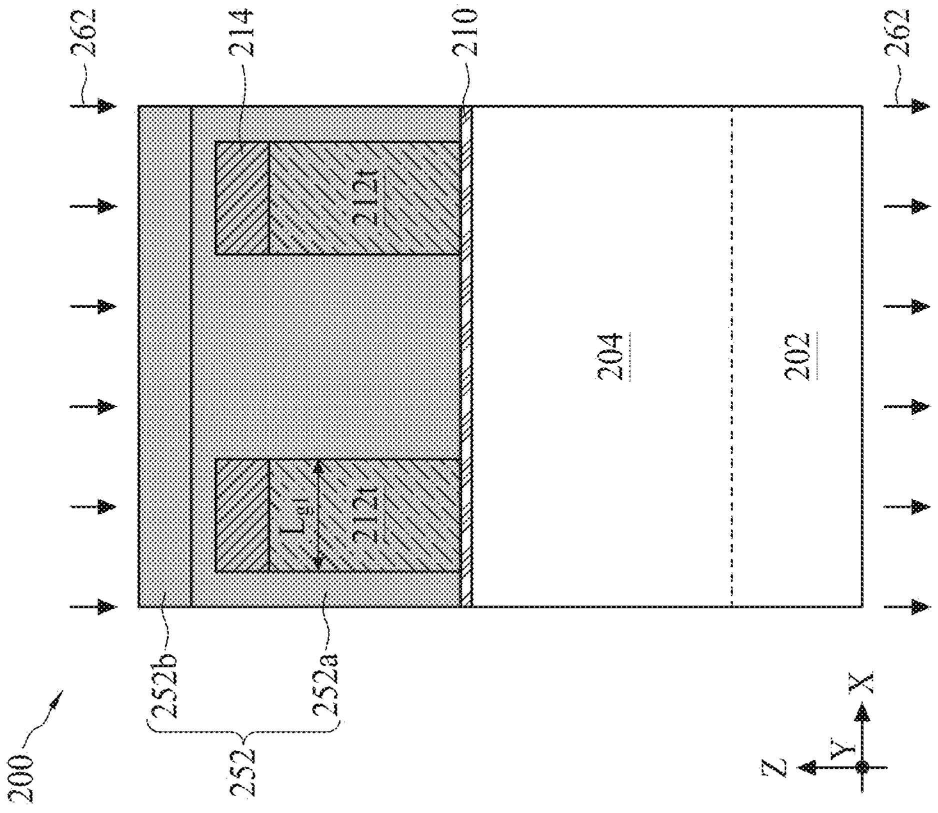
Figure 28F:
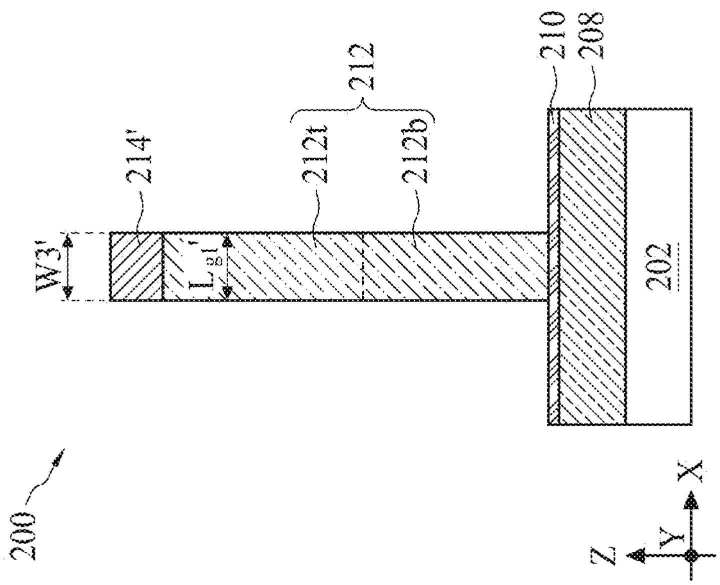

Referring to FIGS. 25 and 28A, 28B and 28F, method 100" includes a block 109*b* where a second etching process 262 is performed to etch the portion of dummy gate electrode 212 in the connector region 203C. FIG. 28A depicts a fragmentary top view of the workpiece 200, FIGS. 28B and 28F depict fragmentary cross-sectional views of the workpiece 200 taken along line B-B and line F-F shown in FIG. 28A, respectively. After forming the patterned hard mask layer 214', while using the patterned hard mask layer 214' as an etch mask, the second etching process 262 is performed to trim the dummy gate electrode 212 in the connector region 200C3 by removing parts of the dummy gate electrode 212 not covered by the patterned hard mask layer 214' or the patterned hard mask layer 214. Upon completion of the second etching process 262, the trimmed dummy gate electrode 212 in the connector region 200C3 has a length $L_{g1}'$ less than the length $L_{g1}$. In an embodiment, the length $L_{g1}'$ is equal to the width W3'. By reducing the length of the dummy gate electrode 212 from $L_{g1}$ to $L_{g1}'$, the distance between the gate structure 230 in the final structure of the workpiece 200 and the source/drain contact 236 may be further reduced. The patterned masking layer 252 may be selectively removed after the performing of the second etching process 262.

Figure 29A:
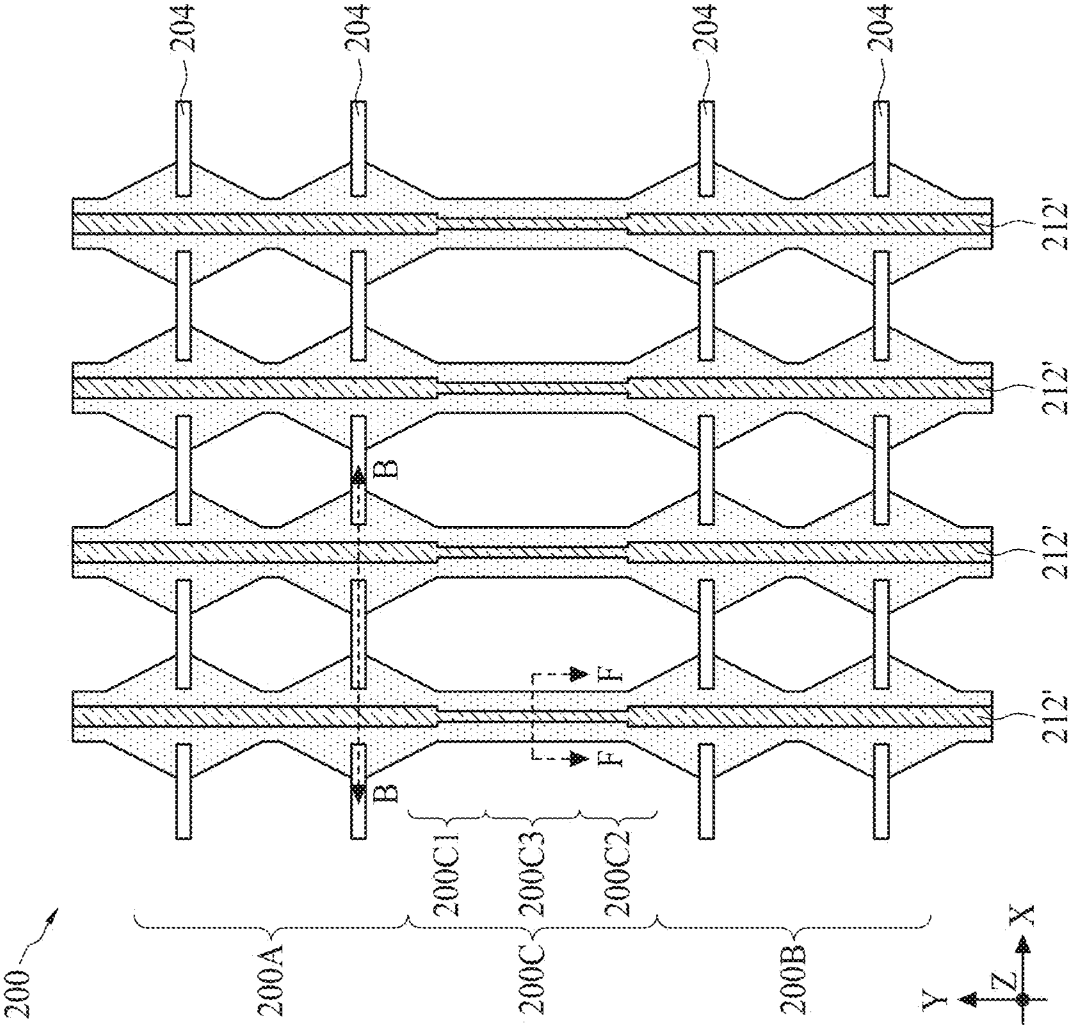
Figure 29B:
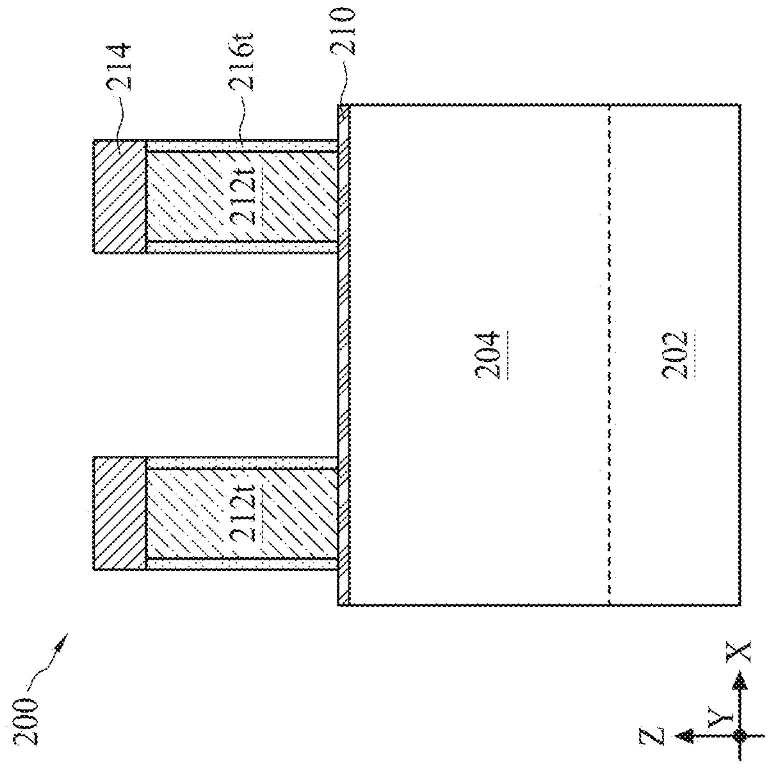
Figure 29F:
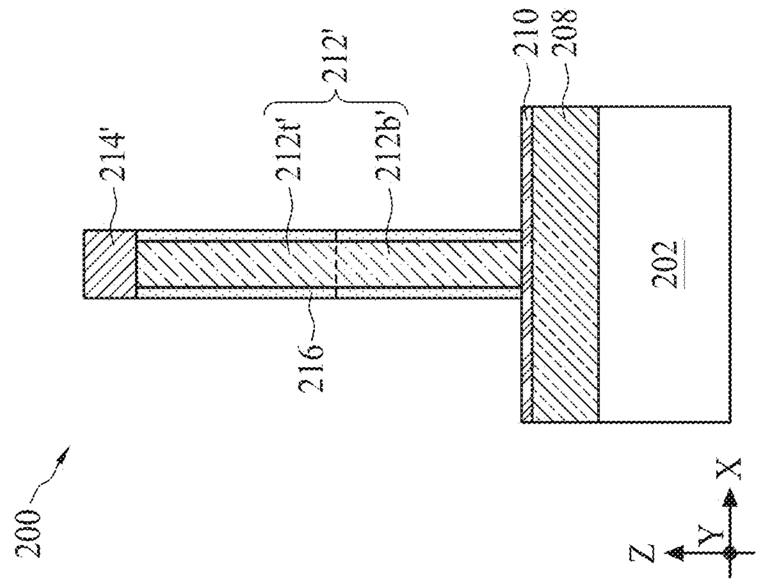
Figure 30A:
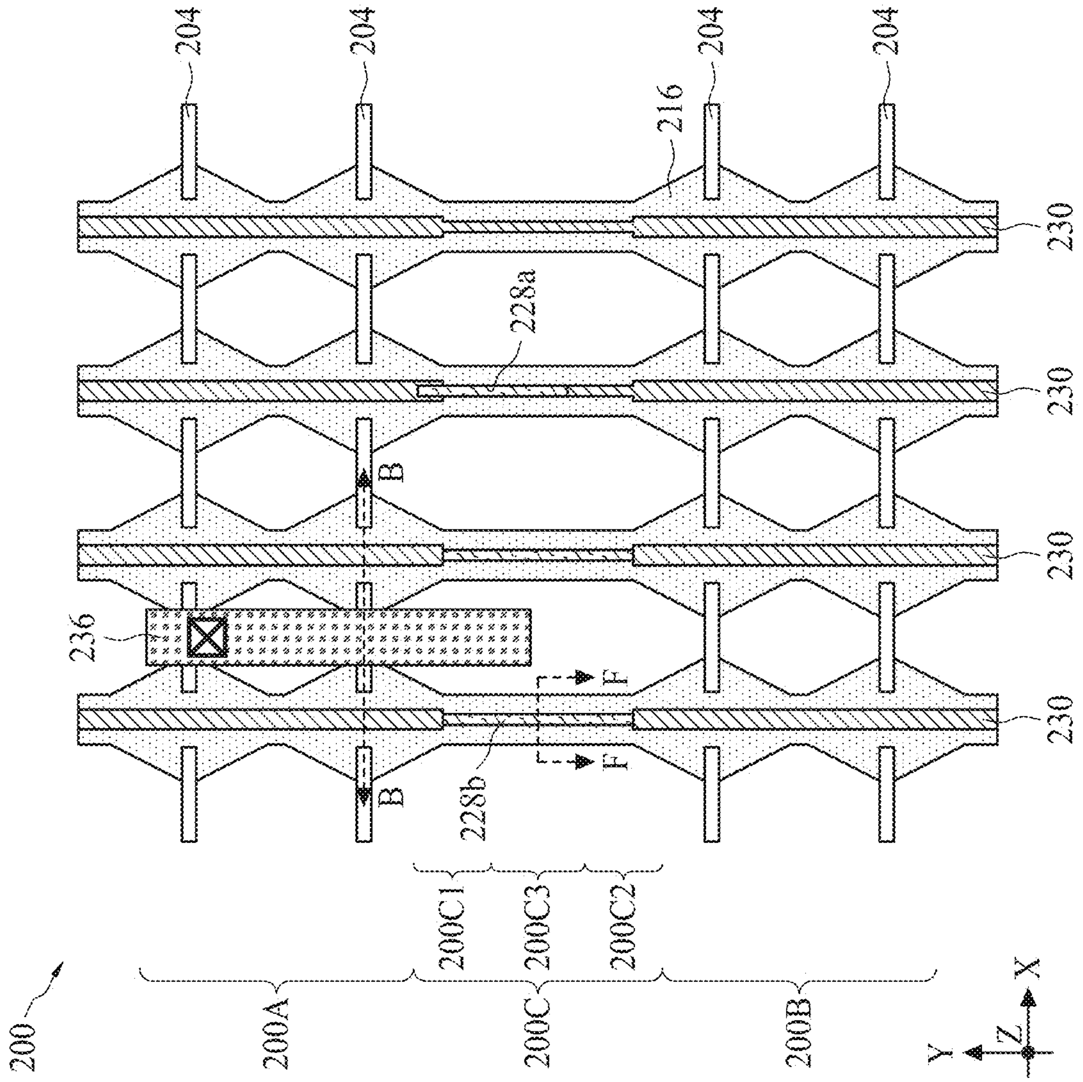
Figure 30F:
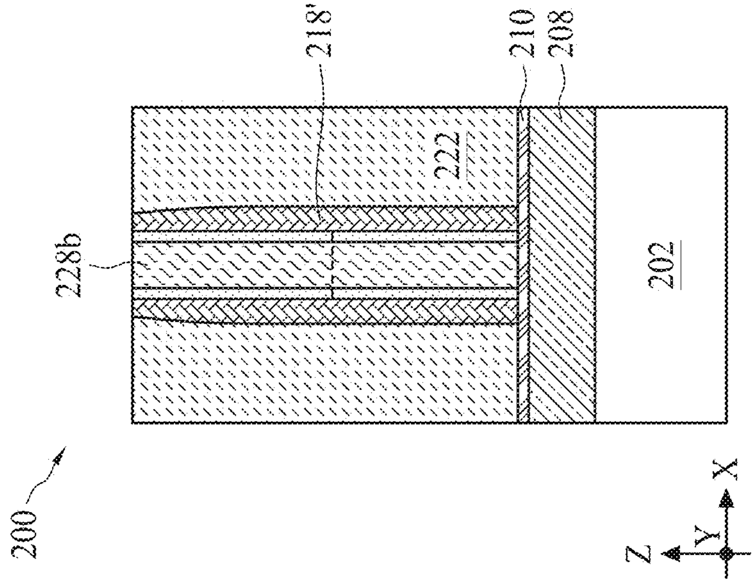
Figure 30B:
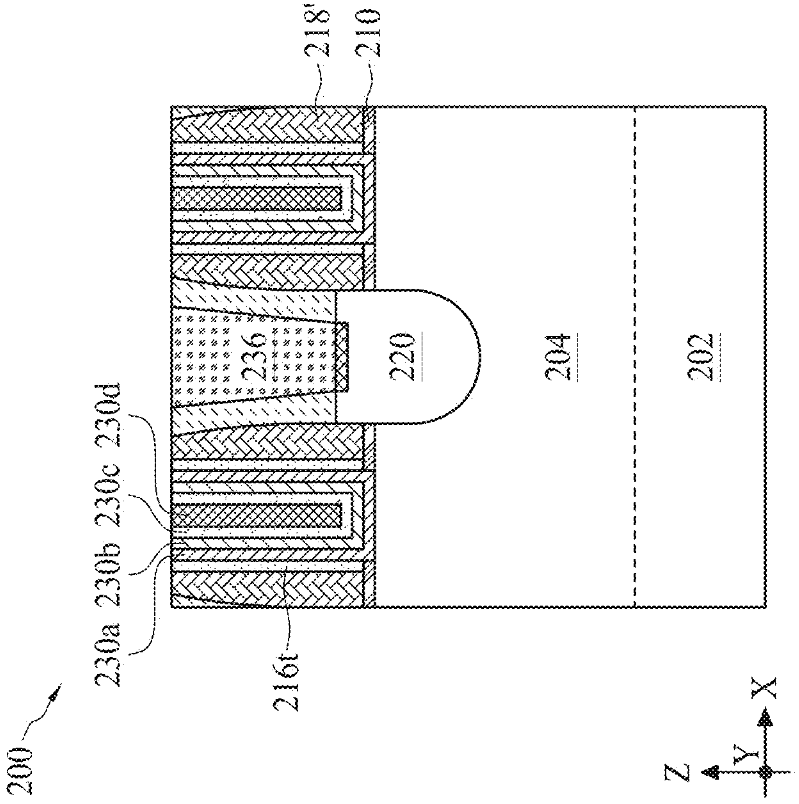

In an embodiment, after performing operations in block 109*b*, referring to FIGS. 25 and 29A, 29B, 29F, 30A, 30B, and 30F, method 100" proceeds to path A to perform operations in blocks 110-126 of method 100. For example, as represented by FIGS. 29A, 29B and 29F, the oxidization treatment described with reference to FIG. 5A is performed to form the first gate spacer 216. With reference to FIGS. 30A, 30B, and 30F, gate isolation structures (e.g., gate isolation structures 228*a* and 228*b*) and gate structures 230 are formed to replace the dummy gate electrodes 212' in a way similar to the method 100 described above. Since the dummy gate electrode 212 has a length $L_{g1}'$ less than the length $L_{g1}$, a distance between the gate structure 230 and source/drain contact 236 depicted in FIGS. 30A, 30B and 30F is increased. As a result, the parasitic capacitance may be further reduced.

Figure 31A:
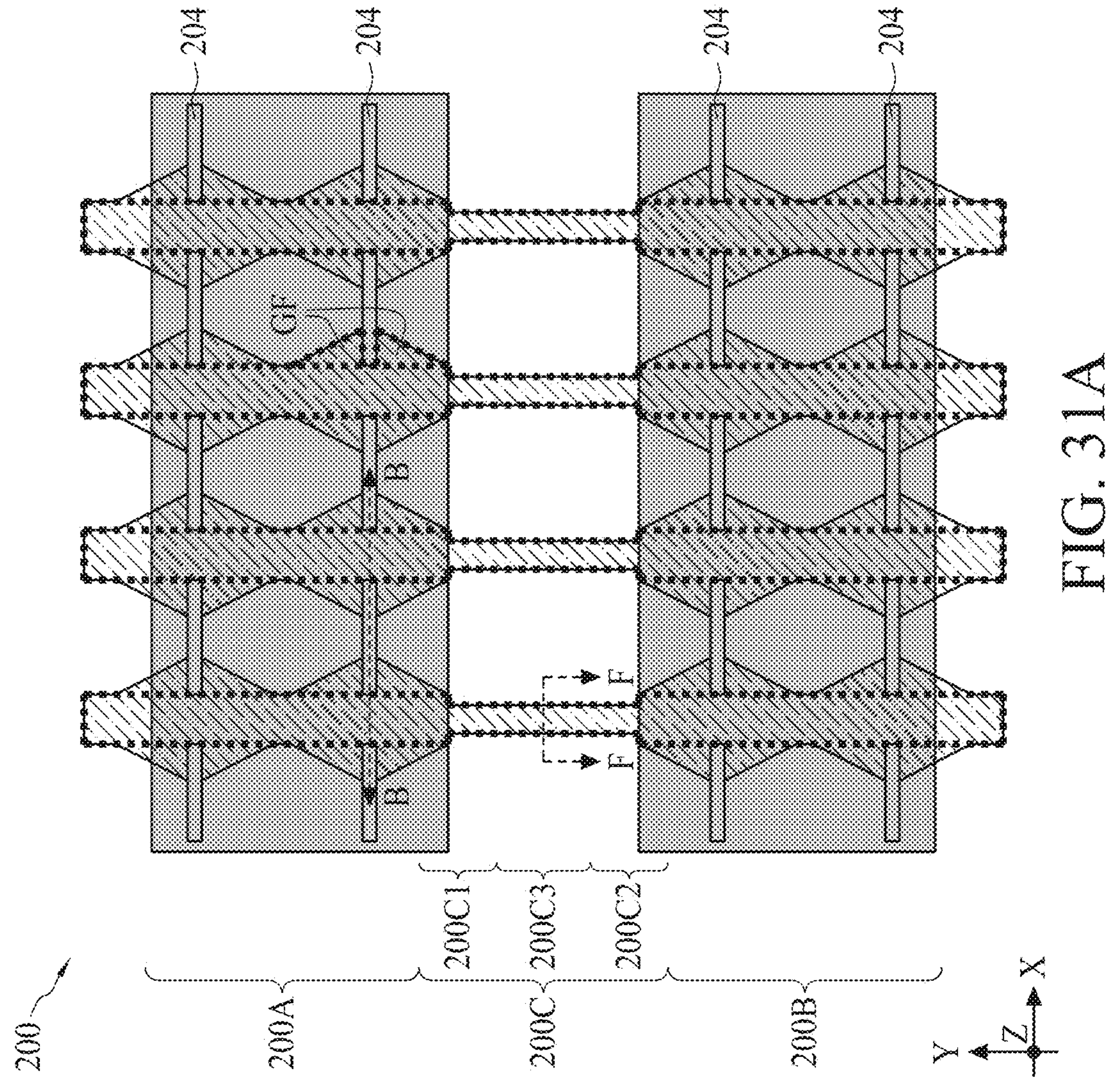
Figure 31F:
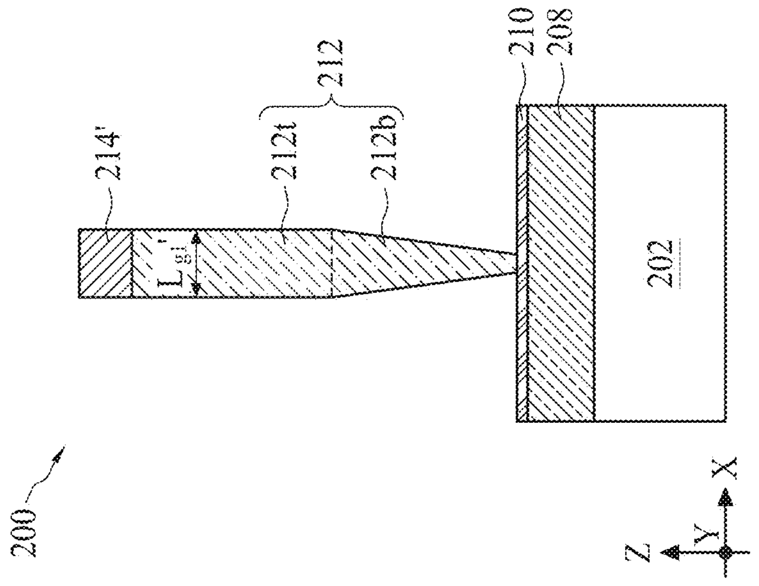
Figure 31B:
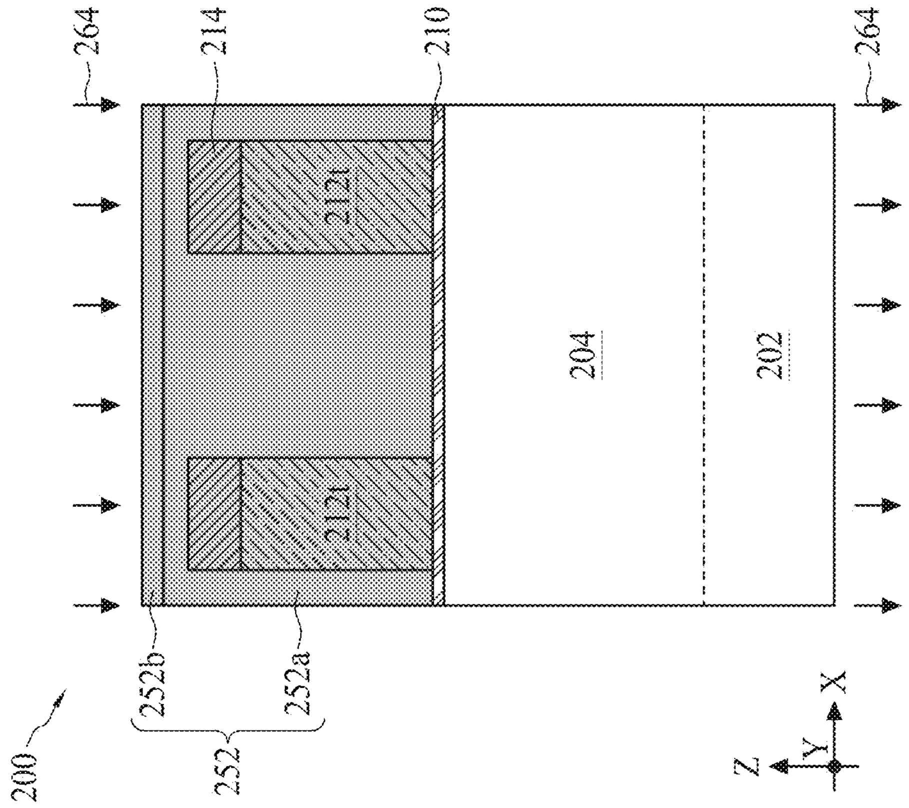
Figure 32A:
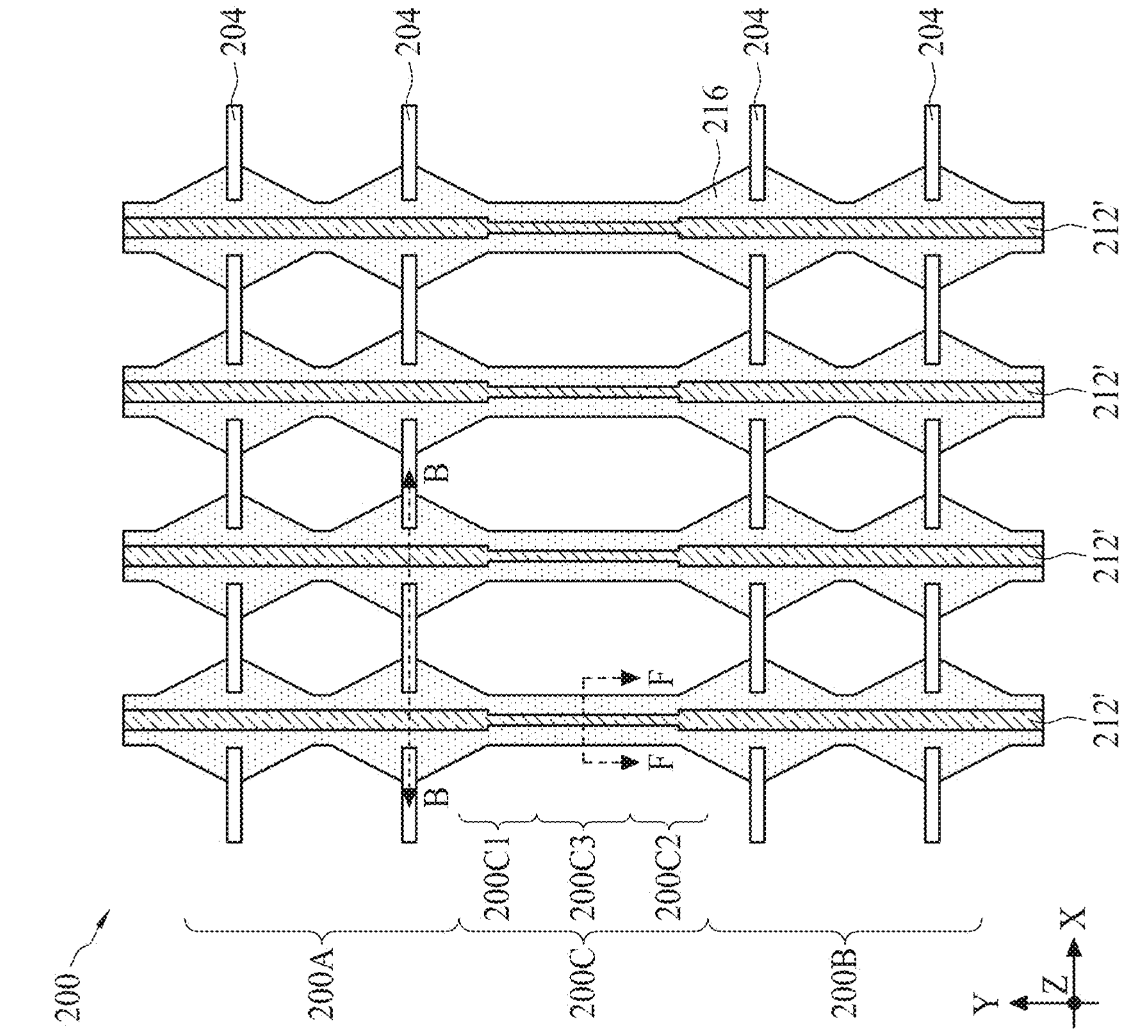
Figure 32F:
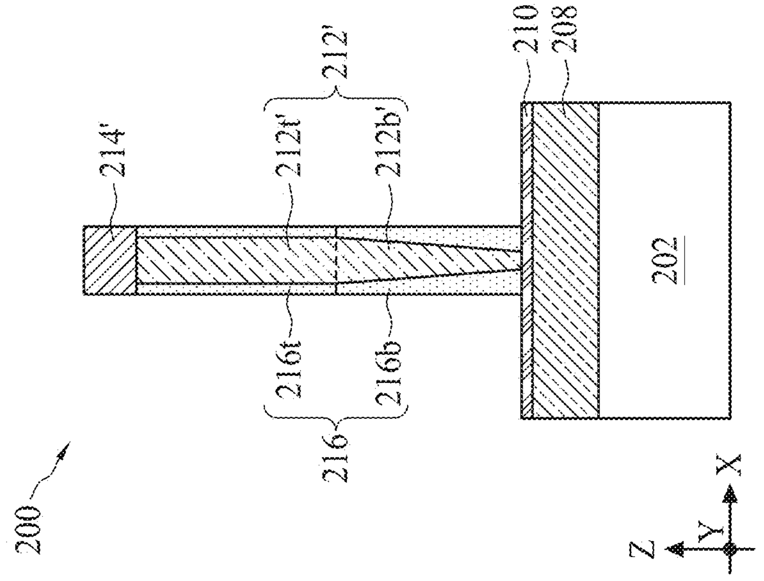
Figure 32B:
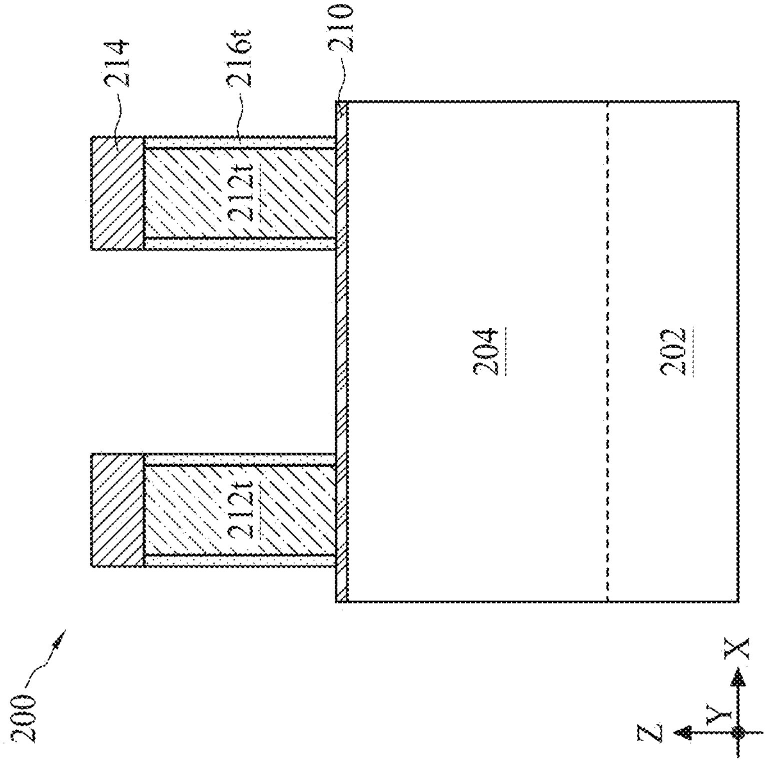

In another embodiment, after performing operations in block 109*b*, referring to FIGS. 25 and 31A, 31B, 31F, method 100" proceeds to path B to perform operations in blocks 109*c* where a third etching process 264 is performed to trim the bottom portion 212*b* of the dummy gate electrode 212' while using the patterned hard mask layers 214' and 214 as an etch mask. FIG. 31A depicts a fragmentary top view of the workpiece 200, FIGS. 31B and 31F depict fragmentary cross-sectional views of the workpiece 200 taken along line B-B and line F-F shown in FIG. 31A, respectively. As depicted in FIG. 31F, after the performing of the third etching process 264, in the connector region 200C3, the bottom portion 212*b* of the dummy gate electrode 212 has a non-uniform length along the X direction that is less than the length $L_{g1}'$ of the top portion 212*t* of the dummy gate electrode 212.

Figure 33A:
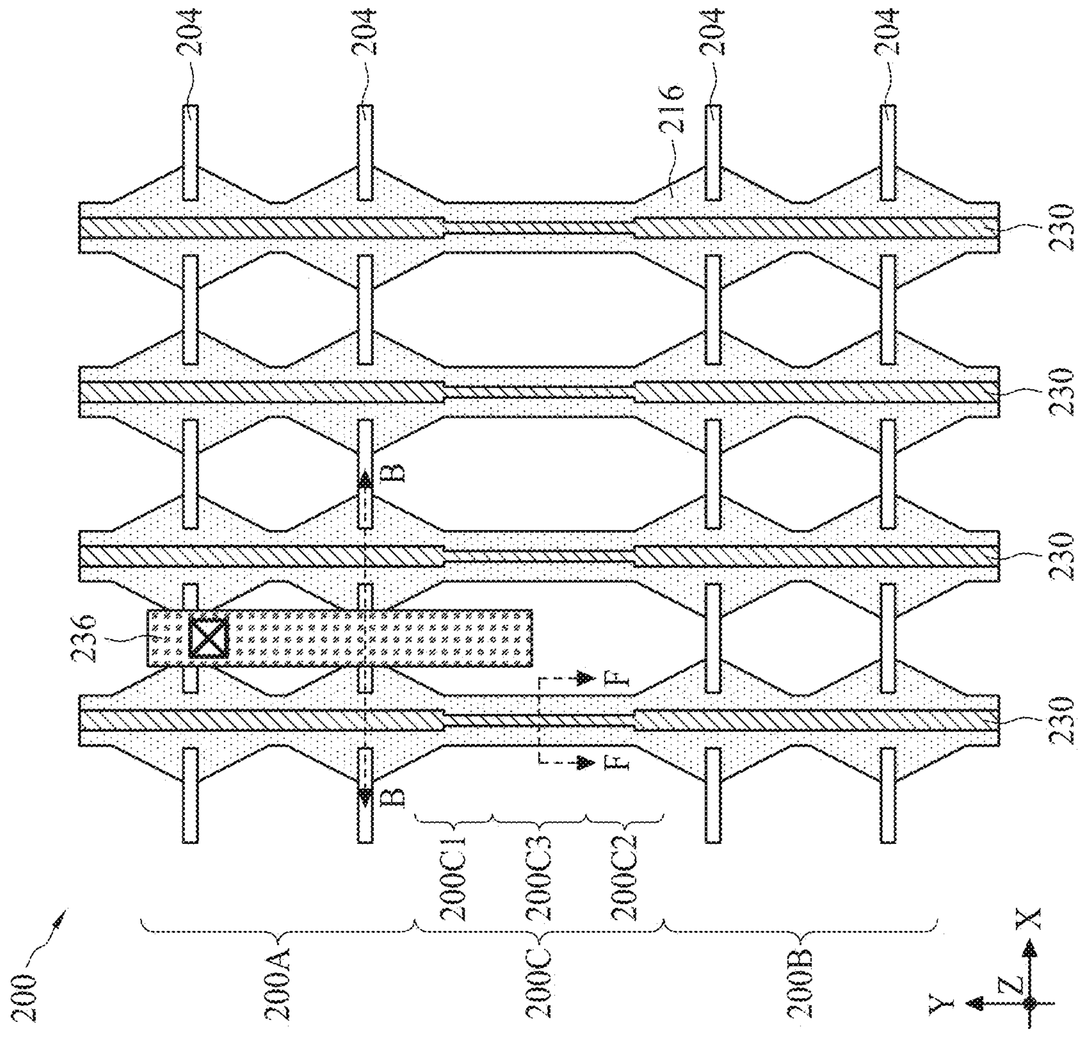
Figure 33F:
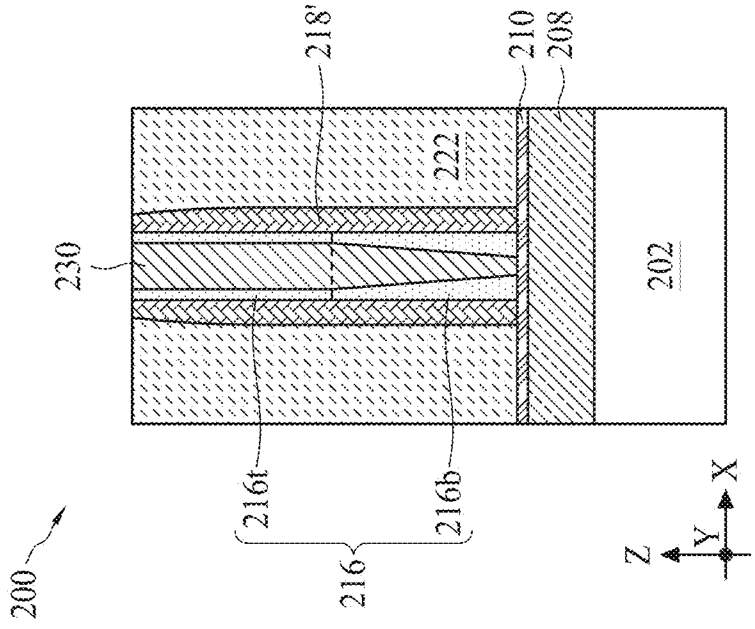
Figure 33B:
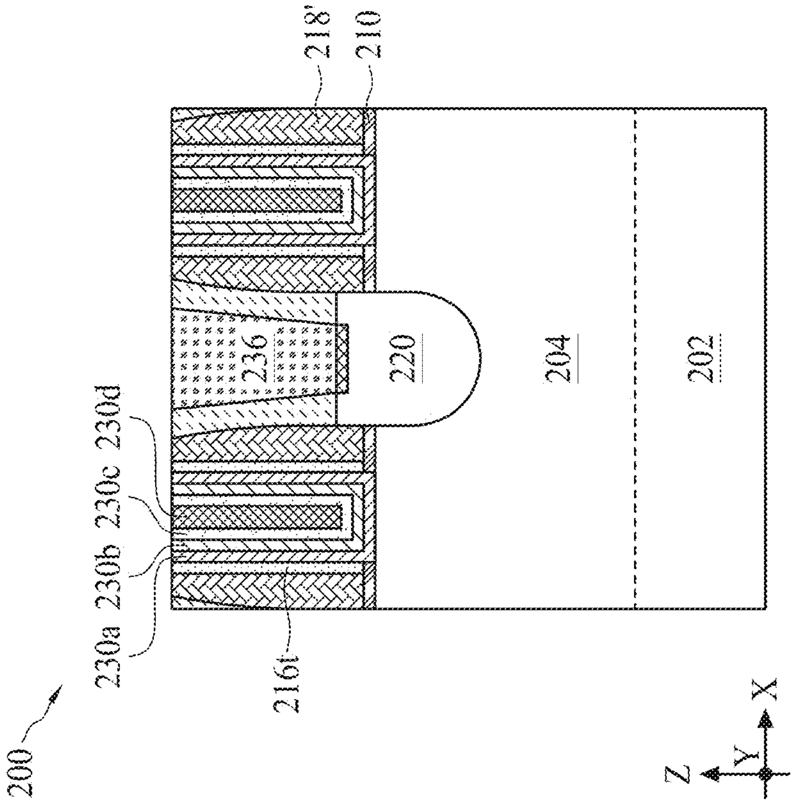
Figure 34A:
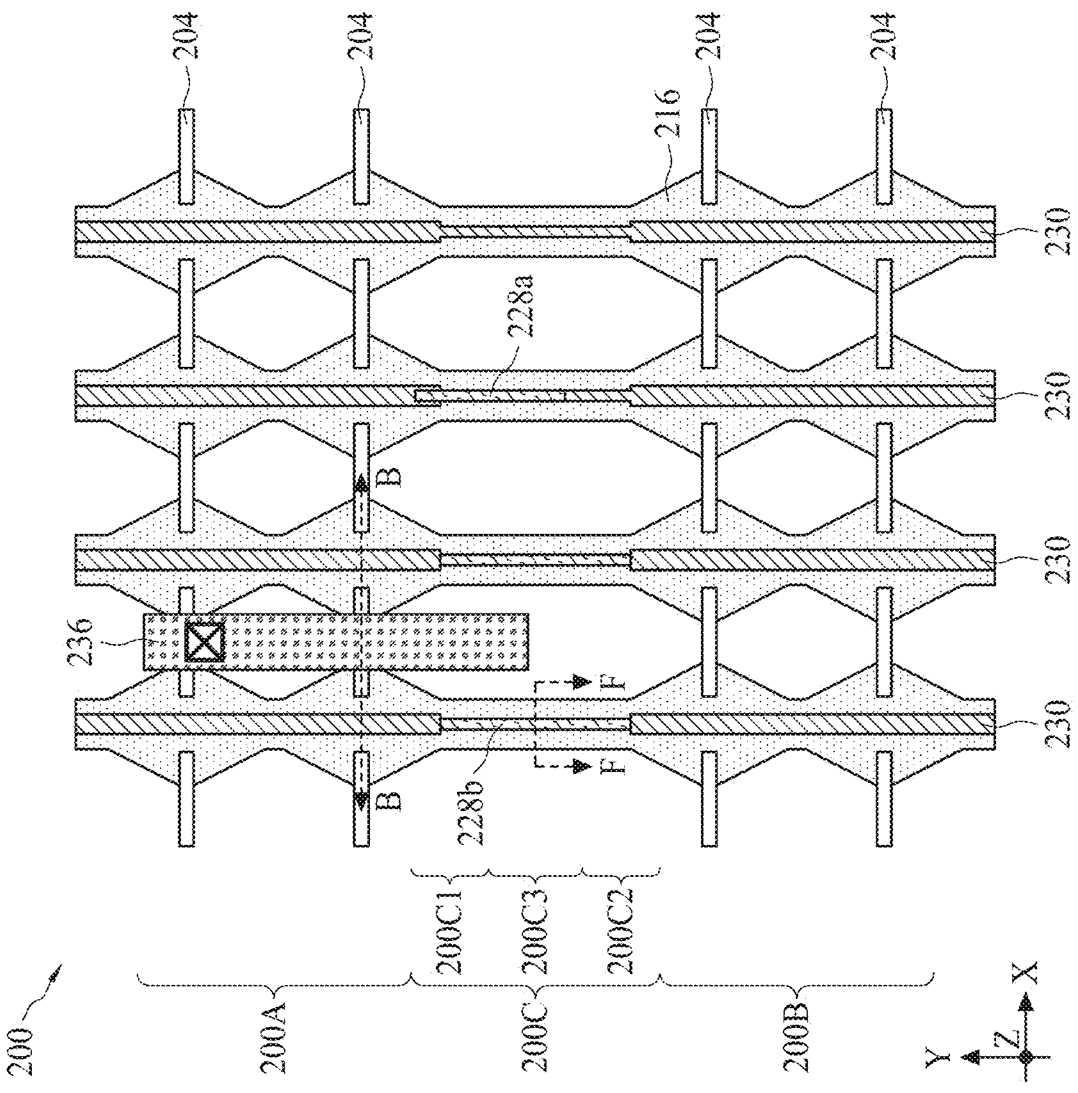
Figure 34F:
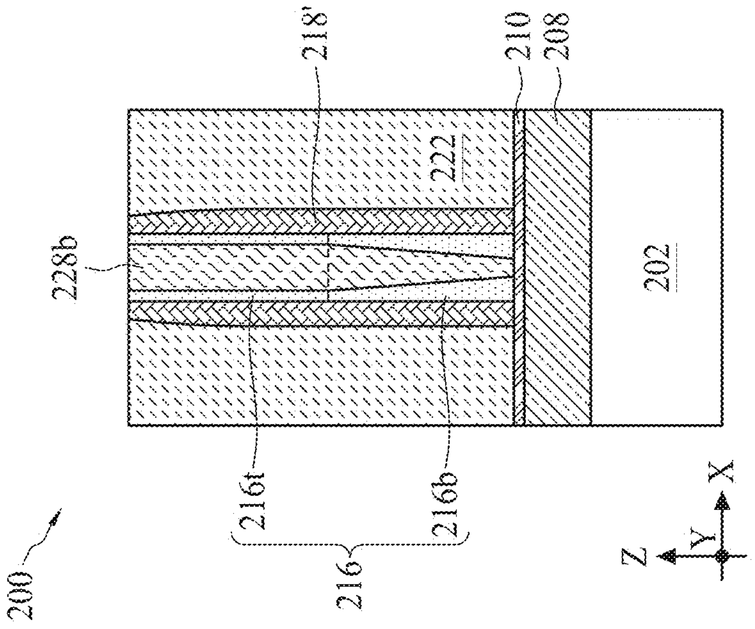
Figure 34B:
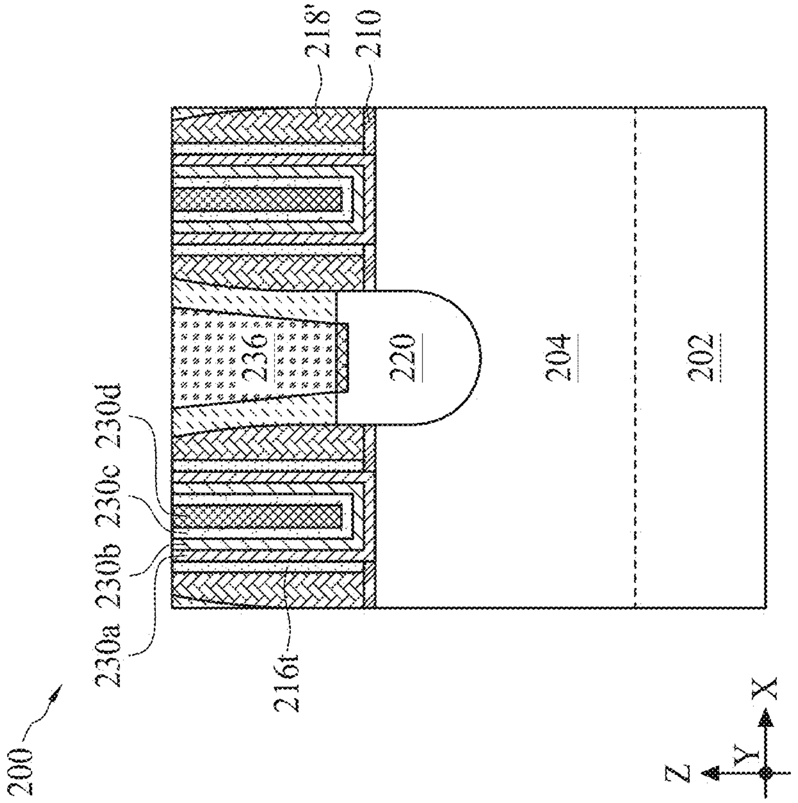

After performing operations in block 109*c*, referring to FIGS. 25 and 32A, 32B, 32F, 33A, 33B, 33F, 34A, 34B and 34F, method 100" includes blocks 110-126 of method 100. For example, the oxidization treatment is performed to form the first gate spacer 216 depicted in FIGS. 32A, 32B and 32F. Gate isolation structures (e.g., gate isolation structures 228*a* and 228*b*) and/or gate structures 230 are formed to replace the dummy gate electrodes 212' in a way similar to the method 100 described above. FIGS. 33A, 33B and 33F represent an embodiment in which the dummy gate electrodes 212' are replaced by the gate structures 230, and FIGS. 34A, 34B and 34F represent an embodiment in which the dummy gate electrodes 212' are replaced by both the gate structures 230 and the gate isolation structures (e.g., gate isolation structures 228*a* and 228*b*). In some embodiments, the gate isolation structures and the gate structures 230 extend along the same direction (e.g., the Y direction depicted in FIGS. 30A and 34A).

Although not intended to be limiting, one or more embodiments of the present disclosure provide many benefits to a semiconductor structure and the formation thereof. For example, forming a dummy gate electrode includes patterning a dummy electrode layer. The present embodiments provide methods to eliminate gate footing of the dummy gate electrode and reduce a length of the dummy gate electrode without intruding additional lithography and etching processes. The elimination of the gate footing of the dummy gate electrode may facilitate the formation of a satisfactory gate isolation structure; and reducing the length of the dummy gate electrode increases a distance between the dummy gate electrode (that will be replaced by a functional gate structure) and source/drain contact and thus contributes to a reduced parasitic capacitance.

The present disclosure provides for many different embodiments. Semiconductor structures and methods of fabrication thereof are disclosed herein. In one exemplary aspect, the present disclosure is directed to a method. The method includes receiving a workpiece comprising a device region having a fin-shaped active region protruding from a substrate and extending along a first direction, forming a gate electrode intersecting the fin-shaped active region, wherein, in a top view, the gate electrode comprises a main part extending along a second direction substantially perpendicular to the first direction and an auxiliary part in the device region and extending laterally from the main part, performing a treatment to convert the auxiliary part and a side portion of the main part of the gate electrode into a first dielectric spacer, and forming a source/drain feature in the device region and adjacent to the first dielectric spacer, selectively removing a remaining portion of the main part of the gate electrode to form a gate trench, and forming a gate structure in the gate trench.

In some embodiments, the performing of the treatment may include oxidizing the auxiliary part and the side portion of the main part of the gate electrode, and the first dielectric spacer may include silicon oxide or silicon oxynitride. In some embodiments, the method may also include, before the forming of the gate electrode, conformally forming a sacrificial dielectric layer over the workpiece. The forming of the gate electrode may also include depositing a dummy conductive material layer over the sacrificial dielectric layer, performing a planarization process to the dummy conductive material layer, forming a patterned mask on the planarized dummy conductive material layer, and selectively etching the planarized dummy conductive material layer without etching the sacrificial dielectric layer. In some embodiments, the method may also include, after forming the gate trench, selectively removing a portion of the sacrificial dielectric layer exposed by the gate trench to extend the gate trench, the gate structure may be formed in the extended gate trench. In some embodiments, the method may also include, after the performing of the treatment, forming a second dielectric spacer extending along sidewall surfaces of the first dielectric spacer and the patterned mask. In some embodiments, the workpiece may also include a connector region adjacent to the device region, wherein the connector region may include an isolation feature on the substrate and in direct contact with a bottom portion of the fin-shaped active region, and wherein, in the top view, the main part of the gate electrode extends into the connector region. The method may also include, after the forming of the source/drain feature, replacing at least a portion of the main part of the gate electrode in the connector region with a dielectric layer. In some embodiments, the method may also include, before the performing of the treatment, reducing a length of the main part of the gate electrode in the connector region along the first direction. In some embodiments, the first dielectric spacer may include a non-uniform thickness. In some embodiments, the method may also include, after forming the gate trench, selectively recessing the first dielectric spacer to laterally enlarge the gate trench.

In another exemplary aspect, the present disclosure is directed to a method. The method includes depositing a dummy gate material layer over a first fin-shaped active region, patterning the dummy gate material layer to form a dummy gate electrode, wherein the dummy gate electrode has a footing feature at an interface between the first fin-shaped active region and the dummy gate electrode, oxidizing the footing feature and a sidewall portion of the dummy gate electrode to form a dielectric gate spacer, and replacing a remaining portion of the dummy gate electrode with a gate structure.

In some embodiments, the method may also include, before the depositing of the dummy gate material layer, forming an isolation feature to isolate the first fin-shaped active region from a second fin-shaped active region. The dummy gate electrode has a first part over and in direct contact with the isolation feature, and the first part may include a distal portion adjacent to the first fin-shaped active region, a proximal portion adjacent to the second fin-shaped active region, and a middle portion extending from the distal portion to the proximal portion, wherein, in a cross-sectional view cut through the middle portion and the isolation feature, a profile of the dummy gate electrode resembles a rectangle. In some embodiments, the footing feature may be directly over the isolation feature, and a top surface of the footing feature may be coplanar with or below a top surface of the first fin-shaped active region. In some embodiments, the patterning of the dummy gate material layer may include forming a patterned mask layer on the dummy gate material layer, and performing a first etching process to etch the dummy gate material layer while using the patterned mask layer as an etch mask. In some embodiments, the method may also include, after the forming of the dummy gate electrode, reducing a size of a portion of the patterned mask layer formed on the first part of the dummy gate electrode, performing a second etching process to reduce a size of the first part of the dummy gate electrode, and selectively removing the patterned mask layer. In some embodiments, the method may also include, after forming the dielectric gate spacer, replacing a portion of the first part of the dummy gate electrode with a gate isolation structure. In some embodiments, the method may also include, forming another gate spacer extending along the dielectric gate spacer, and forming a source/drain feature adjacent to the another gate spacer.

In yet another exemplary aspect, the present disclosure is directed to a semiconductor structure. The semiconductor structure includes source/drain features coupled to a channel region of a fin, a gate structure over a substrate and comprising a first portion disposed directly over the channel region and a second portion immediately adjacent to the first portion, a first gate spacer comprising a first portion extending along a sidewall surface of the first portion of the gate structure and a second portion extending along a sidewall surface of the second portion of the gate structure, wherein, in a cross-sectional view cut through the second portion of the gate structure without cutting through the channel region, the second portion of the first gate spacer may include a non-uniform thickness.

In some embodiments, an upper part of the second portion of the first gate spacer over a top surface of the fin may have a uniform thickness. In some embodiments, a width of a lower part of the second portion of the first gate spacer may gradually increase along a direction from the top surface of the fin towards the substrate. In some embodiments, the semiconductor structure may also include an isolation feature on the substrate and in direct contact with a bottom portion of the fin, and a second gate spacer extending along a sidewall surface of the first gate spacer, and the first gate spacer and the second gate spacer are isolated from the isolation feature by a dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a workpiece comprising a device region having a fin-shaped structure protruding from a substrate and extending along a first direction;

forming a gate electrode intersecting the fin-shaped structure, wherein, in a top view, the gate electrode comprises a main part extending along a second direction substantially perpendicular to the first direction and an auxiliary part in the device region and extending laterally from the main part;

performing a treatment to convert the auxiliary part and a side portion of the main part of the gate electrode into a first dielectric spacer; and forming a source/drain feature in the device region and adjacent to the first dielectric spacer;

selectively removing a remaining portion of the main part of the gate electrode to form a gate trench; and forming a gate structure in the gate trench.

2. The method of claim 1, wherein the performing of the treatment comprises oxidizing the auxiliary part and the side portion of the main part of the gate electrode, and wherein the first dielectric spacer comprises silicon oxide or silicon oxynitride.

3. The method of claim 1, further comprising:

before the forming of the gate electrode, conformally forming a sacrificial dielectric layer over the workpiece, wherein the forming of the gate electrode comprises:

depositing a dummy conductive material layer over the sacrificial dielectric layer;

performing a planarization process to the dummy conductive material layer;

forming a patterned mask on the planarized dummy conductive material layer; and selectively etching the planarized dummy conductive material layer without etching the sacrificial dielectric layer.

4. The method of claim 3, further comprising:

after forming the gate trench, selectively removing a portion of the sacrificial dielectric layer exposed by the gate trench to extend the gate trench, wherein the gate structure is formed in the extended gate trench.

5. The method of claim 3, further comprising:

after the performing of the treatment, forming a second dielectric spacer extending along sidewall surfaces of the first dielectric spacer and the patterned mask.

6. The method of claim 1, wherein the workpiece further comprises a connector region adjacent to the device region, wherein the connector region comprises an isolation feature on the substrate and in direct contact with a bottom portion of the fin-shaped structure, and wherein, in the top view, the main part of the gate electrode extends into the connector region, wherein the method further comprises:

after the forming of the source/drain feature, replacing at least a portion of the main part of the gate electrode in the connector region with a dielectric layer.

7. The method of claim 6, further comprising:

before the performing of the treatment, reducing a length of the main part of the gate electrode in the connector region along the first direction.

8. The method of claim 1, wherein the first dielectric spacer comprises a non-uniform thickness.

9. The method of claim 1, further comprising:

after forming the gate trench, selectively recessing the first dielectric spacer to laterally enlarge the gate trench.

10. A method, comprising:

depositing a dummy gate material layer over a first fin-shaped structure;

patterning the dummy gate material layer to form a dummy gate electrode, wherein the dummy gate electrode has a footing feature at an interface between the first fin-shaped structure and the dummy gate electrode;

oxidizing the footing feature and a sidewall portion of the dummy gate electrode to form a dielectric gate spacer; and replacing a remaining portion of the dummy gate electrode with a gate structure.

11. The method of claim 10, further comprising:

before the depositing of the dummy gate material layer, forming an isolation feature to isolate the first fin-shaped structure from a second fin-shaped structure, wherein the dummy gate electrode has a first part over and in direct contact with the isolation feature, and the first part comprises a distal portion adjacent to the first fin-shaped structure, a proximal portion adjacent to the second fin-shaped structure, and a middle portion extending from the distal portion to the proximal portion, wherein, in a cross-sectional view cut through the middle portion and the isolation feature, a profile of the dummy gate electrode resembles a rectangle.

12. The method of claim 11, wherein the footing feature is directly over the isolation feature, and a top surface of the footing feature is coplanar with or below a top surface of the first fin-shaped structure.

13. The method of claim 11, wherein the patterning of the dummy gate material layer comprises:

forming a patterned mask layer on the dummy gate material layer; and performing a first etching process to etch the dummy gate material layer while using the patterned mask layer as an etch mask.

14. The method of claim 13, further comprising:

after the forming of the dummy gate electrode, reducing a size of a portion of the patterned mask layer formed on the first part of the dummy gate electrode;

performing a second etching process to reduce a size of the first part of the dummy gate electrode; and selectively removing the patterned mask layer.

15. The method of claim 11, further comprising:

after forming the dielectric gate spacer, replacing a portion of the first part of the dummy gate electrode with a gate isolation structure.

16. The method of claim 11, further comprising:

forming another gate spacer extending along the dielectric gate spacer; and forming a source/drain feature adjacent to the another gate spacer.

17. A method, comprising:

forming a fin-shaped structure over a substrate, the fin-shaped structure extending lengthwise along a first direction;

forming an isolation feature alongside the fin-shaped structure;

forming a gate electrode over the fin-shaped structure and extending lengthwise along a second direction different from the first direction, wherein, when viewed from top, the gate electrode has a first part having a first dimension in the first direction and a second part having a second dimension in the first direction, the second dimension is non-uniform and greater than the first dimension;

performing a treatment to the gate electrode, thereby converting a side portion of the first part and a side portion of the second part into a dielectric layer;

after the performing of the treatment, depositing a spacer layer over the dielectric layer; and etching back the dielectric layer and the spacer layer to form gate spacers extending along sidewalls of a remining portion of the gate electrode.

18. The method of claim 17, wherein a distance between the first part of the gate electrode and the fin-shaped structure is greater than a distance between the second part of the gate electrode and the fin-shaped structure.

19. The method of claim 17, further comprising:

before the forming of the gate electrode, forming a gate dielectric layer extending over the fin-shaped structure and the isolation feature;

selectively removing a part of the remining portion of the gate electrode to form a trench;

selectively removing a part of the gate dielectric layer exposed by the trench; and forming a metal gate stack in the trench.

20. The method of claim 17, wherein the gate spacers comprises a first spacer formed from the dielectric layer and a second spacer formed from the spacer layer, wherein in top view, the first spacer has a non-uniform width.

* * * * *